US012787293B2

(12) United States Patent
Matsuno et al.

(10) Patent No.: US 12,787,293 B2
(45) Date of Patent: Nov. 3, 2026

(54) THREE-DIMENSIONAL MEMORY DEVICE WITH SELF-ALIGNED WORD LINE CONTACT VIA STRUCTURES AND METHOD OF MAKING THE SAME

(71) Applicant: SANDISK TECHNOLOGIES LLC, Addison, TX (US)

(72) Inventors: Koichi Matsuno, Fremont, CA (US); Kota Funayama, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 523 days.

(21) Appl. No.: 18/221,711

(22) Filed: Jul. 13, 2023

(65) Prior Publication Data

US 2024/0179916 A1 May 30, 2024

Related U.S. Application Data

(60) Provisional application No. 63/385,089, filed on Nov. 28, 2022.

(51) Int. Cl.
*H10B 43/35* (2023.01)
*H10B 43/10* (2023.01)
(Continued)

(52) U.S. Cl.
CPC ............. *H10B 43/35* (2023.02); *H10B 43/10* (2023.02); *H10B 43/27* (2023.02); *H10W 20/42* (2026.01); *H10W 20/435* (2026.01)

(58) Field of Classification Search
CPC ........ H10B 43/35; H10B 43/10; H10B 43/27; H10B 43/50; H01L 23/5226
See application file for complete search history.

(56) References Cited

U.S. PATENT DOCUMENTS 9,412,753 B2 8/2016 Izumi et al.
9,524,901 B2 12/2016 Izumi et al.
(Continued)

FOREIGN PATENT DOCUMENTS

KR 20200038321 A 4/2020

OTHER PUBLICATIONS

ISR—Notification of Transmittal of The International Search Report and Written Opinion of the International Searching Authority for International Patent Application No. PCT/US2023/035250, mailed Jan. 18, 2024, 12 pages.
(Continued)

*Primary Examiner* — Galina G Yushina
(74) *Attorney, Agent, or Firm* — THE MARBURY LAW GROUP PLLC

(57) ABSTRACT

A three-dimensional memory device includes an alternating stack of insulating layers and electrically conductive layers having stepped surfaces in a contact region, memory openings vertically extending through the alternating stack, memory opening fill structures located in the memory openings, at least one retro-stepped dielectric material portion overlying the alternating stack, finned dielectric pillar structures vertically extending through the alternating stack in the contact region, support pillar structures, and layer contact via structures vertically extending through the at least one retro-stepped dielectric material portion. Each of the layer contact via structures contacts a respective one of the electrically conductive layers and a respective one of the finned dielectric pillar structures.

3 Claims, 69 Drawing Sheets

(51) Int. Cl.

| | |
|---|---|
| ***H10B 43/27*** | (2023.01) |
| ***H10W 20/41*** | (2026.01) |
| ***H10W 20/42*** | (2026.01) |

(56) References Cited

U.S. PATENT DOCUMENTS

| | | | | |
|---|---|---|---|---|
| 9,786,681 | B1 | 10/2017 | Ariyoshi | |
| 9,853,038 | B1 | 12/2017 | Cui | |
| 10,192,784 | B1 | 1/2019 | Cui et al. | |
| 10,304,852 | B1 | 5/2019 | Cui et al. | |
| 10,355,009 | B1 | 7/2019 | Kai et al. | |
| 10,388,666 | B1 | 8/2019 | Kai et al. | |
| 10,490,569 | B2 | 11/2019 | Mushiga et al. | |
| 10,580,783 | B2 | 3/2020 | Cui et al. | |
| 10,608,010 | B2 | 3/2020 | Terasawa et al. | |
| 10,727,248 | B2 * | 7/2020 | Kaminaga | H10B 43/40 |
| 10,892,267 | B2 | 1/2021 | Mushiga et al. | |
| 10,903,230 | B2 | 1/2021 | Kaminaga et al. | |
| 10,971,507 | B2 | 4/2021 | Kaminaga | |
| 11,049,876 | B2 | 6/2021 | Kaminaga et al. | |
| 11,410,924 | B2 | 8/2022 | Suwa et al. | |
| 11,450,679 | B2 | 9/2022 | Tanaka et al. | |
| 11,450,685 | B2 | 9/2022 | Yoshida | |
| 11,495,612 | B2 | 11/2022 | Tanaka et al. | |
| 11,532,570 | B2 | 12/2022 | Mizuno et al. | |
| 2012/0119283 | A1 * | 5/2012 | Lee | H10B 43/27 257/314 |
| 2015/0103581 | A1 * | 4/2015 | Murooka | G11C 13/0069 365/148 |
| 2017/0358590 | A1 * | 12/2017 | Kang | H10B 43/35 |
| 2019/0252403 | A1 | 8/2019 | Kaminaga et al. | |
| 2021/0159239 | A1 * | 5/2021 | Kato | H10B 41/27 |
| 2022/0028879 | A1 | 1/2022 | Mochizuki et al. | |
| 2022/0189872 | A1 * | 6/2022 | Sano | H10B 43/35 |
| 2022/0254728 | A1 | 8/2022 | Matsuno et al. | |
| 2022/0302153 | A1 | 9/2022 | Tanaka et al. | |
| 2022/0328413 | A1 * | 10/2022 | Kubo | H10B 41/27 |
| 2022/0344496 | A1 * | 10/2022 | Su | H10D 30/6757 |
| 2022/0352091 | A1 | 11/2022 | Yu et al. | |
| 2022/0352093 | A1 | 11/2022 | Yamada et al. | |
| 2022/0352196 | A1 | 11/2022 | Shimomura et al. | |
| 2022/0352197 | A1 | 11/2022 | Matsuno et al. | |
| 2022/0375958 | A1 | 11/2022 | Shimabukuro et al. | |
| 2023/0023523 | A1 | 1/2023 | Minamitani et al. | |
| 2023/0157013 | A1 | 5/2023 | Rajashekhar et al. | |
| 2023/0343705 | A1 * | 10/2023 | Shin | H01L 23/5283 |

OTHER PUBLICATIONS

Matsuno, K. et al., "Three-Dimensional Memory Device With Self-Aligned Word Line Contact Via Structures And Method Of Making The Same," U.S. Appl. No. 18/221,689, filed Jul. 13, 2023.

Endoh, T. et al., "Novel Ultra High Density Memory with a Stacked-Surrounding Gate Transistor (S-SGT) Structured Cell," IEDM Proc., (2001), 33-36.

U.S. Appl. No. 17/678,499, filed Feb. 23, 2022, Sandisk Technologies LLC.

U.S. Appl. No. 17/682,515, filed Feb. 28, 2022, Sandisk Technologies LLC.

U.S. Appl. No. 17/682,550, filed Feb. 28, 2022, Sandisk Technologies LLC.

U.S. Appl. No. 18/221,689, filed Jul. 13, 2022, Sandisk Technologies LLC.

IPRP-WO—Notification Concerning Transmittal of International Preliminary Report On Patentability and Written Opinion of the International Searching Authority for International Patent Application No. PCT/US2023/035250, mailed Jun. 5, 2025, 9 pages.

* cited by examiner

THREE-DIMENSIONAL MEMORY DEVICE WITH SELF-ALIGNED WORD LINE CONTACT VIA STRUCTURES AND METHOD OF MAKING THE SAME

FIELD

The present disclosure relates generally to the field of semiconductor devices, and particularly to a three-dimensional memory device containing self-aligned word line contact via structures and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers having stepped surfaces in a contact region: memory openings vertically extending through the alternating stack: memory opening fill structures located in the memory openings, wherein each of the memory opening fill structures comprises a respective vertical stack of memory elements and a respective vertical semiconductor channel; at least one retro-stepped dielectric material portion overlying the alternating stack; finned dielectric pillar structures vertically extending through the alternating stack in the contact region; support pillar structures vertically extending through the at least one retro-stepped dielectric material portion and the alternating stack and located in the contact region, wherein top surfaces of the support pillar structures are located in a horizontal plane including top surface of the memory opening fill structures; and layer contact via structures vertically extending through the at least one retro-stepped dielectric material portion, wherein each of the layer contact via structures contacts a respective one of the electrically conductive layers and a respective one of the finned dielectric pillar structures.

According to another aspect of the present disclosure, a method of forming a three-dimensional memory device is provided, which comprises: forming an alternating stack of insulating layers and sacrificial material layers over a substrate: forming memory openings and contact openings through the alternating stack: forming sacrificial contact opening fill structures in the contact openings: forming memory opening fill structures in the memory openings, wherein each of the memory opening fill structures comprises a respective vertical semiconductor channel and a respective vertical stack of memory elements: replacing the sacrificial material layers with electrically conductive layers: forming contact cavities by removing the sacrificial contact opening fill structures after replacing the sacrificial material layers: laterally expanding the contact cavities by performing an isotropic etch process that laterally recesses proximal portions of the insulating layers around each of the contact cavities selective to the electrically conductive layers: forming finned dielectric pillar structures in lower portions of the laterally-expanded contact cavities: and forming layer contact via structures in upper portions of the laterally-expanded contact cavities.

According to yet another aspect of the present disclosure, a three-dimensional memory device is provided, which comprises: an alternating stack of insulating layers and electrically conductive layers having stepped surfaces in a contact region: memory openings vertically extending through the alternating stack: memory opening fill structures located in the memory openings, wherein each of the memory opening fill structures comprises a respective vertical stack of memory elements and a respective vertical semiconductor channel: a dielectric liner overlying multiple horizontal surface segments and multiple vertical surfaces segments of the stepped surfaces and extending over multiple levels of the electrically conductive layers: a retro-stepped dielectric material portion contacting top surface segments of the dielectric liner: finned dielectric pillar structures vertically extending through the alternating stack in the contact region: and layer contact via structures vertically extending through the retro-stepped dielectric material portion and contacting a respective one of the electrically conductive layers and a respective one of the finned dielectric pillar structures.

According to still another aspect of the present disclosure, a method of forming a three-dimensional memory device, which comprises: forming an alternating stack of insulating layers and sacrificial material layers over a substrate: forming stepped surfaces by patterning the alternating stack: forming a retro-stepped dielectric material portion over the stepped surfaces: forming memory openings through the alternating stack: forming memory opening fill structures in the memory openings, wherein each of the memory opening fill structures comprises a respective vertical semiconductor channel and a respective vertical stack of memory elements: forming contact cavities through the retro-stepped dielectric material portion, the stepped surfaces, and the alternating stack: laterally expanding the contact cavities by performing an isotropic etch process that laterally recesses proximal portions of the insulating layers and the retro-stepped dielectric material portion around each of the contact cavities selective to the sacrificial material layers: forming finned dielectric pillar structures in lower portions of the laterally-expanded contact cavities: forming sacrificial contact via structures in upper portions of the contact cavities on a respective one of the finned dielectric pillar structures: replacing the sacrificial material layers with electrically conductive layers: and replacing the sacrificial contact via structures with layer contact via structures contacting a respective one of the electrically conductive layers.

DETAILED DESCRIPTION

Figure 1:
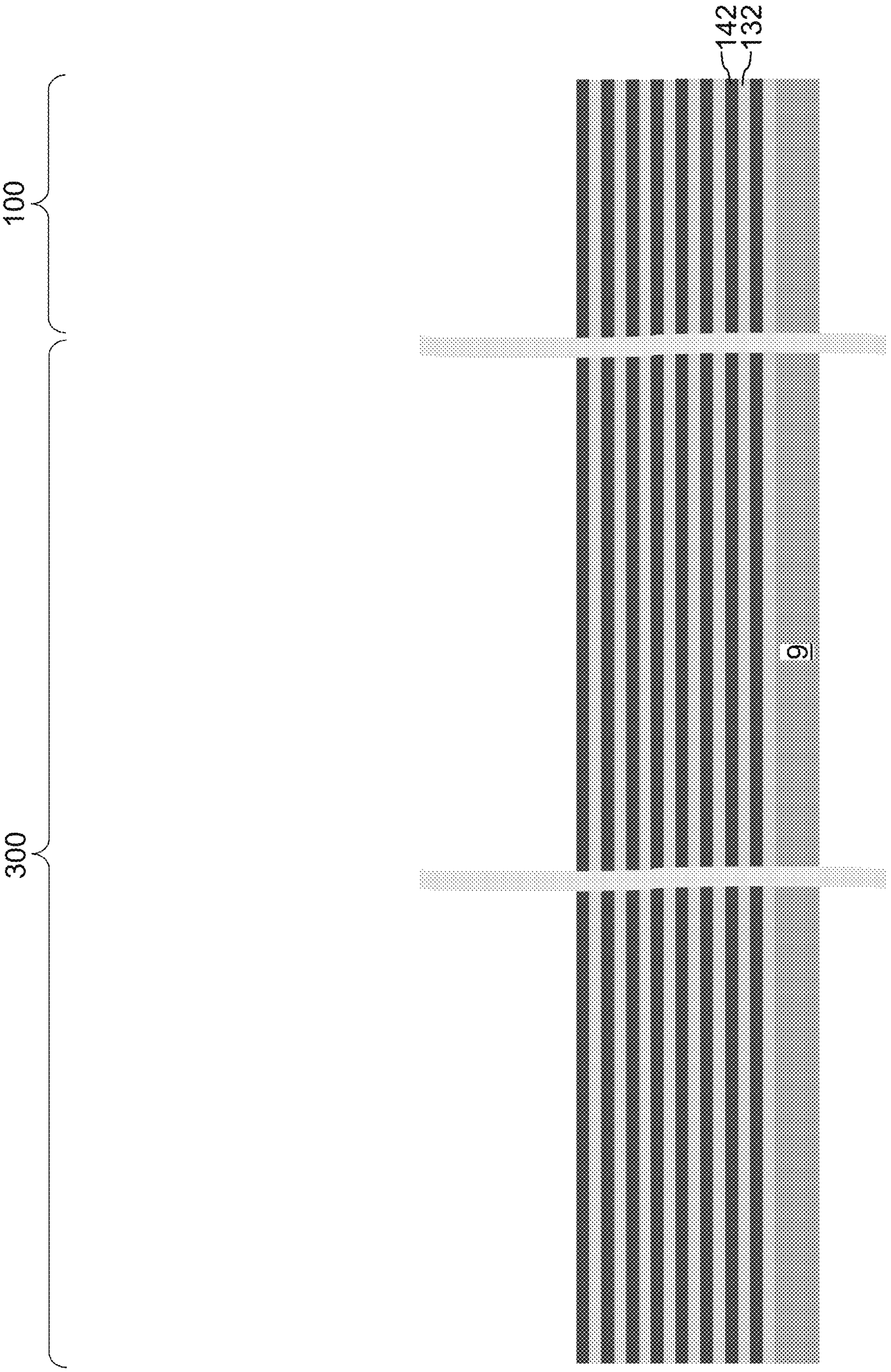
FIG. 1 is a vertical cross-sectional view of a first exemplary structure after formation of a first-tier alternating stack of first insulating layers and first sacrificial material layers according to a first embodiment of the present disclosure.

As discussed above, the present disclosure is directed to a three-dimensional memory device employing self-aligned contact via structures and methods for manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure includes a substrate 9, such as a silicon wafer, which comprises a semiconductor material, such as silicon, at least at a top portion thereof. The semiconductor material forms a continuous semiconductor material layer. In one embodiment, the substrate 9 may include a single crystalline semiconductor material layer such as a single crystalline silicon layer, or may include a polycrystalline semiconductor material layer. The semiconductor material layer in the substrate may have a doping of a first conductivity type, which may be p-type or n-type. A surface portion of the semiconductor material layer may be employed as a horizontal semiconductor channel for three-dimensional memory devices to be subsequently formed.

An alternating stack of first material layers and second material layers is subsequently formed. Each first material layer can include a first material, and each second material layer can include a second material that is different from the first material. In case at least another alternating stack of material layers is subsequently formed over the alternating stack of the first material layers and the second material layers, the alternating stack is herein referred to as a first alternating stack. The level of the first alternating stack is herein referred to as a first-tier level, and the level of the alternating stack to be subsequently formed immediately above the first-tier level is herein referred to as a second-tier level, etc.

The first alternating stack can include first insulating layers 132 as the first material layers, and first spacer material layers as the second material layers. In one embodiment, the first spacer material layers can be sacrificial material layers 142 that are subsequently replaced with electrically conductive layers. As used herein, a "sacrificial material" refers to a material that is removed during a subsequent processing step. In another embodiment, the first spacer material layers can be electrically conductive layers that are not subsequently replaced with other layers. While an embodiment is described below in which sacrificial material layers are replaced with electrically conductive layers, alternative embodiments in which the spacer material layers are formed as electrically conductive layers are expressly contemplated herein.

In one embodiment, the first material layers and the second material layers can be first insulating layers 132 and first sacrificial material layers 142, respectively. In one embodiment, each first insulating layer 132 can include a first insulating material, and each first sacrificial material layer 142 can include a first sacrificial material. An alternating plurality of first insulating layers 132 and first sacrificial material layers 142 is formed over the substrate 9.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first alternating stack (132, 142) can include first insulating layers 132 composed of the first material, and first sacrificial material layers 142 composed of the second material, which is different from the first material. The first material of the first insulating layers 132 can be at least one insulating material. Insulating materials that can be employed for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The second material of the first sacrificial material layers 142 is a sacrificial material that can be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 can be subsequently replaced with electrically conductive electrodes which can function, for example, as control gate electrodes of a vertical NAND device. In one embodiment, the first sacrificial material layers 142 can comprise silicon nitride.

Thus, in one embodiment, the first insulating layers 132 can include silicon oxide, and sacrificial material layers can include silicon nitride sacrificial material layers. The first material of the first insulating layers 132 can be deposited, for example, by chemical vapor deposition (CVD). For example, if silicon oxide is employed for the first insulating layers 132, tetraethylorthosilicate (TEOS) can be employed as the precursor material for the CVD process. The second material of the first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

The first exemplary structure may comprise a memory array region 100 in which a three-dimensional array of memory elements is to be subsequently formed, and a contact region 300 in which contact via structures contacting stepped surfaces of electrically conductive layers are to be subsequently formed. In one embodiment, a peripheral device region containing the at least one semiconductor device for a peripheral circuitry may be located on the substrate 9 under the alternating stack (132, 142) in the memory array region 100 in a CMOS under array configuration. In another alternative embodiment, the peripheral device region may be located on a separate substrate which is subsequently bonded to the memory array region 100.

Figure 2:
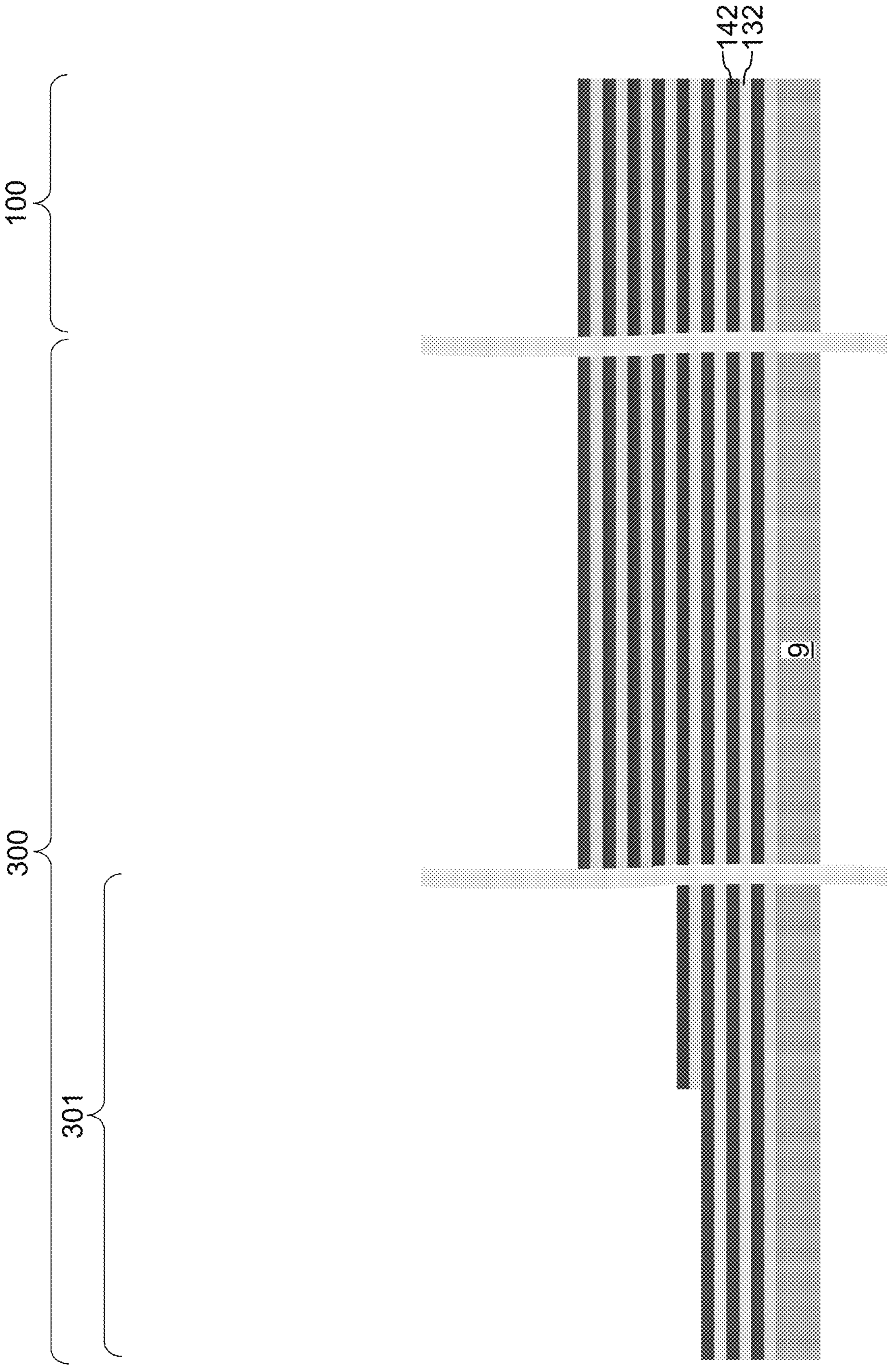
FIG. 2 is a vertical cross-sectional view of the first exemplary structure after forming first stepped surfaces by patterning the first-tier alternating stack according to the first embodiment of the present disclosure.

Referring to FIG. 2, the first alternating stack (132, 142) can be patterned to form first stepped surfaces 301 in the contact region 300. The contact region 300 can include a first area in which the first stepped surfaces 301 are formed, and a second area in which additional stepped surfaces are to be subsequently formed in a second-tier structure (to be subsequently formed over a first-tier structure) and/or additional tier structures. The first stepped surfaces 301 can be formed, for example, by forming a mask layer with an opening therein, etching a cavity within the pair of a topmost first sacrificial material layer 142 and a topmost first insulating layer 132, and iteratively expanding the opening in the mask layer and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 can be physically exposed at the first stepped surfaces 301. The cavity overlying the first stepped surfaces 301 is herein referred to as a first stepped cavity.

Figure 3:
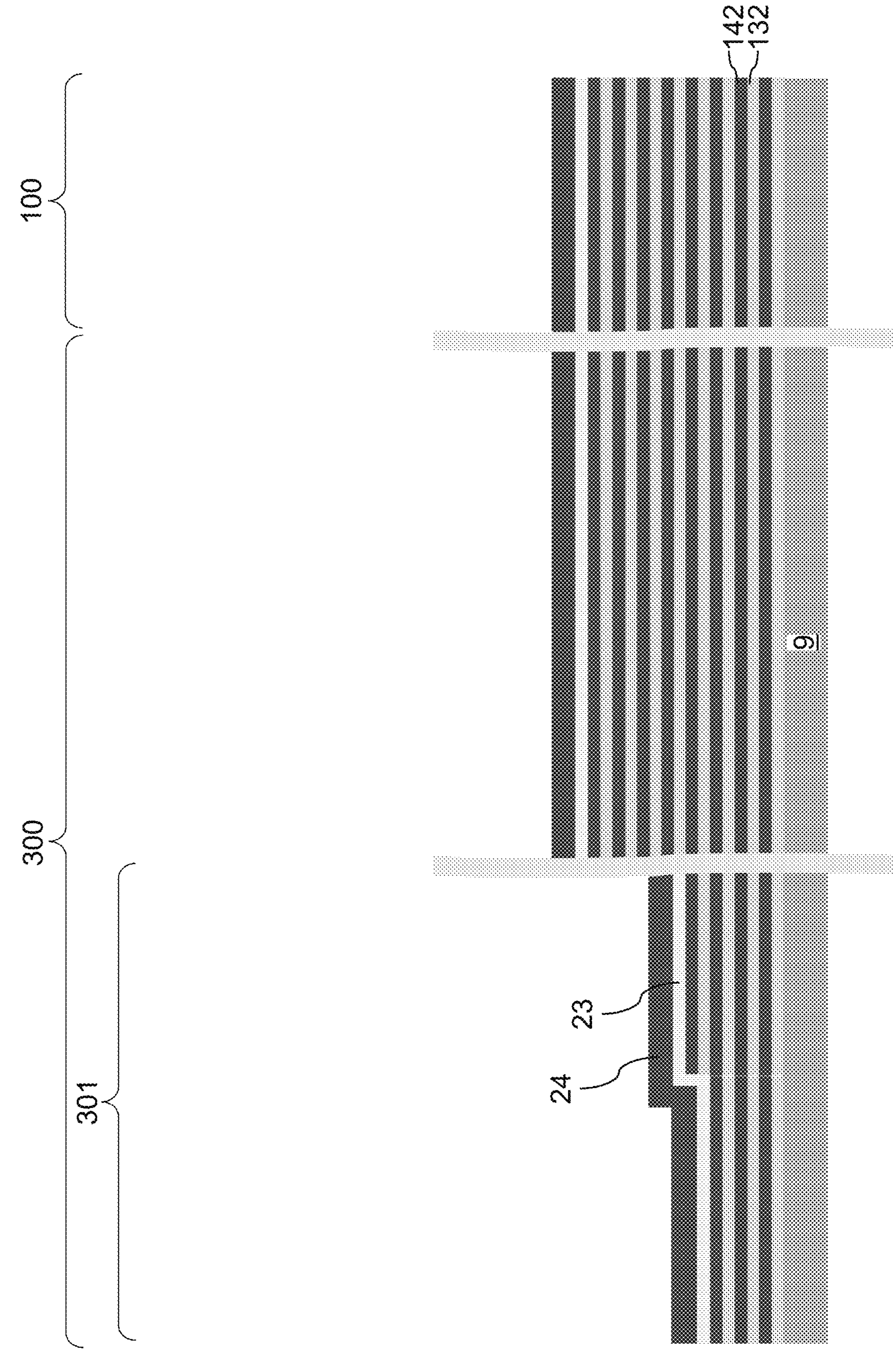
FIG. 3 is a vertical cross-sectional view of the first exemplary structure after formation of first-tier dielectric liners according to the first embodiment of the present disclosure.

Referring to FIG. 3, at least one first-tier dielectric liner (23, 24) can be deposited over the first stepped surfaces 301 of the patterned alternating stack (132, 142). In one embodiment, the at least one first-tier dielectric liner (23, 24) may comprise a first dielectric liner 23 and a second dielectric liner 24. In one embodiment, the first dielectric liner 23 may comprise a silicon oxide liner, and the second dielectric liner 24 may comprise a silicon nitride liner, a silicon carbonitride liner, a semiconductor material liner (such as an amorphous silicon liner), or a doped silicate glass liner (such as a phosphosilicate glass liner or a borosilicate glass liner). In one embodiment, the first dielectric liner 23 may have a thickness in a range from 10 nm to 50 nm, and the second dielectric liner 24 may have a thickness in a range from 30 nm to 100 nm, although lesser and greater thicknesses may also be employed for the first dielectric liner 23 and the second dielectric liner 24. Preferably, the second dielectric liner 24 thickness is at least 50% greater than the thickness of each of the first insulating layers 132 and the first sacrificial material layers 142. The at least one first-tier dielectric liner (23, 24) can be patterned such that the at least one first-tier dielectric liner (23, 24) is removed from outside the areas of the stepped surfaces. In other words, the at least one first-tier dielectric liner (23, 24) is removed in each area in which each layer of the patterned alternating stack (132, 142) is present. Further, the at least one first-tier dielectric liner (23, 24) can be patterned such that the at least one first-tier dielectric liner (23, 24) is removed from all areas in which backside trenches are to be subsequently formed.

Figure 4:
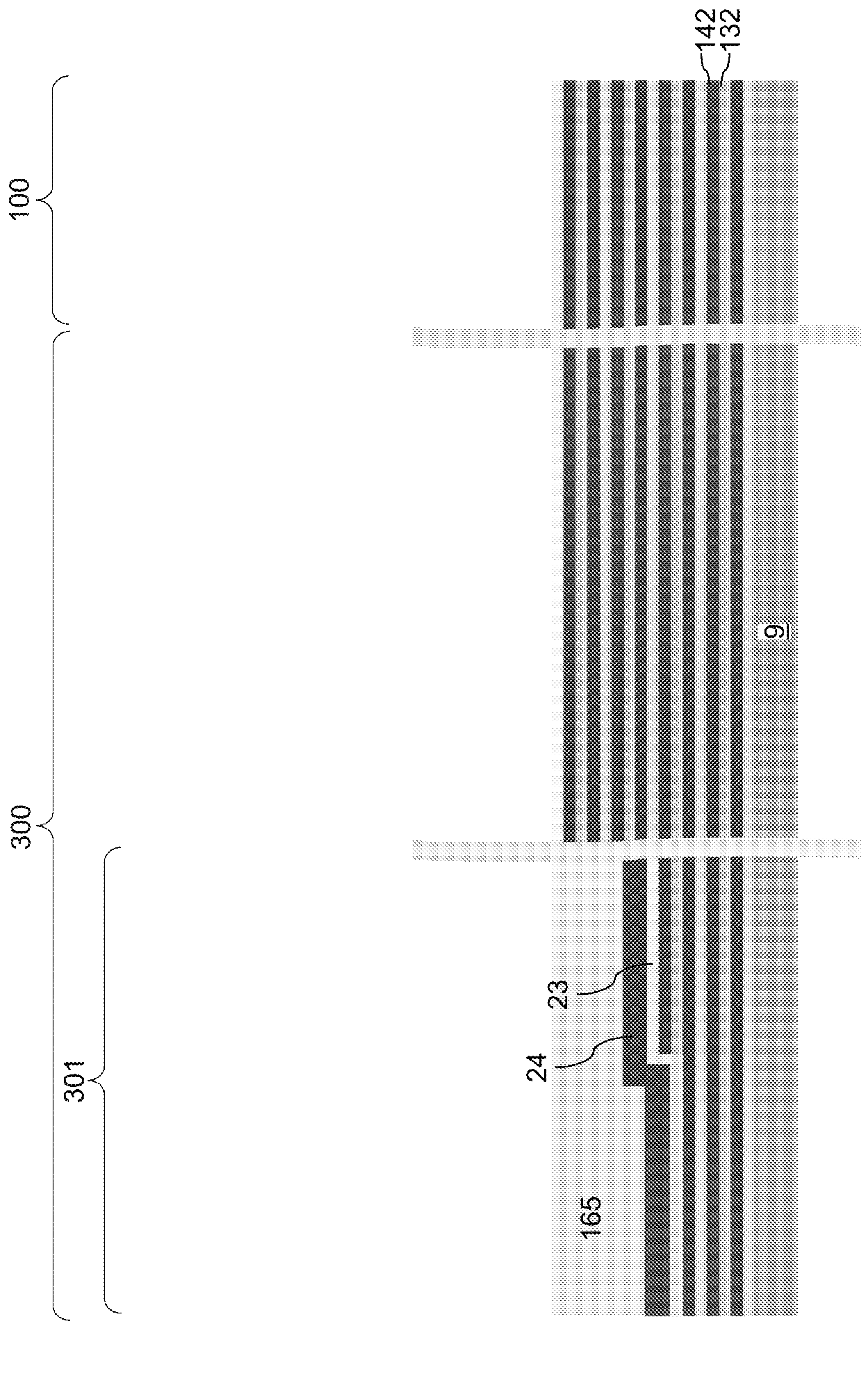
FIG. 4 is a vertical cross-sectional view of the first exemplary structure after patterning of the first-tier dielectric liners and formation of a first retro-stepped dielectric material portion according to the first embodiment of the present disclosure.

Referring to FIG. 4, a dielectric fill material (such as undoped silicate glass (i.e., silicon oxide) or doped silicate glass) can be deposited to fill the first stepped cavity. Excess portions of the dielectric fill material can be removed from above the horizontal plane including the top surface of the topmost layer of the at least one first-tier dielectric liner (23, 24), for example, by performing a chemical mechanical polishing (CMP) process. A remaining portion of the dielectric fill material that fills the region overlying the first stepped surfaces 301 constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. A top surface of the first retro-stepped dielectric material portion 165 can be vertically recessed to a height at, or about, the topmost surface of the first dielectric liner 23. A portion of the second dielectric liner 24 that is not masked by the first retro-stepped dielectric material portion 165 can be removed by performing a timed isotropic etch process, such as a wet etch process employing hot phosphoric acid and/or a mixture of hydrofluoric acid and ethylene glycol. The physically exposed top surface of the first dielectric liner 23 and the top surface of the first retro-stepped dielectric material portion 165 may be formed within a same horizontal plane. Generally, the first retro-stepped dielectric material portion 165 is formed above the at least one first-tier dielectric liner (23, 24).

Figure 5:
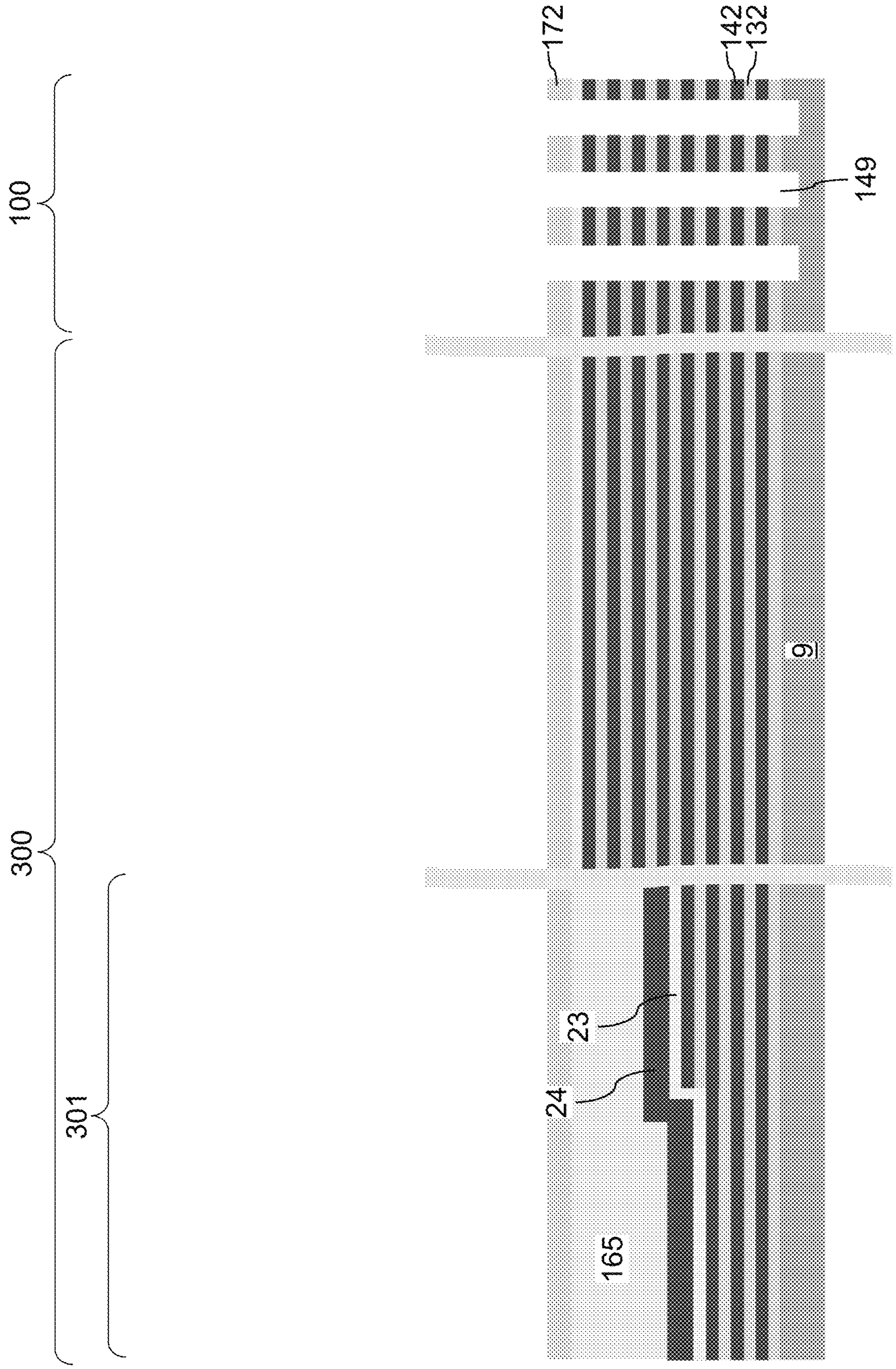
FIG. 5 is a vertical cross-sectional view of the first exemplary structure after formation of a first insulating cap layer and first-tier memory openings according to the first embodiment of the present disclosure.

Referring to FIG. 5, an optional first insulating cap layer 172 can be formed over the first alternating stack (132, 142) and the first retro-stepped dielectric material portion 165. The optional first insulating cap layer 172, if employed, comprises an insulating material such as silicon oxide, and may have a thickness in a range from 30 nm to 300 nm, although lesser and greater thicknesses may also be employed. The combination of the first alternating stack (132, 142), the first retro-stepped dielectric material portion 165, the optional first insulating cap layer 172 collectively constitute a first-tier structure, which is an in-process structure that is subsequently modified.

A first photoresist layer (not shown) can be applied over the first-tier structure, and can be lithographically patterned to form a periodic two-dimensional array of openings in the memory array region 100. A first anisotropic etch process can be performed to transfer the pattern of the openings in the first photoresist layer through the first-tier structure and into an upper portion of the substrate 9. A two-dimensional array of first-tier memory openings 149 can be formed through the first alternating stack (132, 142) in the memory array region 100. The first photoresist layer can be subsequently removed, for example, by ashing.

Figure 6:
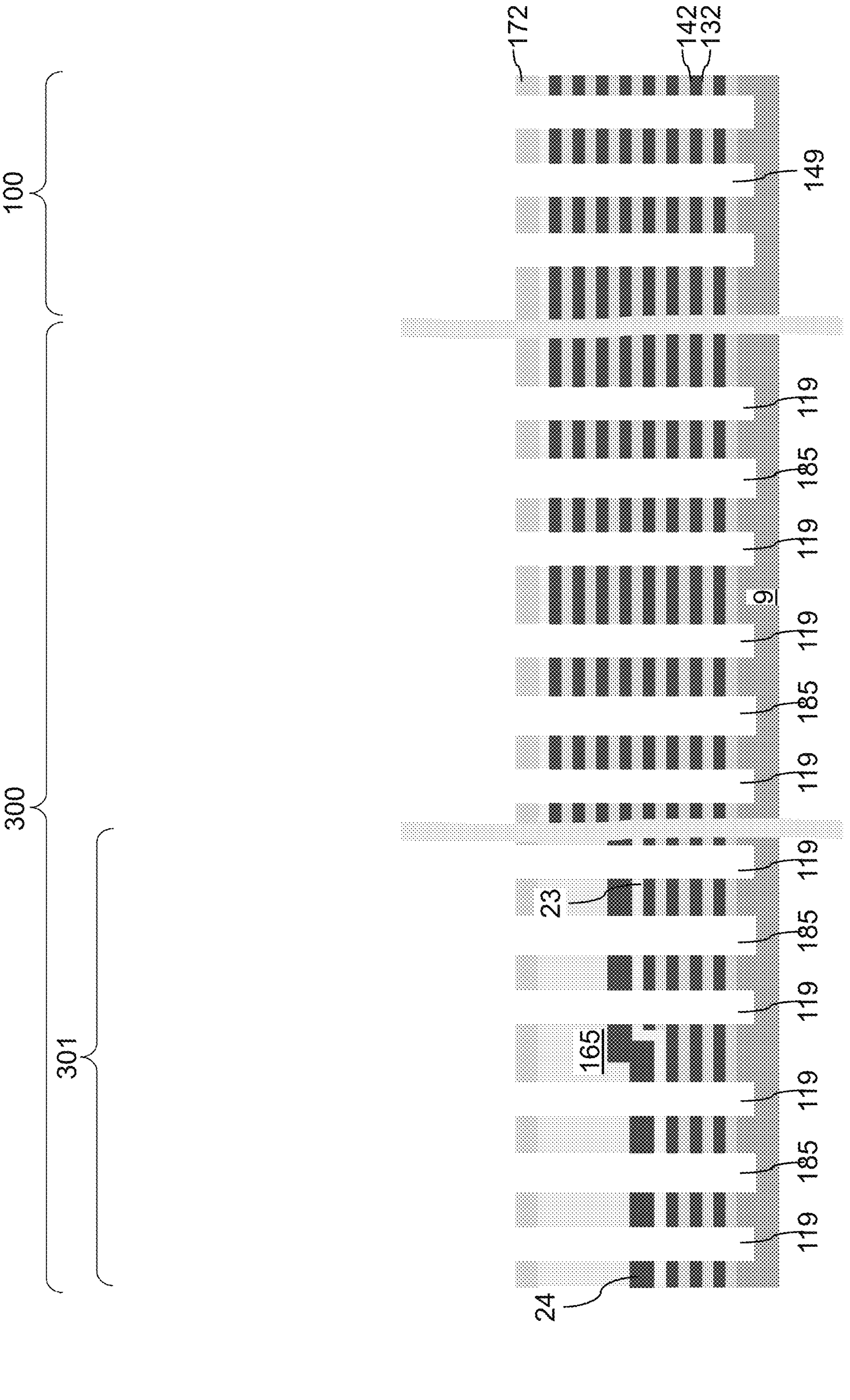
FIG. 6 is a vertical cross-sectional view of the first exemplary structure after formation of first-tier support openings and first-tier contact openings according to the first embodiment of the present disclosure.

Referring to FIG. 6, a second photoresist layer (not shown) can be applied over the first-tier structure, and can be lithographically patterned to form openings in the contact region 300. A second anisotropic etch process can be performed to transfer the pattern of the openings in the second photoresist layer through the first-tier structure and into an upper portion of the substrate 9. Openings are formed through the first-tier structure in the contact region 300. The openings comprise first-tier support openings 119 in which portions of support pillar structures are subsequently formed, and first-tier contact openings 185 which are subsequently employed to form contact via structures.

A first subset of the first-tier support openings 119 and the first-tier contact openings 185 is formed through the first stepped surfaces 301 and the first retro-stepped dielectric material portion 165, and a second subset of the first-tier support openings 119 and the first-tier contact openings 185 is formed outside the area of the first retro-stepped dielectric material portion 165 and through each layer within the first alternating stack (132, 142). Thus, the openings 119 and 185 are formed during the same photolithography and etching steps. The second photoresist layer can be subsequently removed, for example, by ashing.

While embodiment is described in which the first-tier memory openings 149 are formed prior to formation of the first-tier support openings 119 and the first-tier contact openings 185, alternative embodiments are expressly contemplated herein in which the first-tier memory openings 149 are formed after or concurrently with (by employing a common photoresist layer) formation of the first-tier support openings 119 and the first-tier contact openings 185.

Figure 7:
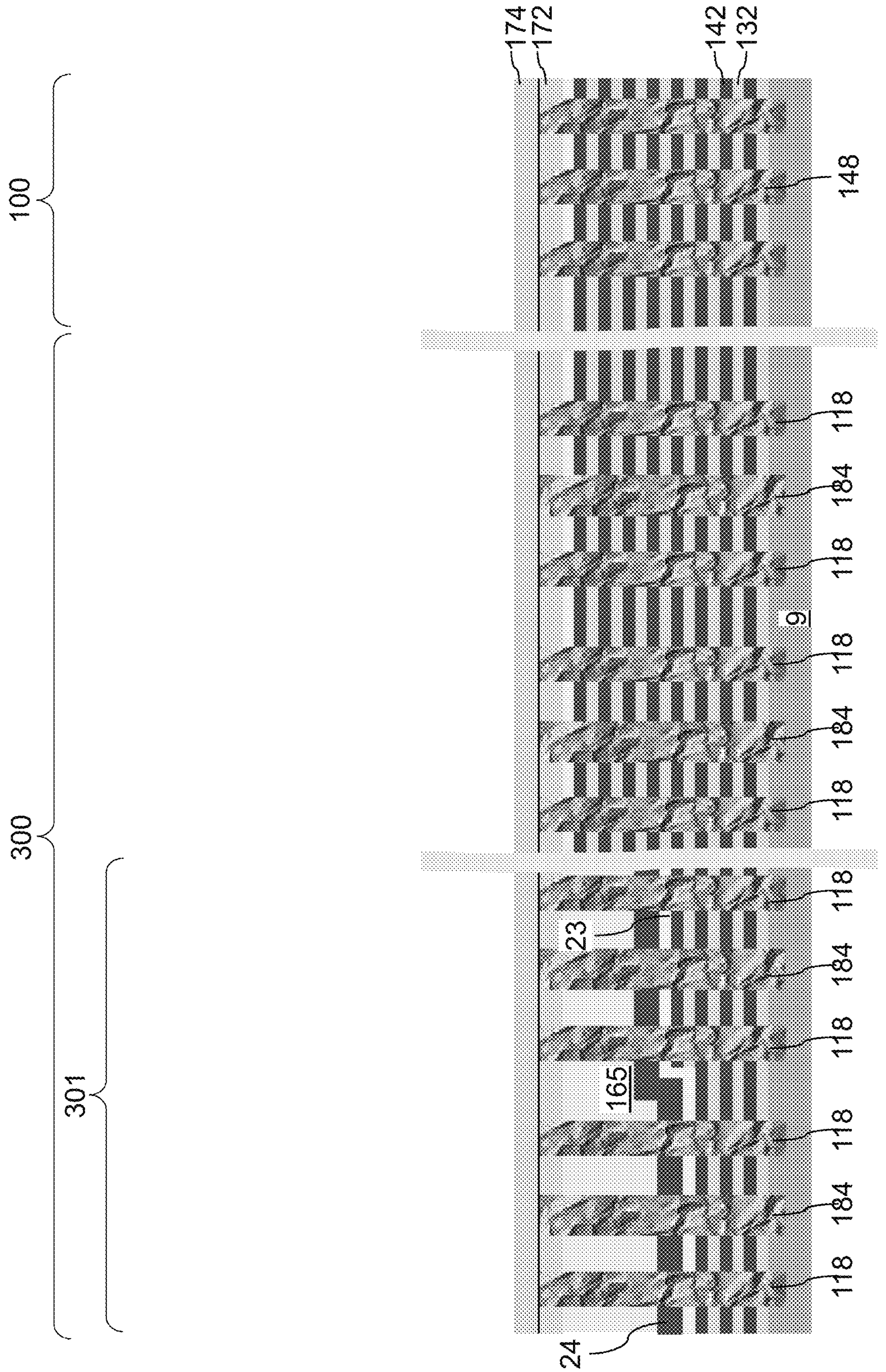
FIG. 7 is a vertical cross-sectional view of the first exemplary structure after formation of various first-tier opening fill structures and an inter-tier dielectric layer according to the first embodiment of the present disclosure.

Referring to FIG. 7, a sacrificial fill material can be deposited in the first-tier memory openings 149, the first-tier support openings 119, and the first-tier contact openings 185, and excess portions of the sacrificial fill material can be removed from above the horizontal plane including the top surface of the first insulating cap layer 172. The sacrificial fill material may comprise carbon, such as amorphous carbon or diamond-like carbon, or a semiconductor material, such as amorphous silicon or a silicon-germanium alloy, or organosilicate glass. Optionally, a sacrificial liner (such as a silicon oxide liner or a dielectric metal oxide liner, not shown) may be formed in each of the first-tier openings (149, 119, 185) prior to deposition of the sacrificial fill material therein. Each remaining portion of the sacrificial fill material that fills a first-tier memory opening 149 constitutes a first-tier memory opening fill structure 148. Each remaining portion of the sacrificial fill material that fills a first-tier support opening 119 constitutes a first-tier support opening fill structure 118. Each remaining portion of the sacrificial fill material that fills a first-tier contact opening 185 constitutes a first-tier contact opening fill structure 184. Generally, various first-tier opening fill structures (148, 118, 184) can be formed in the various first-tier openings (149, 119, 185).

An inter-tier dielectric layer 174 can be optionally formed over the first-tier structure. If present, the inter-tier dielectric layer 174 comprises a dielectric material such as silicon oxide. The thickness of the inter-tier dielectric layer 174 may be in a range from 20 nm to 200 nm, although lesser and greater thicknesses may also be employed.

Figure 8:
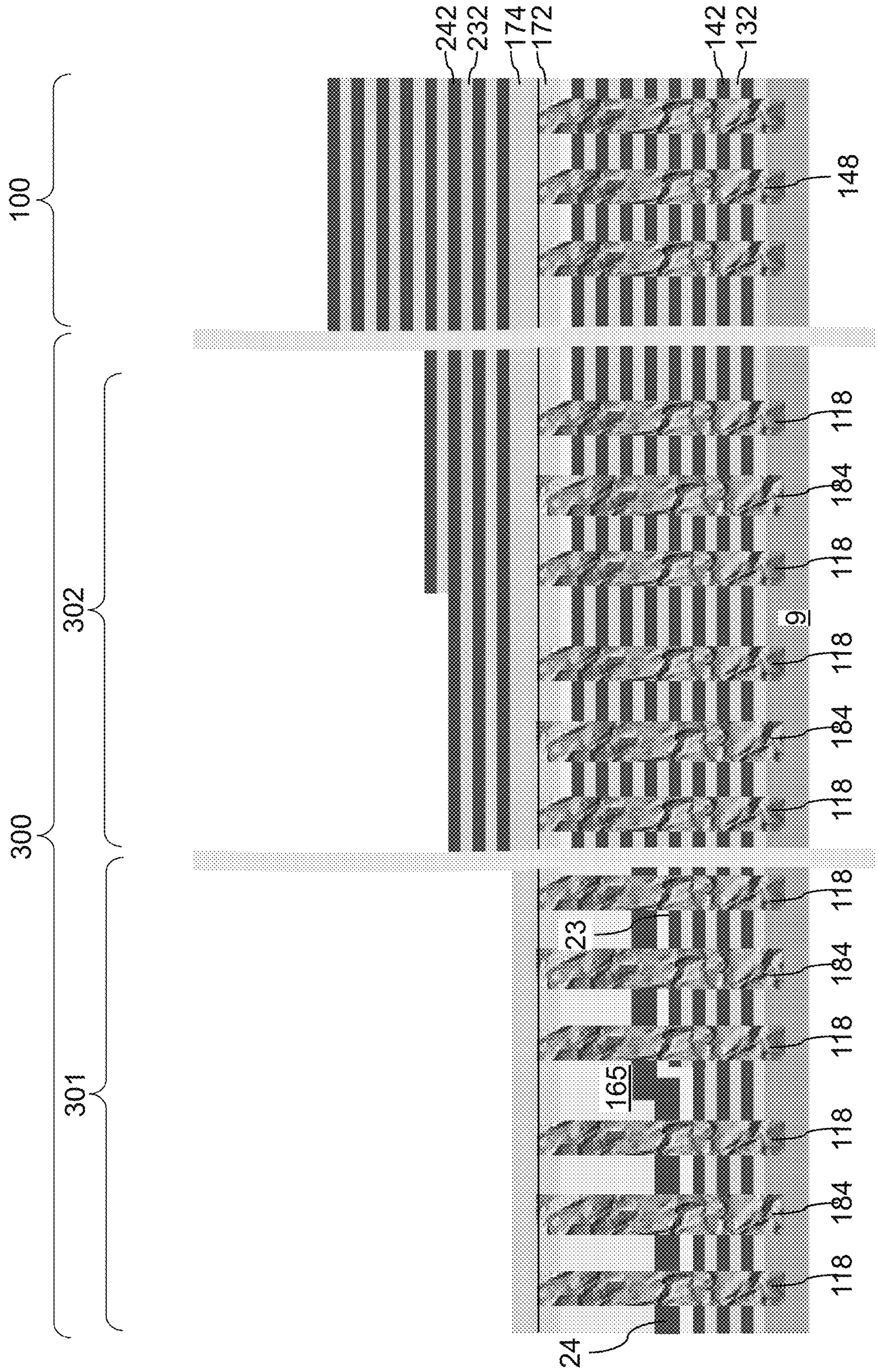
FIG. 8 is a vertical cross-sectional view of the first exemplary structure after formation and patterning of a second-tier alternating stack of second insulating layers and second sacrificial material layers according to the first embodiment of the present disclosure.

Referring to FIG. 8, a second alternating stack (232, 242) of material layers can be subsequently formed on the top surface of the first alternating stack (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layer 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second stack (232, 242) can have a uniform thickness that is substantially invariant within each respective second sacrificial material layer 242.

Second stepped surfaces 302 can be formed in an area of the contact region 300 that is laterally offset from the area of the first stepped surfaces 301 toward the memory array region 100 by performing a same set of processing steps as the processing steps employed to form the first stepped surfaces 301 with suitable adjustment to the pattern of at least one masking layer. A second stepped cavity can be formed in the area of the contact region 300.

Figure 9:
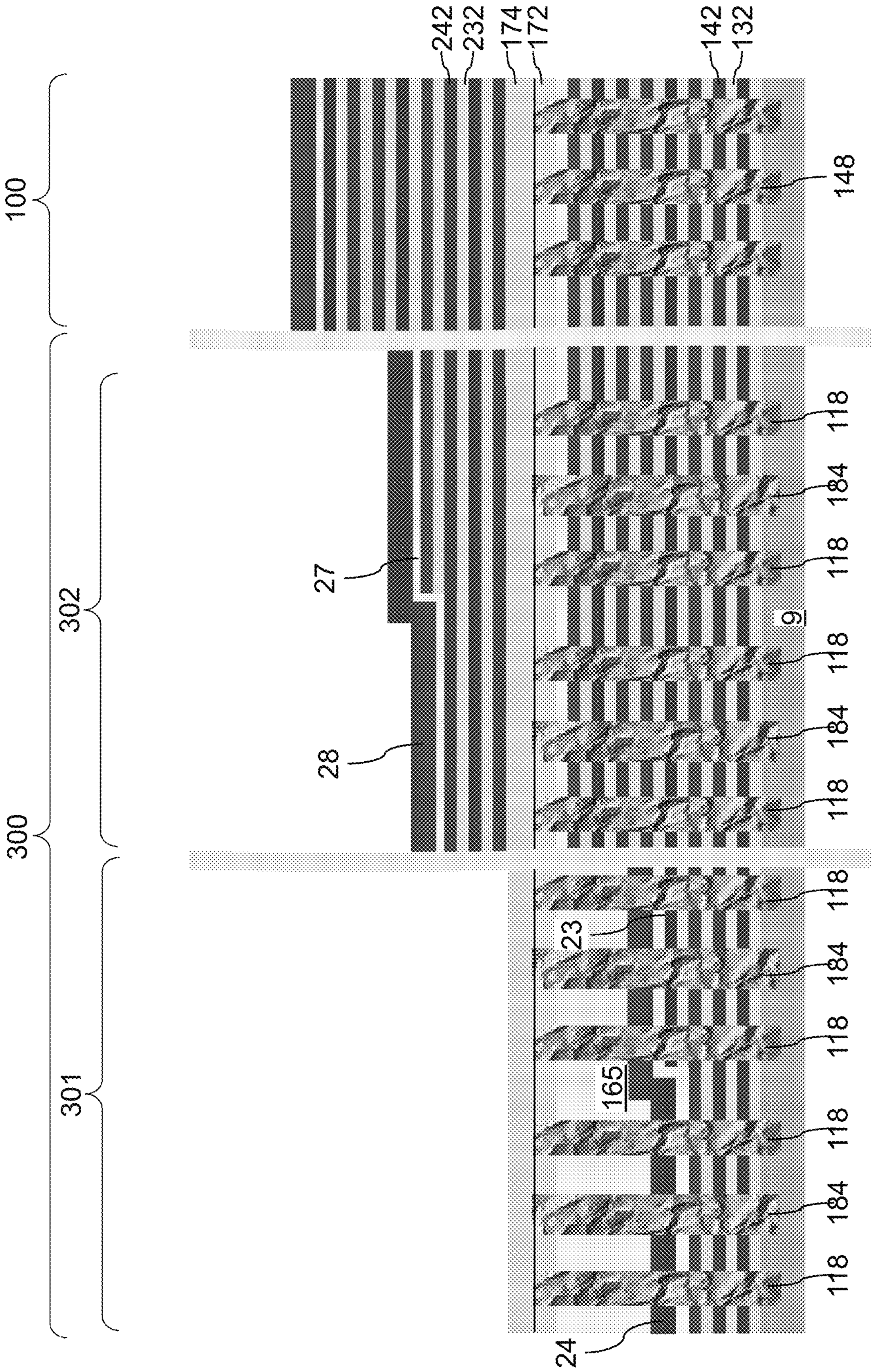
FIG. 9 is a vertical cross-sectional view of the first exemplary structure after deposition and patterning of second-tier dielectric liners according to the first embodiment of the present disclosure.

Referring to FIG. 9, at least one second-tier dielectric liner (27, 28) can be deposited over the patterned second alternating stack (232, 242). In one embodiment, the at least one second-tier dielectric liner (27, 28) may comprise a third dielectric liner 27 and a fourth dielectric liner 28. In one embodiment, the third dielectric liner 27 may comprise a silicon oxide liner, and the fourth dielectric liner 28 may comprise a silicon nitride liner, a silicon carbonitride liner, a semiconductor material liner (such as an amorphous silicon liner), or a doped silicate glass liner (such as a phosphosilicate glass liner or a borosilicate glass liner). In one embodiment, the third dielectric liner 27 may have a thickness in a range from 10 nm to 50 nm, and the fourth dielectric liner 28 may have a thickness in a range from 30 nm to 100 nm, although lesser and greater thicknesses may also be employed for the first dielectric liner 27 and the second dielectric liner 28. Preferably, the fourth dielectric liner 28 thickness is at least 50% greater than the thickness of each of the second insulating layers 232 and the second sacrificial material layers 242. The at least one second-tier dielectric liner (27, 28) can be patterned such that the at least one second-tier dielectric liner (27, 28) is removed from above the area of the first stepped surfaces 301, i.e., from above the area of the first retro-stepped dielectric material portion 165. Further, the at least one second-tier dielectric liner (27, 28) can be patterned such that the at least one second-tier dielectric liner (27, 28) is removed from all areas in which backside trenches are to be subsequently formed.

Figure 10:
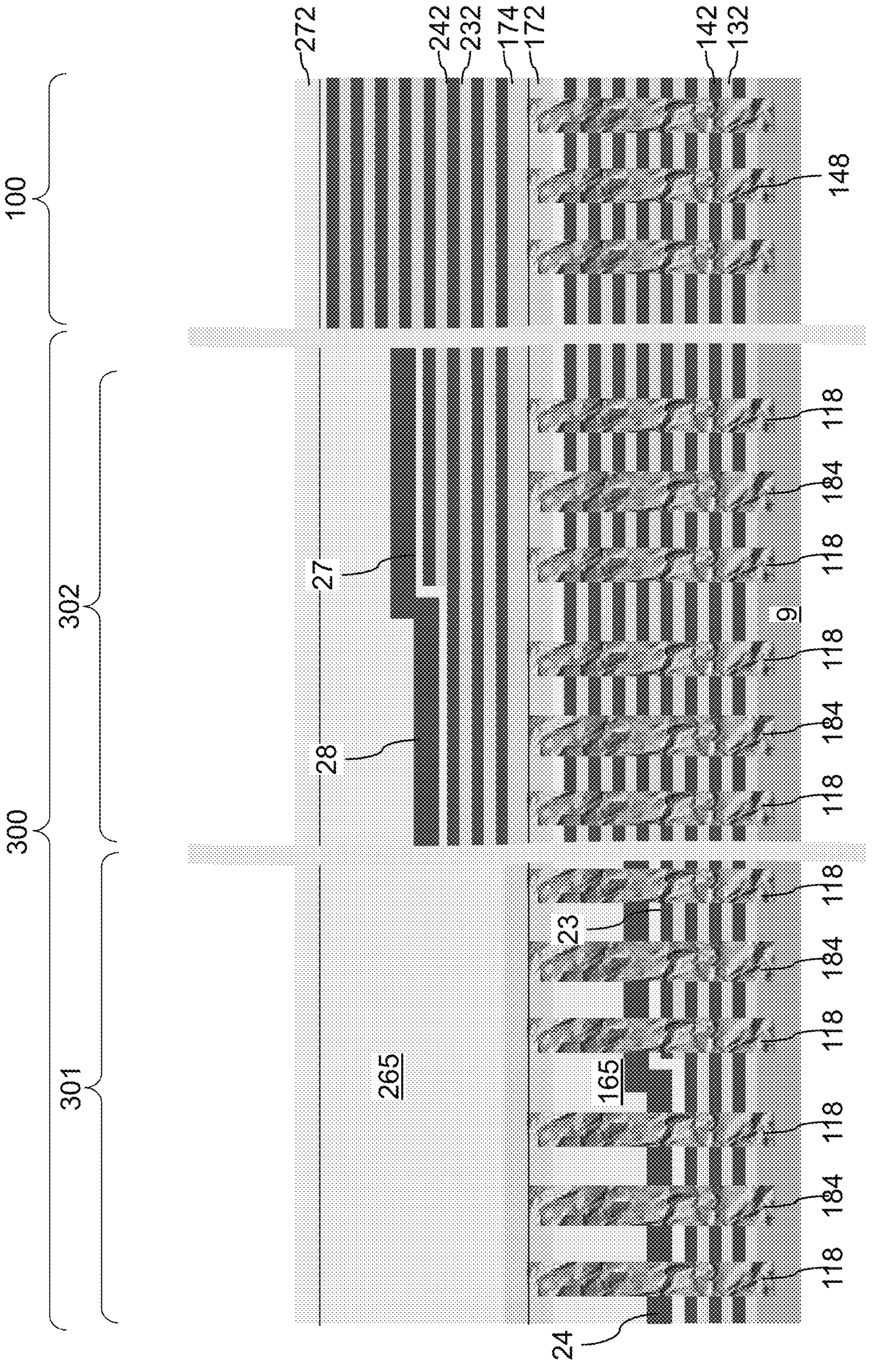
FIG. 10 is a vertical cross-sectional view of the first exemplary structure after formation of a second retro-stepped dielectric material portion and a second insulating cap layer according to the first embodiment of the present disclosure.

Referring to FIG. 10, a dielectric fill material (such as undoped silicate glass or doped silicate glass) can be deposited to fill the first stepped cavity. Excess portions of the dielectric fill material can be removed from above the horizontal plane including the top surface of the topmost layer of the at least one second-tier dielectric liner (27, 28), for example, by performing a chemical mechanical polishing (CMP) process. A remaining portion of the dielectric fill material in the contact region 300 constitute a second retro-stepped dielectric material portion 265. A top surface of the second retro-stepped dielectric material portion 265 can be vertically recessed to a height at or about the topmost surface of the third dielectric liner 27. A portion of the fourth dielectric liner 28 that is not masked by the second retro-stepped dielectric material portion 165 can be removed by performing a timed isotropic etch process such as a wet etch process employing hot phosphoric acid and/or a mixture of hydrofluoric acid and ethylene glycol. The physically exposed top surface of the third dielectric liner 27 and the top surface of the second retro-stepped dielectric material portion 265 may be formed within a same horizontal plane. Generally, the second retro-stepped dielectric material portion 265 is formed above the at least one second-tier dielectric liner (27, 28). The at least one second-tier dielectric liner (27, 28) is present over the second stepped surfaces 302, and is absent over the first stepped surfaces 301. The at least one first-tier dielectric liner (23, 24) is present over the first stepped surfaces 301, and is absent over the second stepped surfaces 302.

An optional second insulating cap layer 272 can be formed over the second alternating stack (232, 242) and the second retro-stepped dielectric material portion 265. The optional second insulating cap layer 272, if employed, comprises an insulating material such as silicon oxide, and may have a thickness in a range from 30 nm to 300 nm, although lesser and greater thicknesses may also be employed. The combination of the second alternating stack (232, 242), the second retro-stepped dielectric material portion 265, the optional second insulating cap layer 272 collectively constitute a second-tier structure, which is an in-process structure that is subsequently modified.

Figure 11:
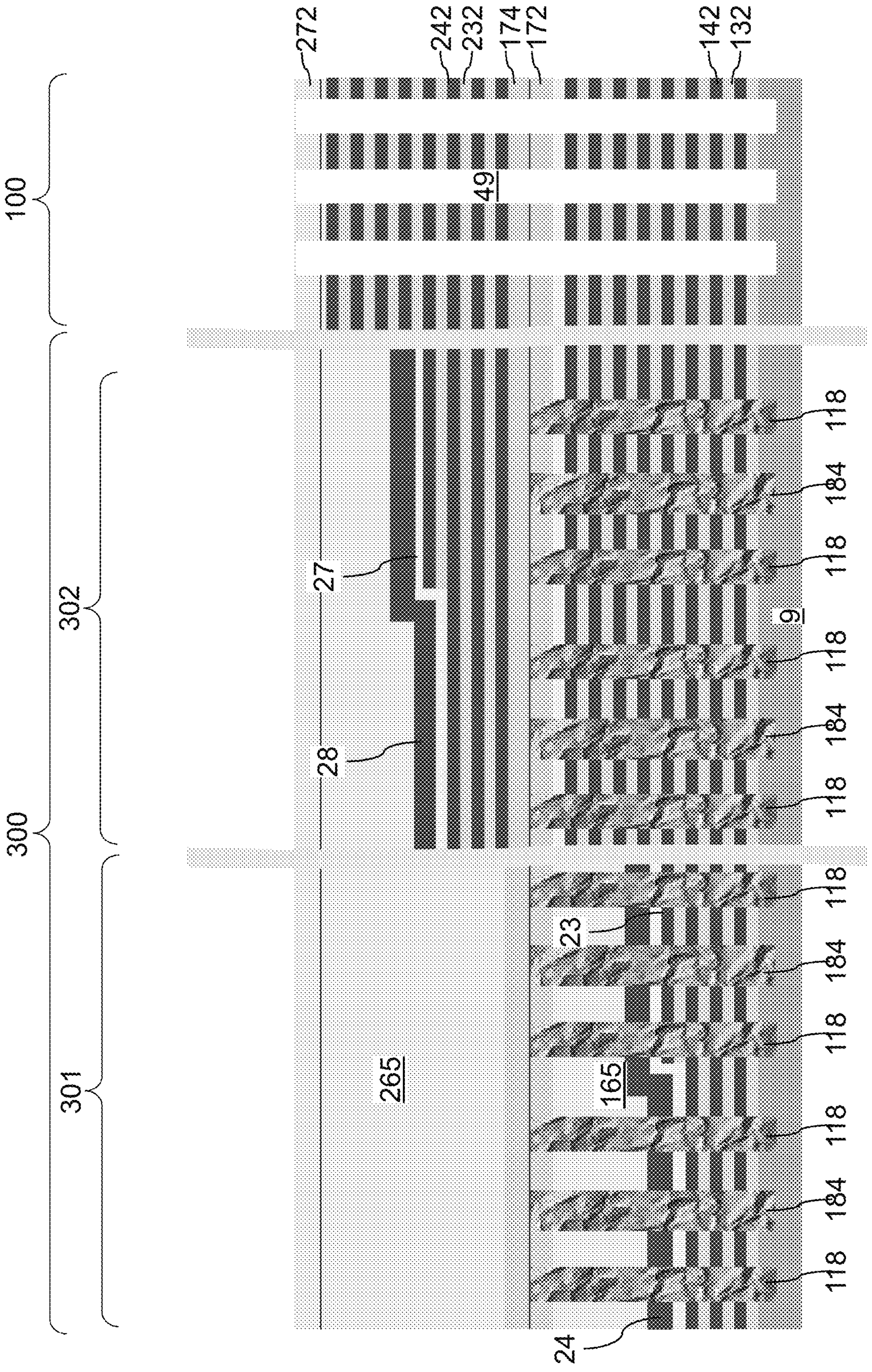
FIG. 11 is a vertical cross-sectional view of the first exemplary structure after formation of inter-tier memory openings according to the first embodiment of the present disclosure.

Referring to FIG. 11, a third photoresist layer (not shown) can be applied over the second-tier structure, and can be lithographically patterned to form a periodic two-dimensional array of openings in the memory array region 100. The periodic two-dimensional array of openings can overlie, and can have an areal overlap with, a periodic two-dimensional array of first-tier memory opening fill structures 148. A third anisotropic etch process can be performed to transfer the pattern of the openings in the third photoresist layer through the second-tier structure and onto top surfaces of the first-tier memory opening fill structures 148. A two-dimensional array of second-tier memory openings can be formed through the second alternating stack (232, 242) in the memory array region 100. The first-tier memory opening fill structures 148 can be subsequently removed selective to the materials of the first-tier alternating stack (132, 142), the second-tier alternating stack (232, 242), and the substrate 9 by ashing or selective etching. Inter-tier memory openings 49, which are also referred to as memory openings 49, can be formed through the first-tier alternating stack (132, 142) and the second-tier alternating stack (232, 242). Each memory opening 49 includes a volume of a first-tier memory opening 149 and a second-tier memory opening. The third photoresist layer can be subsequently removed, for example, by ashing.

Figure 12:
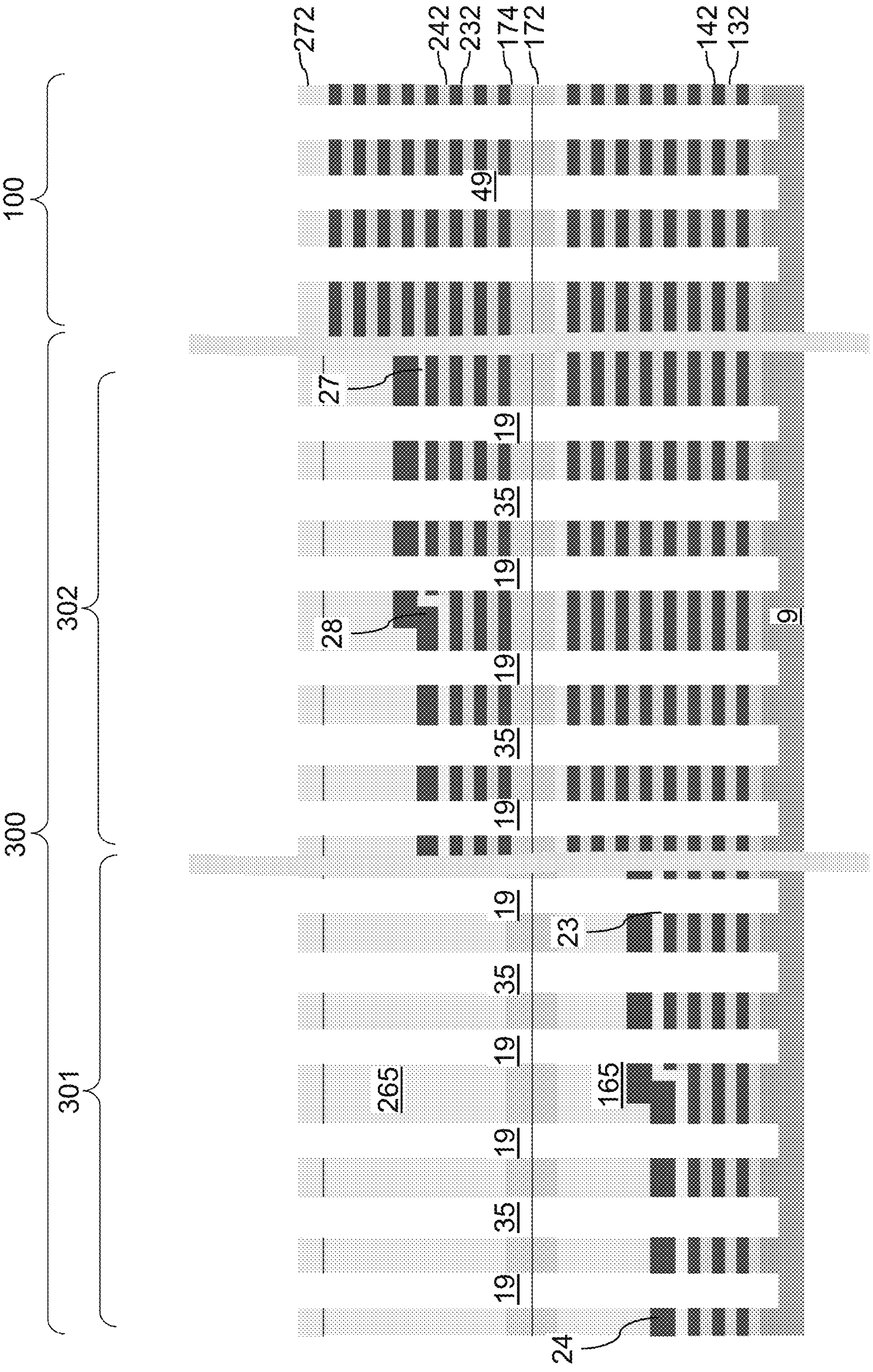
FIG. 12 is a vertical cross-sectional view of the first exemplary structure after formation of inter-tier support openings and inter-tier contact openings according to the first embodiment of the present disclosure.

Referring to FIG. 12, a fourth photoresist layer (not shown) can be applied over the second-tier structure, and can be lithographically patterned to form openings in the contact region 300. The openings in the fourth photoresist layer can overlie, and can have an areal overlap with, the first-tier support opening fill structures 118 and the first-tier contact opening fill structures 184. A fourth anisotropic etch process can be performed to transfer the pattern of the openings in the fourth photoresist layer through the second-tier structure and onto top surfaces of the first-tier support opening fill structures 118 and the first-tier contact opening fill structures 184. Openings are formed through the second-tier structure in the contact region 300. The openings comprise second-tier support openings that are formed above the first-tier support opening fill structures 118, and second-tier contact openings that are formed above the first-tier contact opening fill structures 184. The first-tier support opening fill structures 118 and the first-tier contact opening fill structures 184 can be subsequently removed selective to the materials of the first-tier alternating stack (132, 142), the second-tier alternating stack (232, 242), and the substrate 9 by ashing or selective etching.

Inter-tier support openings 19, which are also referred to as support openings 19, can be formed through the first-tier structure and the second-tier structure. Each support opening 19 includes a volume of a first-tier support opening 119 and a second-tier support opening. Inter-tier contact openings 35, which are also referred to as contact openings 35, can be formed through the first-tier structure and the second-tier structure. Each contact opening 35 includes a volume of a first-tier contact opening 185 and a second-tier contact opening. The fourth photoresist layer can be subsequently removed, for example, by ashing.

While an embodiment is described in which the memory openings 49 are formed prior to formation of the support openings 19 and the contact openings 35, alternative embodiments are expressly contemplated herein in which the memory openings 49 are formed after or concurrently with (by employing a common photoresist layer) formation of the support openings 19 and the contact openings 35. Generally, the memory openings 49 and the contact openings 35 can be formed by performing at least one anisotropic etch process through at least one alternating stack of insulating layers (132, 232) and spacer material layers (such as sacrificial material layers (142, 242)) employing at least one patterned etch mask layer (such as patterned photoresist layers) and removal of the exposed sacrificial material filling the first-tier openings.

Figure 13:
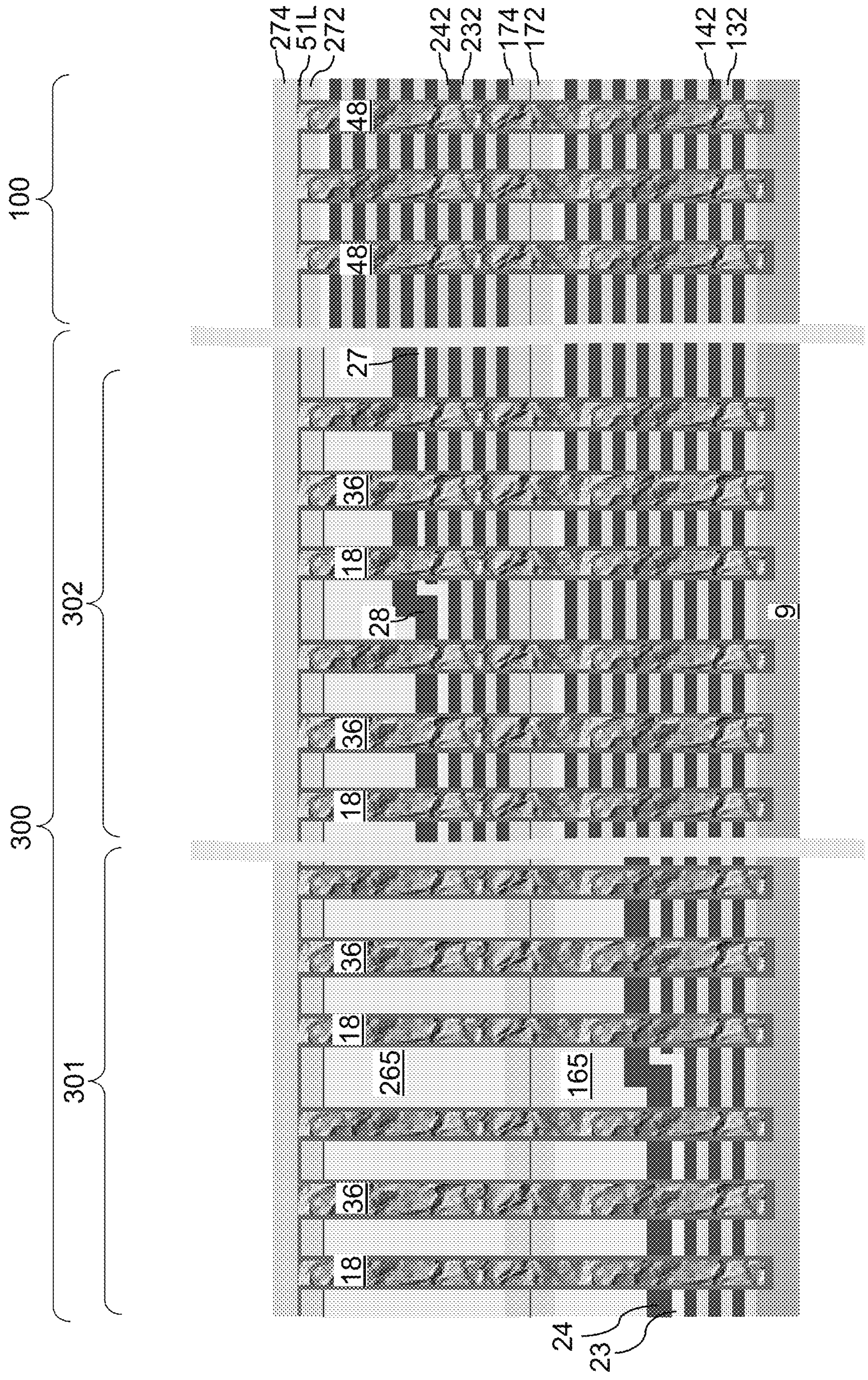
FIG. 13 is a vertical cross-sectional view of the first exemplary structure after formation of a dielectric liner layer, sacrificial opening fill structures, and a dielectric capping layer according to the first embodiment of the present disclosure.

Referring to FIG. 13, a dielectric liner layer 51L, sacrificial opening fill structures (48, 18, 36), and a dielectric capping layer 274 can be formed on the first exemplary structure. The dielectric liner layer 51L may include a dielectric material such as silicon oxide and/or a dielectric metal oxide. In one embodiment, the dielectric liner layer 51L comprises a dielectric material that can provide etch resistance to hot phosphoric acid that will be used to etch silicon nitride sacrificial material layers (142, 242). The dielectric liner layer 51L may be deposited by a conformal deposition, such as a low pressure chemical vapor deposition. The thickness of the dielectric liner layer 51L may be in a range from 5 nm to 30 nm, such as from 8 nm to 20 nm, although lesser and greater thicknesses may also be employed. Portions of the dielectric liner layer 51 may be used as a blocking dielectric of vertical NAND strings in subsequent steps.

The sacrificial opening fill structures (48, 18, 36) can be formed in the various openings (49, 19, 85) through the alternating stacks {(132, 142), (232, 242)}. The sacrificial opening fill structures (48, 18, 36) can be formed by depositing a sacrificial fill material in the various openings (49, 19, 85), and by removing portions of the sacrificial fill material that are deposited above the top surface of the horizontally-extending portion of the dielectric liner layer 51L that overlie that alternating stacks {(132, 142), (232, 242)}. The sacrificial fill material may comprise carbon, such as amorphous carbon or diamond-like carbon, a semiconductor material such as amorphous silicon or a silicon-germanium alloy, organosilicate glass, or a polymer material. The sacrificial opening fill structures (48, 18, 36) may comprise sacrificial memory opening fill structures 48 that are formed in the memory openings 49, sacrificial support opening fill structures 18 that are formed in the support openings 19, and sacrificial contact opening fill structures 36 that are formed in the contact openings 35.

The optional dielectric capping layer 274 comprises a dielectric material such as undoped silicate glass or a doped silicate glass. The thickness of the dielectric capping layer 274 may be in a range from 20 nm to 400 nm, such as from 40 nm to 200 nm, although lesser and greater thicknesses may also be employed.

Figure 14:
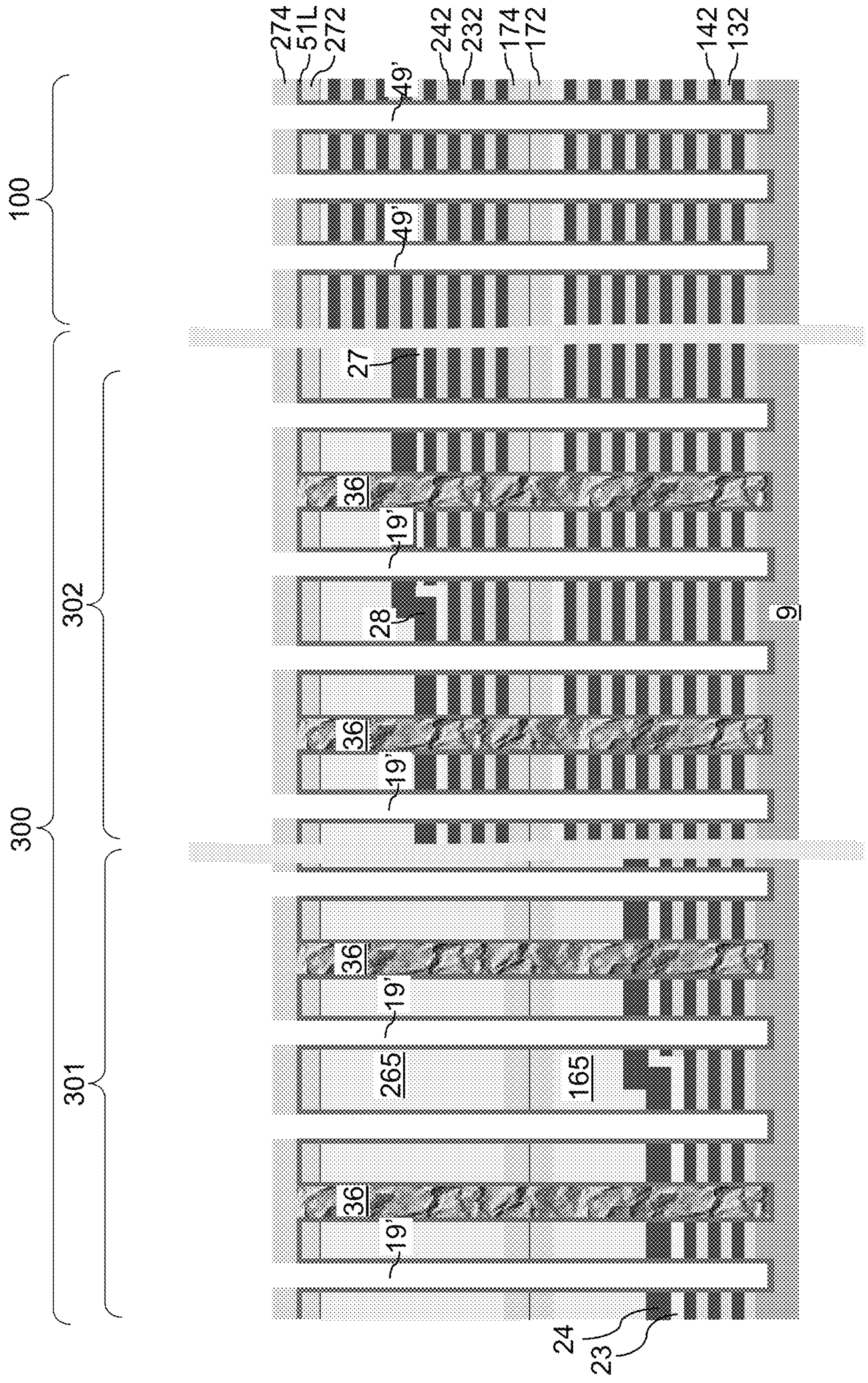
FIG. 14 is a vertical cross-sectional view of the first exemplary structure after formation of memory cavities and support cavities according to the first embodiment of the present disclosure.

Referring to FIG. 14, a photoresist layer (not shown) can be applied over the dielectric capping layer 274, and can be lithographically patterned to form openings over the areas of the sacrificial memory opening fill structures 48 and the sacrificial support opening fill structures 18. An anisotropic etch process can be performed to form openings through the dielectric capping layer 274 and to physically expose top surfaces of the sacrificial memory opening fill structures 48 and the sacrificial support opening fill structures 18. A selective etch process may be performed to remove the sacrificial memory opening fill structures 48 and the sacrificial support opening fill structures 18 selective to the dielectric liner layer 51L. A memory cavity 49' is formed in each volume from which a sacrificial memory opening fill structure 48 is removed, and a support cavity 19' is formed in each volume from which a sacrificial support opening fill structure 18 is removed. Generally, the sacrificial memory opening fill structures 48 and the sacrificial support opening fill structures 18 can be removed without removing the sacrificial contact opening fill structures 36.

Figure 15:
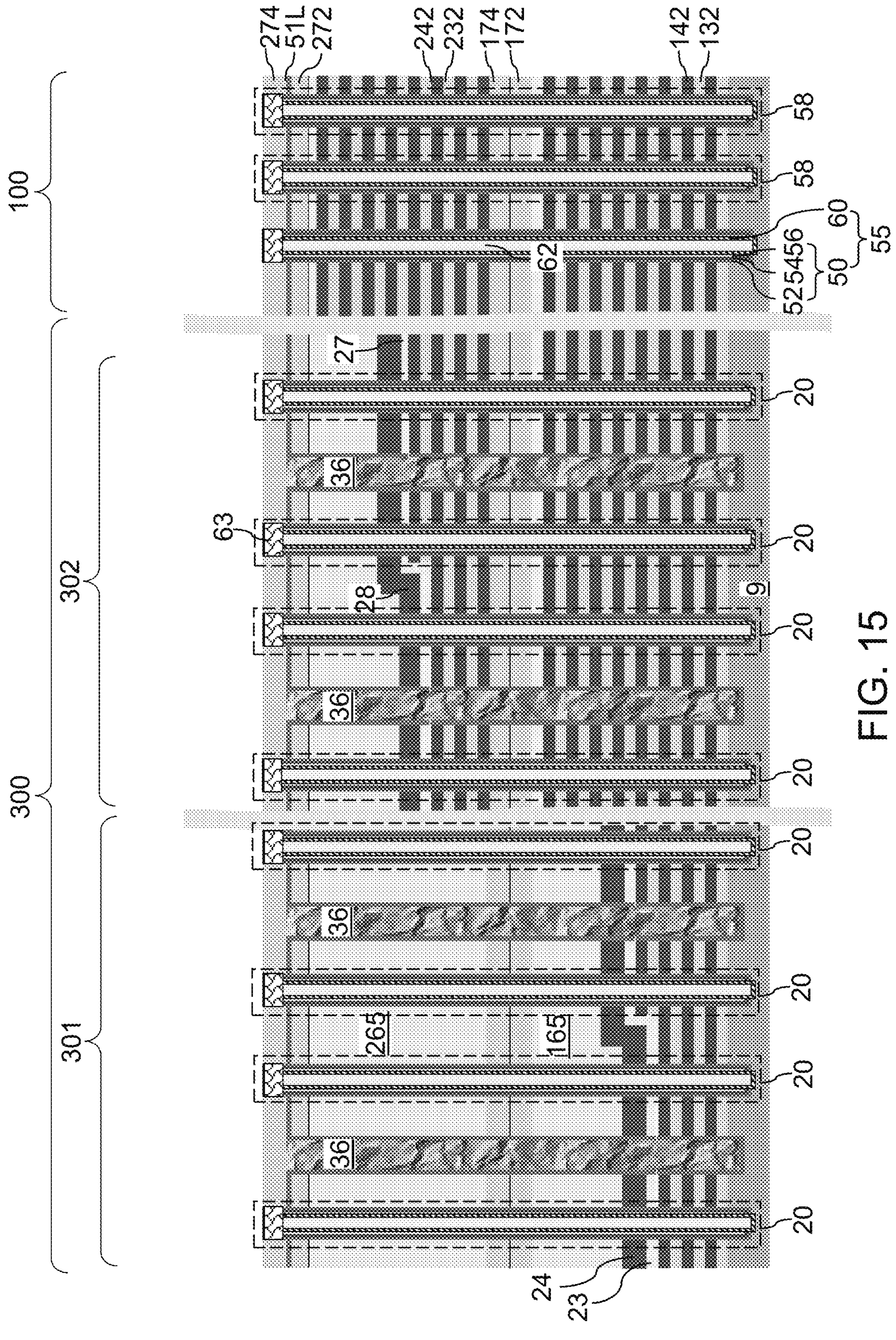
FIG. 15 is a vertical cross-sectional view of the first exemplary structure after formation of memory opening fill structures and support pillar structures according to the first embodiment of the present disclosure.

Referring to FIG. 15, a semiconductor pedestal (not illustrated) may be optionally formed at the bottom of each memory opening 49 and each support opening 19. A memory film 50 can be formed within each of the memory openings 49 and the support openings 19. The memory films 50 may include any memory material that can store information by charge trapping, a change in electrical resistivity, a change in the direction of ferroelectric dipole moments (e.g., in a ferroelectric material), or any other material that can store information therein. For example, each memory film 50 may comprise a layer stack including a blocking dielectric layer 52, a charge storage material layer 54, and a tunneling dielectric layer 56. In one embodiment, the memory films 50 can be formed by depositing material layers and/or material portions and by removing excess portions of the material layers and/or the material portions from outside the memory openings 49 and the support openings 19, for example, by performing an anisotropic etch process.

In one embodiment, the dielectric liner layer 51L may comprise a blocking dielectric material. In this embodiment, the vertically-extending portions of the dielectric liner layer 51L may be employed as the blocking dielectric layers 52. The charge storage material layer 54 may comprise a silicon nitride layer. The tunneling dielectric layer 56 may comprise a silicon oxide layer or an "ONO" stack of silicon oxide/silicon nitride/silicon oxide layers.

A vertical semiconductor channel 60 can be formed in each of the memory openings 49 and the support openings 19 by conformal deposition of a semiconductor channel material (e.g., amorphous silicon or polysilicon) having a doping of a first conductivity type. The semiconductor channel material may have a doping of a same conductivity type as the horizontal semiconductor channels (not expressly shown) located in an upper portion of the substrate 9. A dielectric fill material can be deposited in the remaining volumes of the memory openings 49 and the support openings 19, and can be vertically recessed to form a dielectric core 62. A semiconductor material (e.g., amorphous silicon or polysilicon) having a doping of a second conductivity type can be deposited over each dielectric core 62 at a top end of each vertical semiconductor channel 60 to form a drain region 63. The second conductivity type is opposite of the first conductivity type. Each contiguous combination of a memory film 50 and a vertical semiconductor channel 60 constitutes a memory stack structure 55. Each memory stack structure 55 comprises a respective vertical stack of memory elements. For example, each vertical stack of memory elements may comprise portions of the charge storage layer 54 located at the levels of the sacrificial material layers (142, 242) which are subsequently replaced with electrically conductive layers.

Generally, the memory opening fill structures 58 are formed in volumes from which the sacrificial memory opening fill structures 48 are removed while the sacrificial contact opening fill structures 36 are present in the contact openings 35. Each of the memory opening fill structures 58 comprises a respective vertical semiconductor channel 60, a respective vertical stack of memory elements (e.g., portions of a memory film 50), a drain region 63 and an optional dielectric core 62. Optionally, drain-select-level dielectric isolation structures 72 (shown in FIGS. 17A-17C) can be formed through an uppermost set of second sacrificial material layers 242 located at the levels of the to be formed drain side select gate electrodes.

Figure 16:
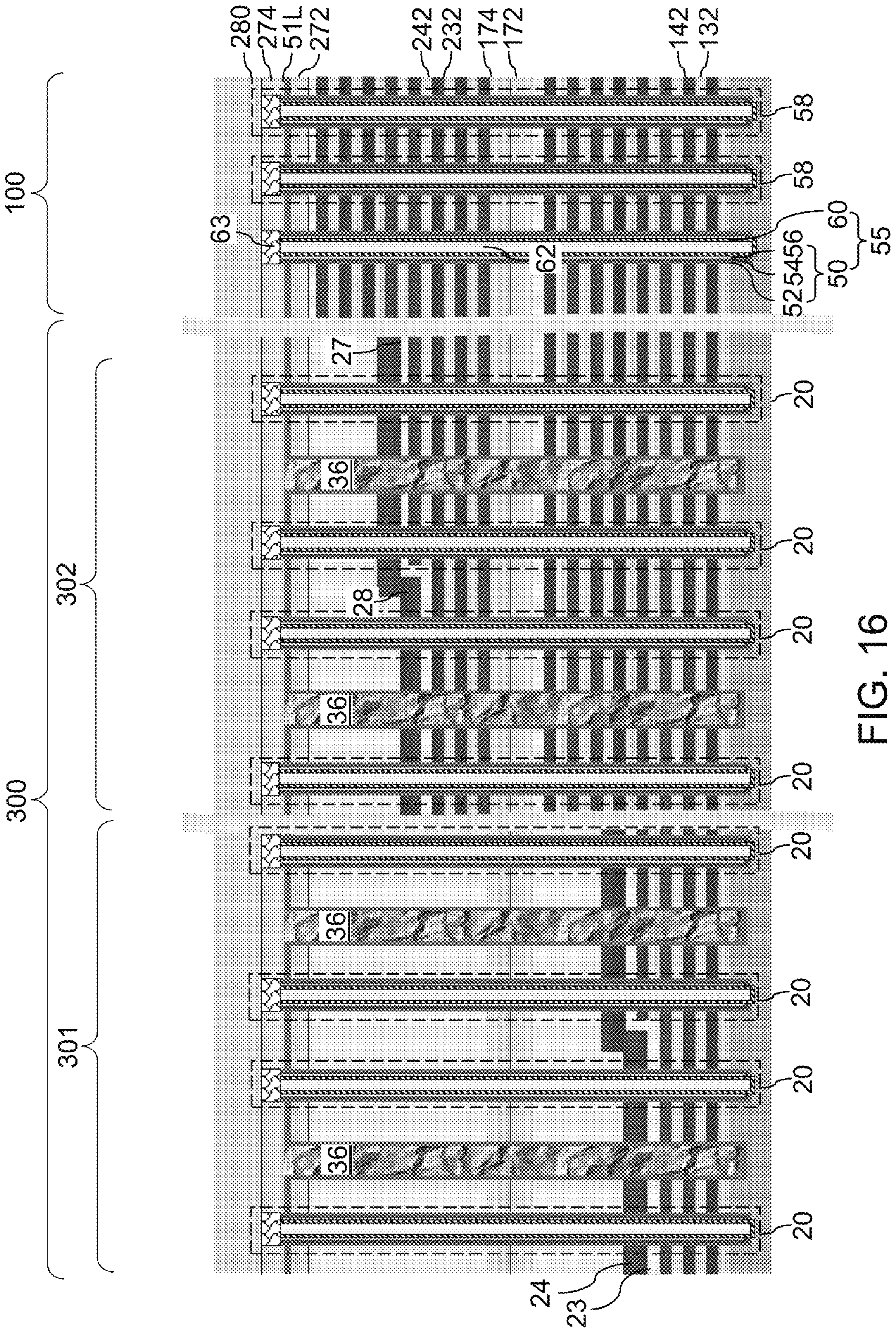
FIG. 16 is a vertical cross-sectional view of the first exemplary structure after formation of a contact-level dielectric layer according to the first embodiment of the present disclosure.

Referring to FIG. 16, a contact-level dielectric layer 280 can be formed above the dielectric capping layer 274. The contact-level dielectric layer 280 includes a dielectric material such as silicon oxide, and can be formed by a conformal or non-conformal deposition process. For example, the contact-level dielectric layer 280 can include undoped silicate glass and can have a thickness in a range from 100 nm to 600 nm, although lesser and greater thicknesses can also be employed.

Figure 17A:
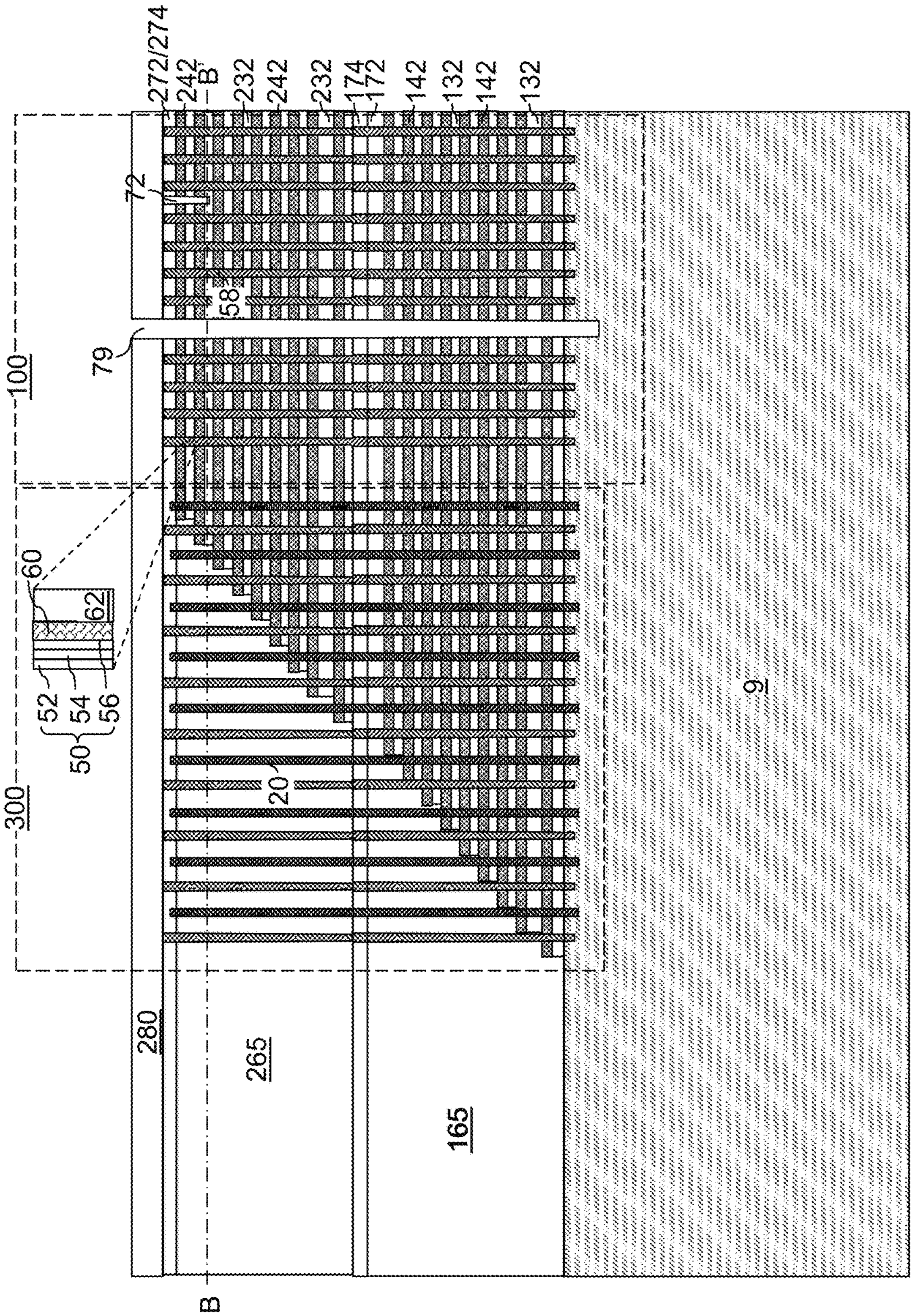
FIG. 17A is a vertical cross-sectional view of the first exemplary structure after formation of backside trenches according to the first embodiment of the present disclosure.

Referring to FIGS. 17A-17 C, the drain-select-level dielectric isolation structures 72 may laterally extend along a first horizontal direction (e.g., word line direction) hd1, and may be laterally spaced apart along a second horizontal direction (e.g., bit line direction) hd2. A photoresist layer (not shown) can be applied over the contact-level dielectric layer 280 and can be lithographically patterned to form openings within areas extending across the memory array region 100 and the contact region 300. The openings in the photoresist layer can laterally extend along the first horizontal direction hd1 between each neighboring cluster of memory opening fill structures 58. Backside trenches 79 can be formed by transferring the pattern in the photoresist layer through the contact-level dielectric layer 280, the second alternating stack (232, 242, 272, 265, 72), and the first alternating stack (132, 142, 172, 165), and into the substrate 9. Portions of the contact-level dielectric layer 280, the second alternating stack (232, 242, 272, 265, 72), the first alternating stack (132, 142, 172, 165), and the substrate 9 that underlie the openings in the photoresist layer can be removed to form backside trenches 79. In one embodiment, the backside trenches 79 can be formed between clusters of memory opening fill structures 58. The clusters of the memory opening fill structures 58 can be laterally spaced apart along the second horizontal direction hd2 by the backside trenches 79.

Figure 18:
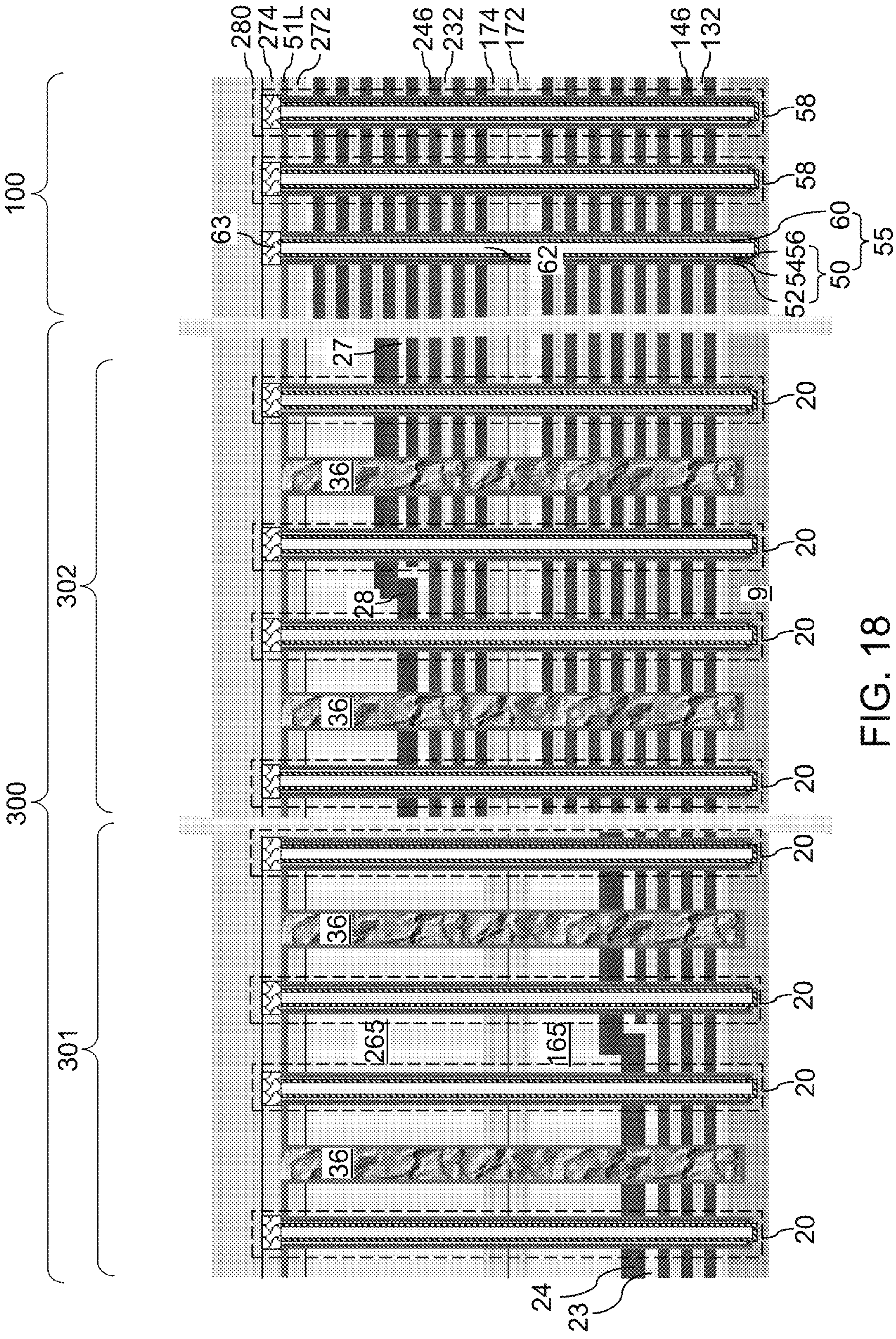
FIG. 18 is a vertical cross-sectional view of the first exemplary structure after replacement of the sacrificial material layers with electrically conductive layers according to the first embodiment of the present disclosure.

Referring to FIG. 18, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. For example, the first and second sacrificial material layers (142, 242) can include silicon nitride, the materials of the first and second insulating layers (132, 232), the first and second insulating cap layers (172, 272), the first and second retro-stepped dielectric material portions (165, 265), and the material of the outermost layer of the memory films 50 can include silicon oxide materials. First backside recesses are formed in volumes from which the first sacrificial material layers 142 are removed. Second backside recesses are formed in volumes from which the second sacrificial material layers 242 are removed.

The isotropic etch process can be a wet etch process employing a wet etch solution, or can be a gas phase (dry) etch process in which the etchant is introduced in a vapor phase into the backside trenches 79. For example, if the first and second sacrificial material layers (142, 242) include silicon nitride, the etch process can be a wet etch process in which the first exemplary structure is immersed within a wet etch tank including phosphoric acid, which etches silicon nitride selective to silicon oxide and silicon.

Each of the first and second backside recesses can be a laterally extending cavity having a lateral dimension that is greater than the vertical extent of the cavity. In other words, the lateral dimension of each of the first and second backside recesses can be greater than the height of the respective backside recess. A plurality of first backside recesses can be formed in the volumes from which the material of the first sacrificial material layers 142 is removed. A plurality of second backside recesses can be formed in the volumes from which the material of the second sacrificial material layers 242 is removed. Each of the first and second backside recesses can extend substantially parallel to the top surface of the substrate 9. A backside recess can be vertically bounded by a top surface of an underlying insulating layer (132 or 232) and a bottom surface of an overlying insulating layer (132 or 232). In one embodiment, each of the first and second backside recesses can have a uniform height throughout.

A backside blocking dielectric layer (not shown) can be optionally deposited in the backside recesses and the backside trenches 79 and over the contact-level dielectric layer 280. The backside blocking dielectric may comprise a dielectric metal oxide material, such as aluminum oxide. At least one conductive material can be conformally deposited in the plurality of backside recesses, on the sidewalls of the backside trench 79, and over the contact-level dielectric layer 280. The at least one conductive material can include at least one metallic material, i.e., an electrically conductive material that includes at least one metal element.

A plurality of first electrically conductive layers 146 can be formed in the plurality of first backside recesses, a plurality of second electrically conductive layers 246 can be formed in the plurality of second backside recesses, and a continuous metallic material layer (not shown) can be formed on the sidewalls of each backside trench 79 and over the contact-level dielectric layer 280. Thus, the first and second sacrificial material layers (142, 242) can be replaced with the first and second conductive material layers (146, 246), respectively. Specifically, each first sacrificial material layer 142 can be replaced with an optional portion of the backside blocking dielectric layer and a first electrically conductive layer 146, and each second sacrificial material layer 242 can be replaced with an optional portion of the backside blocking dielectric layer and a second electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and/or ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

The deposited metallic material of the continuous metallic material layer can be etched back from the sidewalls of each backside trench 79 and from above the contact-level dielectric layers 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure.

A subset of the second electrically conductive layers 246 located at the levels of the drain-select-level isolation structures 72 constitutes drain select gate electrodes. A subset of the electrically conductive layer (146, 246) located underneath the drain select gate electrodes can function as combinations of a control gate and a word line located at the same level. The control gate electrodes within each electrically conductive layer (146, 246) are the control gate electrodes for a vertical memory device including the memory stack structure 55. One or more bottommost electrically conductive layers 146 constitute source select gate electrodes.

Each of the memory opening fill structures 58 (which contains a respective memory stack structures 55) comprises a vertical stack of memory elements located at each level of the electrically conductive layers (146, 246). A subset of the electrically conductive layers (146, 246) can comprise word lines for the memory elements. A horizontal source line (e.g., direct strap contact) may be formed below the electrically conductive layers 146 through the backside trench 79 to contact a side of the lower portion of the semiconductor channel 60. An insulating material layer can then be formed in the backside trenches 79 to completely fill the entire volume of a backside trench 79.

Figure 19:
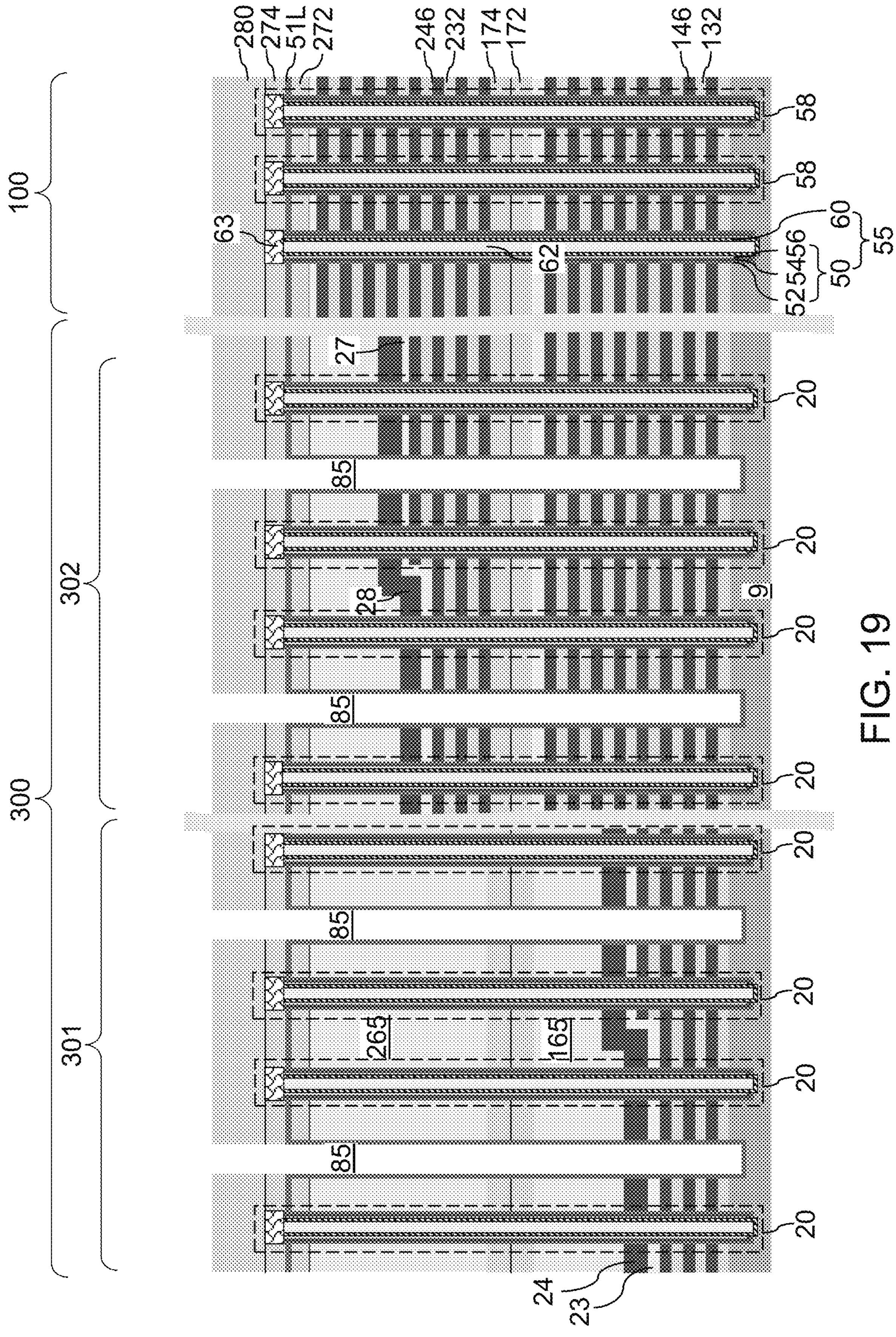
FIG. 19 is a vertical cross-sectional view of the first exemplary structure after formation of contact cavities by removal of sacrificial contact opening fill structures according to the first embodiment of the present disclosure.

Referring to FIG. 19, a photoresist layer (not shown) can be applied over the contact-level dielectric layer 280, and openings can be formed over the areas of the sacrificial contact opening fill structures 36. An anisotropic etch process can be performed to etch through unmasked portions of the contact-level dielectric layer 280 and the dielectric capping layer 274, and to physically expose top surfaces of the sacrificial contact opening fill structures 36. Subsequently, the sacrificial contact opening fill structures 36 can be removed by performing a selective etch process that etches the sacrificial fill material of the sacrificial contact opening fill structures 36 selective to the material of the dielectric liner layer 51L. Contact cavities 85 are formed in volumes from which the sacrificial contact opening fill structures 36 are removed. The photoresist layer may be subsequently removed, for example, by ashing.

Figure 20:
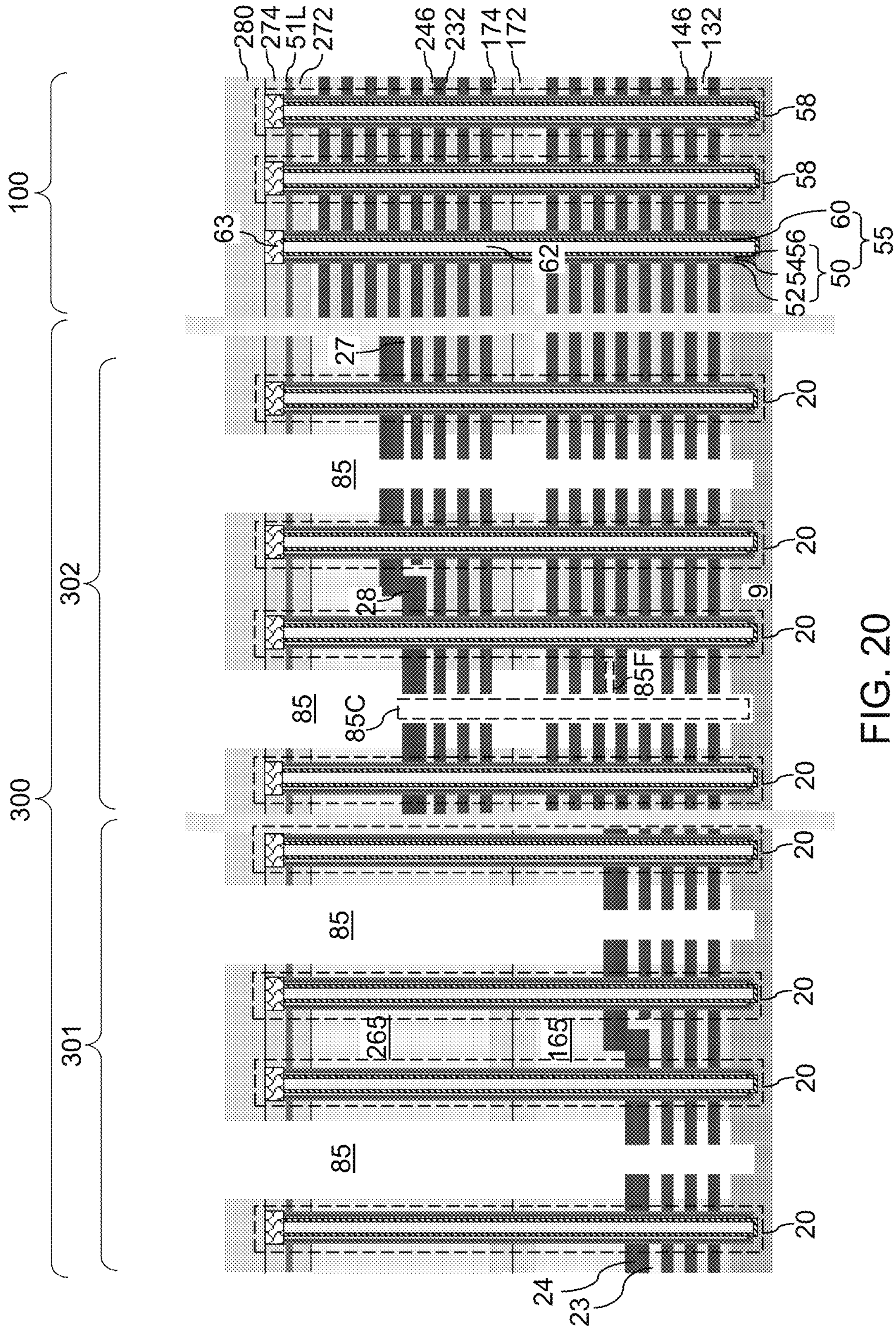
FIG. 20 is a vertical cross-sectional view of the first exemplary structure after laterally expanding the contact cavities according to the first embodiment of the present disclosure.

Referring to FIG. 20, a first isotropic etch process can be performed to remove portions of the dielectric liner layer 51L around the contact cavities 85 selective to the materials of the alternating stacks {(132, 146), (232, 246)} and the retro-stepped dielectric material portions (165, 265).

Subsequently, the contact cavities 85 can be laterally expanded by performing a second isotropic etch process that laterally recesses proximal portions of the insulating layers (132, 232), retro-stepped dielectric material portions (165, 265), the optional first insulating cap layer 172, the optional inter-tier dielectric layer 174, the optional dielectric capping layer 274, and the contact-level dielectric layer 280 around each of the contact cavities 85 selective to the electrically conductive layers (146, 246). In an illustrative example, the insulating layers (132, 232), retro-stepped dielectric material portions (165, 265), the optional first insulating cap layer 172, the optional inter-tier dielectric layer 174, the optional dielectric capping layer 274, and the contact-level dielectric layer 280 may comprise silicon oxide materials (such as undoped silicate glass or a doped silicate glass), and the second isotropic etch process may comprise a wet etch process employing dilute hydrofluoric acid. The duration of the second isotropic etch process can be selected such that the lateral recess distance of the sidewalls of the insulating layers (132, 232) around each of the contact cavities 85 is in a range from 20 nm to 200 nm, such as from 40 nm to 100 nm, although lesser and greater lateral recess distances may also be employed. In an embodiment in which the dielectric liner layer 51L comprises silicon oxide, the first isotropic etch process and the second isotropic etch process may be combined into a single etch process.

The contact cavities 85, which are also referred to as laterally-expanded contact cavities 85 hereafter, comprise a respective upper portion that is formed by laterally recessing the at least one retro-stepped dielectric material portion (165, 265), and a respective lower portion that extends through at least one dielectric liner {(23, 24) or (27, 28)} and a respective set of layers in the at least one alternating stack {(132, 146), (232, 246)} of insulating layers (132, 232) and electrically conductive layers (146, 246). The upper portion of each contact cavity 85 comprises a respective cylindrical cavity that is laterally surrounded by a remaining portion of the at least one retro-stepped dielectric material portion (165, 265). The lower portion of each contact cavity 85 comprises a respective finned cavity that underlies the respective cylindrical cavity. As used herein, a "finned cavity" refers to a cavity having a central cavity 85C and at least one fin-shaped cavity 85F that that laterally extends outward from the central cavity 85C and having a respective vertical extent that is less than the vertical extent of the central cavity 85C. Each finned cavity comprises a central cavity 85C and at least one fin-shaped cavity 85F that laterally protrudes outward from the central cavity. In one embodiment, each of the fin-shaped cavities may have a respective tubular shape, i.e., a shape of a volume generated by a vertical movement of a punctured disk having an inner periphery and an outer periphery.

Figure 21:
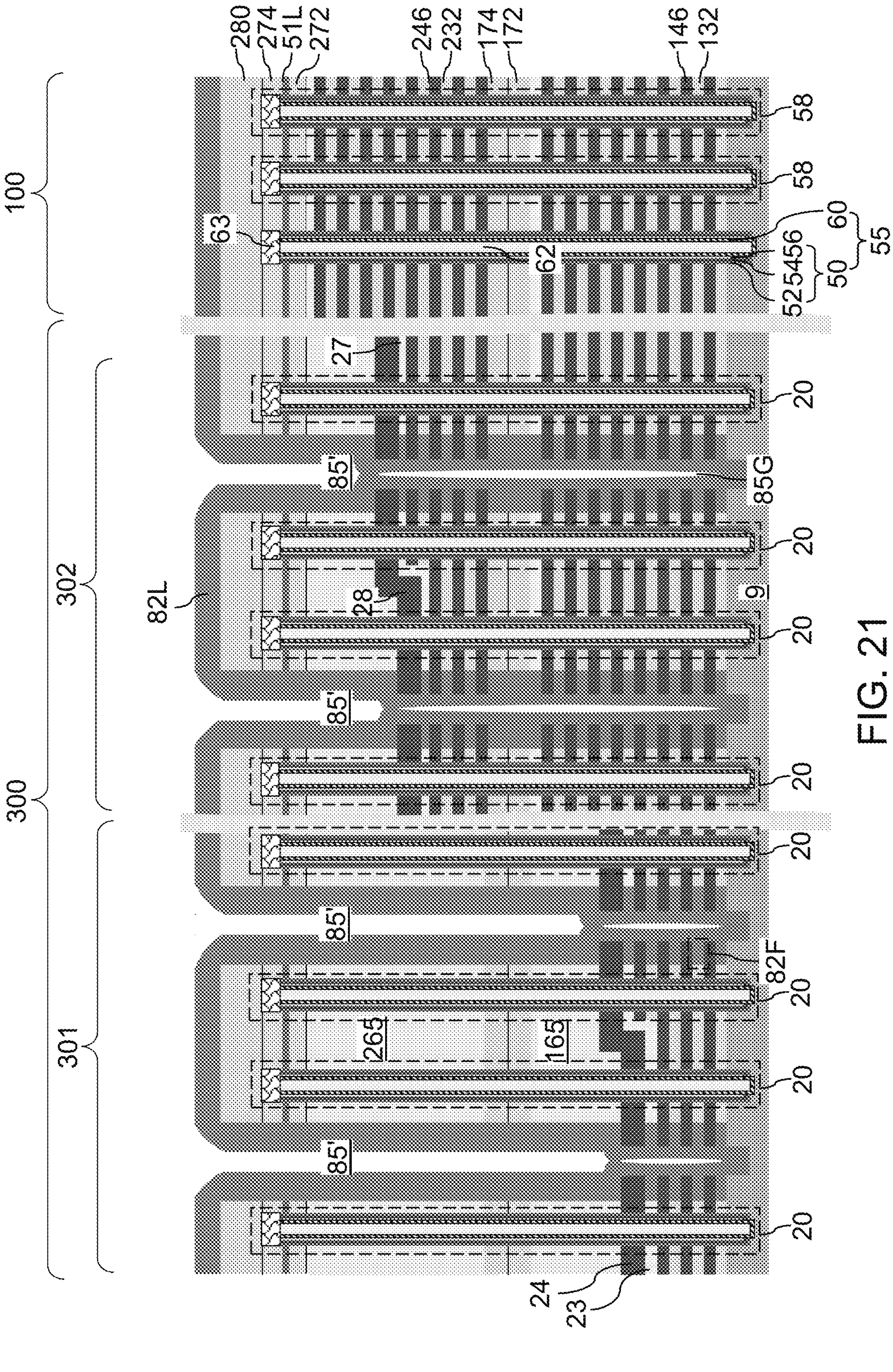
FIG. 21 is a vertical cross-sectional view of the first exemplary structure after deposition of a first dielectric fill material layer according to the first embodiment of the present disclosure.

Referring to FIG. 21, a first dielectric fill material layer 82L comprising a first dielectric fill material can be conformally deposited in the laterally-expanded contact cavities 85 by a first conformal deposition process such as a low pressure chemical vapor deposition (LPCVD) process. The first dielectric fill material layer 82L comprises a first dielectric fill material, such as undoped silicate glass (i.e., silicon oxide), a doped silicate glass, or organosilicate glass. The first dielectric fill material layer 82L can be conformally deposited in the finned cavities 85F and in peripheral regions of the central cavities 85C of the laterally-expanded contact cavities 85. The thickness of the first dielectric fill material layer 82L can be less than one half of the lateral dimension of each of the laterally-expanded contact cavities 85. A dielectric fin 82F portion of the first dielectric fill material layer 82L that laterally protrudes outward at a level of a respective one of the insulating layers (132, 232) is located in each respective finned cavity 85F.

In one embodiment, the duration of the first conformal deposition process can be selected such that seams within openings in the at least one dielectric liner (23, 24, 27, 28) are sealed. A void 85' can be present within the upper portion of each laterally-expanded contact cavity 85. In some embodiments, an air gap 85G may be present underneath a sealed seam in the first dielectric fill material layer 82L in a lower portion of one, a plurality or each of the laterally-expanded contact cavities 85.

Figure 22:
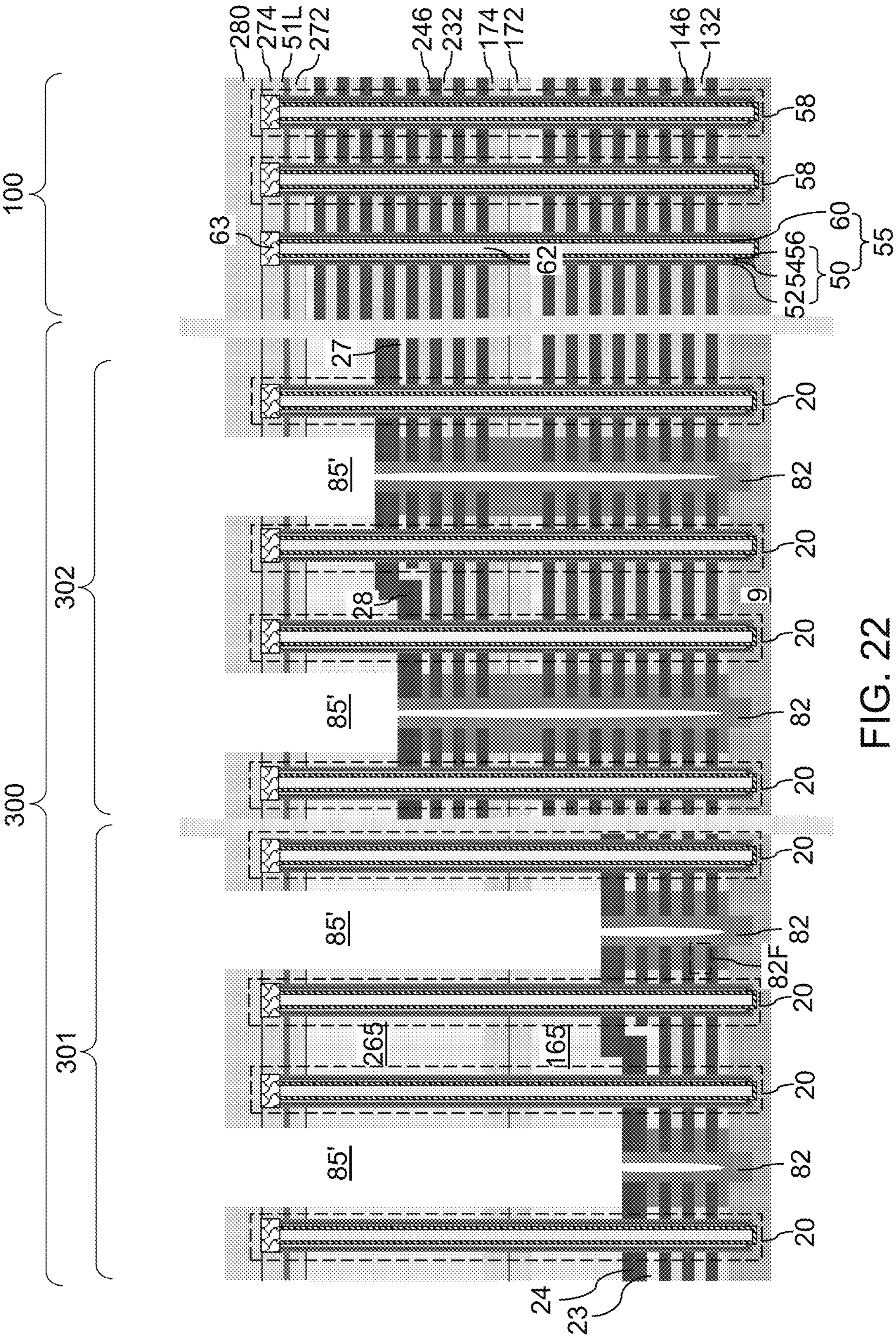
FIG. 22 is a vertical cross-sectional view of the first exemplary structure after isotropic recessing of the first dielectric fill material layer according to the first embodiment of the present disclosure.

Referring to FIG. 22, a first isotropic etch process can be performed to isotropically etch portions of the first dielectric fill material layer 82L from above the openings in the at least one dielectric liner (23, 24, 27, 28) in the laterally-expanded contact cavities 85. Sidewalls of the retro-stepped dielectric material portions (165, 265) can be physically exposed around the laterally-expanded contact cavities 85. Top surfaces of one of the at least one dielectric liner (23, 24, 27, 28) can be physically exposed to the void 85' within each of the laterally-expanded contact cavities 85. Generally, the first dielectric fill material of the first dielectric fill material layer 82L can be removed from inside the cylindrical cavities that overlie a top surface of a respective one of the at least one dielectric liner (23, 24, 27, 28). Each remaining portion of the first dielectric fill material that remains in a respective laterally-expanded contact cavity 85 constitutes a first dielectric fill material portion 82. If any of the air gaps 85G are present prior to the first isotropic etch process, then they are connected to the voids 85' and converted to open gaps. The duration of the first isotropic etch process can be selected such that top surface segments of the second dielectric liner 24 and top surface segments of the fourth dielectric liner 28 are physically exposed after the first isotropic etch process.

Figure 23:
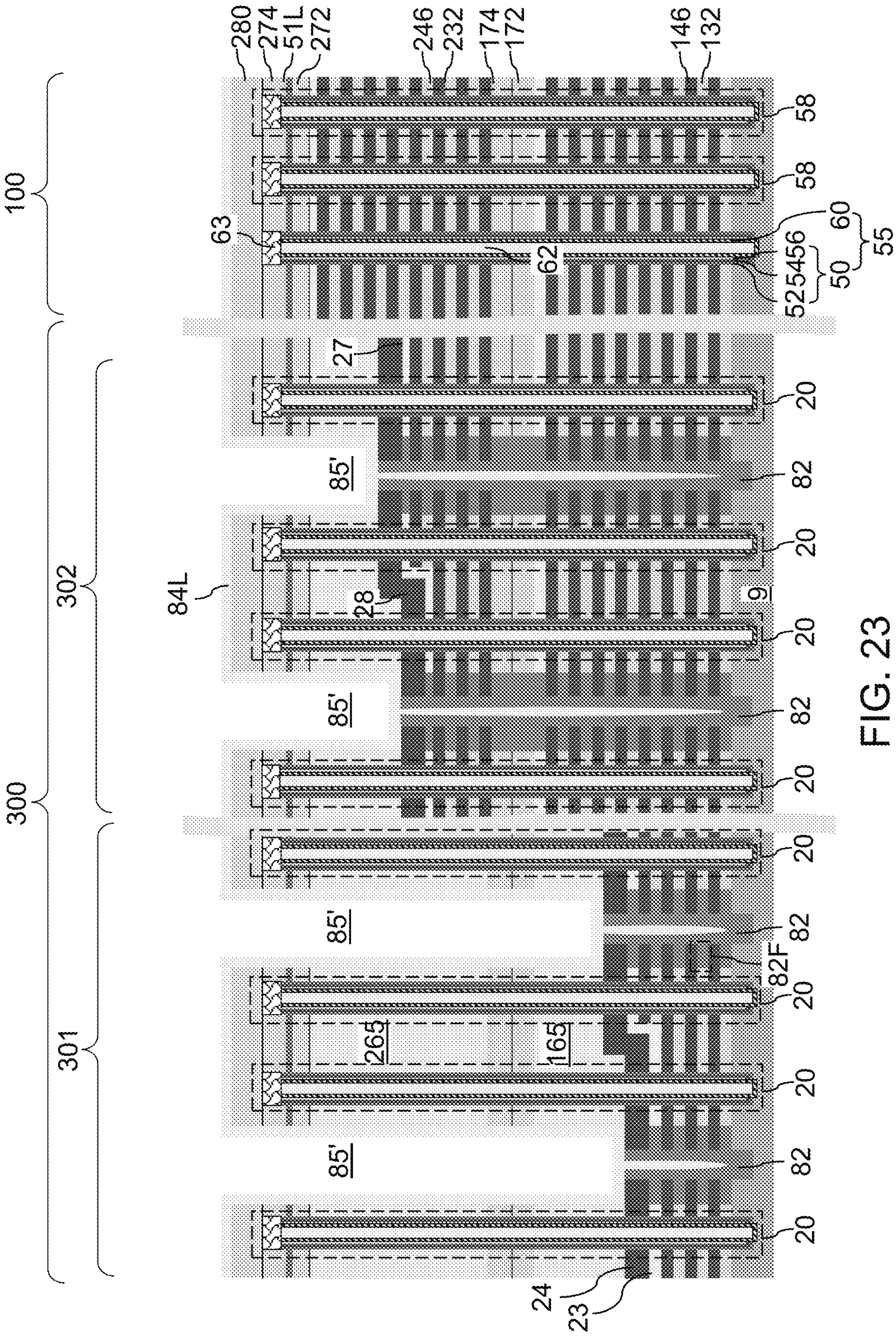
FIG. 23 is a vertical cross-sectional view of the first exemplary structure after deposition of a second dielectric fill material layer according to the first embodiment of the present disclosure.

Referring to FIG. 23, a second dielectric fill material layer 84L comprising a second dielectric fill material can be conformally deposited in the voids 85' in the laterally-expanded contact cavities 85 by a second conformal deposition process such as a low pressure chemical vapor deposition (LPCVD) process. The second dielectric fill material layer 84L comprises a second dielectric fill material such as undoped silicate glass, a doped silicate glass, or organosilicate glass. The second dielectric fill material may be the same as or may be different from the first dielectric fill material. The second dielectric fill material layer 84L can be conformally deposited in the seams in the first dielectric fill material portions 82 and in peripheral regions of the cylindrical cavities of the laterally-expanded contact cavities 85. The thickness of the second dielectric fill material layer 84L can be selected such that the seams and gaps underlying the openings in the at least one dielectric liner (23, 24, 27, 28) are filled by the second dielectric fill material layer 84L. Thus, a void-free fill by dielectric material portions may be provided within each portion of the laterally-expanded contact cavities 85 that is laterally surrounded by the alternating stacks of insulating layers {(132, 146), (232, 246)}. A void 85' can be present within the upper portion of each laterally-expanded contact cavity 85.

Figure 24:
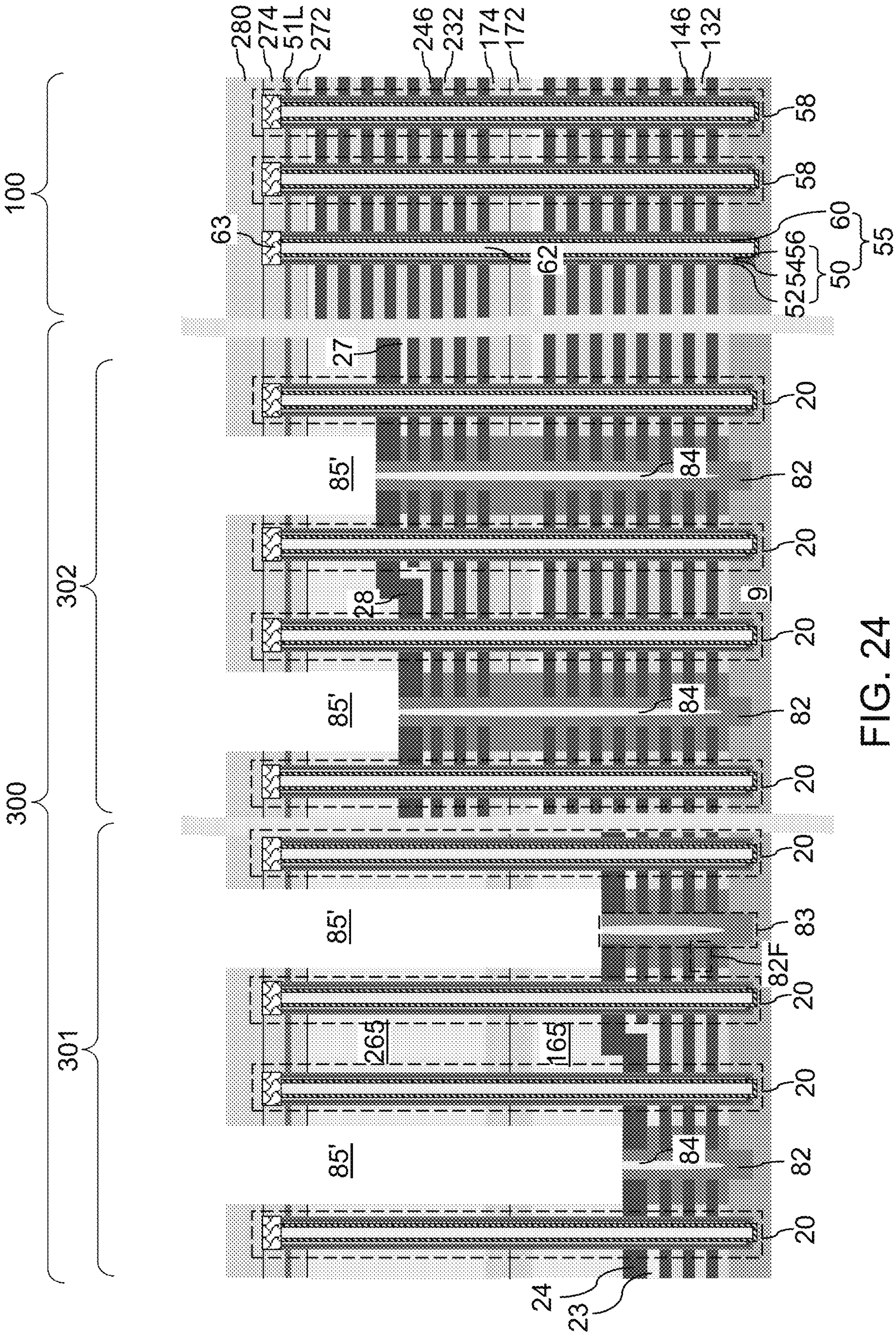
FIG. 24 is a vertical cross-sectional view of the first exemplary structure after isotropic recessing of the second dielectric fill material layer according to the first embodiment of the present disclosure.

Referring to FIG. 24, a second isotropic etch process can be performed to isotropically etch portions of the second dielectric fill material layer 84L from above the openings in the at least one dielectric liner (23, 24, 27, 28) in the laterally-expanded contact cavities 85. Sidewalls of the retro-stepped dielectric material portions (165, 265) can be physically exposed around the laterally-expanded contact cavities 85. Top surfaces of one of the at least one dielectric liner (23, 24, 27, 28) can be physically exposed to the void 85' within each of the laterally-expanded contact cavities 85. Generally, the second dielectric fill material of the second dielectric fill material layer 84L can be removed from inside the cylindrical cavities that overlie a top surface of a respective one of the at least one dielectric liner (23, 24, 27, 28). Each remaining portion of the second dielectric fill material that remains in a respective laterally-expanded contact cavity 85 (e.g., in the open gap portions of the cavity 85) constitutes a second dielectric fill material portion 84. The processing steps of FIGS. 23 and 24 are optional. In case seams within the first dielectric fill material portions 82 are not present after the processing steps described with reference to FIG. 22, the processing steps described with reference to FIGS. 23 and 24 may be omitted.

Generally, at least one dielectric fill material can be conformally deposited in the laterally-expanded contact cavities 85, and can be isotropically recessed in the upper portion thereof, i.e., in the cylindrical cavities within the laterally-expanded contact cavities 85. Each remaining portion of the at least one dielectric fill material that fills a finned cavity located at a lower portion of a respective one of the laterally-expanded contact cavities 85 constitutes a finned dielectric pillar structure (82, 84). In other words, the finned dielectric pillar structures (82, 84) comprise remaining portions of the at least one dielectric fill material that fills the finned cavities, which are the lower portions of the laterally-expanded contact cavities 85.

Each finned dielectric pillar structure (82, 84) vertically extends through the at least one alternating stack {(132, 146), (232, 246)} in the contact region 300. In one embodiment, each of the finned dielectric pillar structures (82, 84) comprises at least one dielectric fin 82F that laterally protrudes outward at a level of a respective one of the insulating layers (132, 232). In one embodiment, one or more of the at least one dielectric fin 82F comprises a cylindrical sidewall in contact with a respective one of the insulating layers (132, 232). In one embodiment, each of the finned dielectric pillar structures (82, 84) comprises a dielectric pedestal structure 83, which is a cylindrical portion of the respective finned dielectric pillar structure (82, 84) that that vertically extends from the substrate 9 to a respective one of the at least one dielectric liner (23, 24, 27, 28). Thus, each of the finned dielectric pillar structures (82, 84) may comprise a respective dielectric pedestal structure 83 and a respective set of at least one dielectric fin 82F that laterally protrudes outward from the respective dielectric pedestal structure 83. In one embodiment, for each of the finned dielectric pillar structures (82, 84), a combination of the at least one dielectric fin 82F and a tubular portion of the dielectric pedestal structure 83 constitute a first dielectric fill material portion 82 comprising a first dielectric fill material, and a cylindrical core portion of the dielectric pedestal structure 83 comprises a second dielectric fill material portion 84 comprising a second dielectric fill material having a boundary between them.

Figure 25:
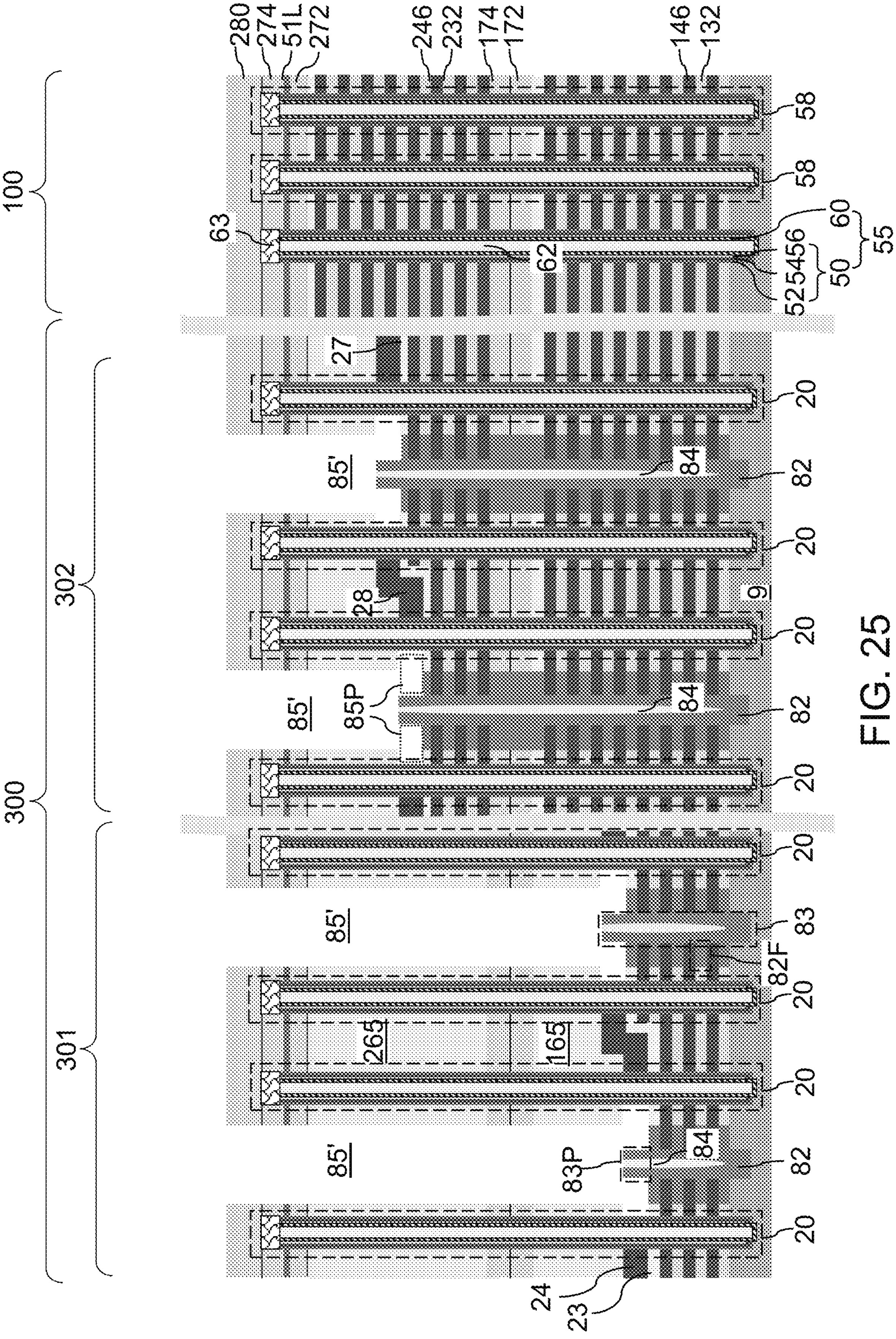
FIG. 25 is a vertical cross-sectional view of the first exemplary structure after recessing the second dielectric liner and the fourth dielectric liner according to the first embodiment of the present disclosure.

Referring to FIG. 25, an etch process is performed to recess an upper dielectric liner (24, 28) within each of the at least one dielectric liner (23, 24, 27, 28). For example, proximal portions of the second dielectric liner 24 and the fourth dielectric liner 28 adjacent to the voids 85' can be removed selective to the materials of the first dielectric liner 23 and the third dielectric liner 27. The etch process may comprise an anisotropic etch process or an isotropic etch process. In one illustrative example, if the second dielectric liner 24 and the fourth dielectric liner 28 comprise silicon nitride, then the etch process may comprise a wet etch process employing hot phosphoric acid and/or a mixture of hydrofluoric acid and ethylene glycol. Alternatively, if the second dielectric liner 24 and the fourth dielectric liner 28 comprise silicon carbonitride, then the etch process may comprise a reactive ion etch process. Portions of the first dielectric liner 23 and the third dielectric liner 27 may or may not be collaterally recessed during the etch process that removes physically exposed portions of the second dielectric liner 24 and the fourth dielectric liner 28. Generally, the protrusion profile of the dielectric pedestal structure 83 depends on details of preceding processes, such the processing steps described with reference to FIG. 20. The height of the vertical protrusion portion 83P of each dielectric pedestal structure 83 may relatively large or relatively small to appear as a bump, or may even comprise a dent instead of a protrusion. Further, the lateral extent of the lateral protrusion portion 85P at the bottom of each void 85' may have a contoured vertical cross-sectional profile such that annular concave surfaces of the second dielectric liner 24 and annular concave surfaces of the fourth dielectric liner 28 are physically exposed around lateral protrusion portions 85P of the voids 85'. Generally, the lateral extent of the lateral protrusion portions 85P of the voids 85' can be controlled to avoid physically exposing adjacent sacrificial material layers (142, 242).

Figure 26:
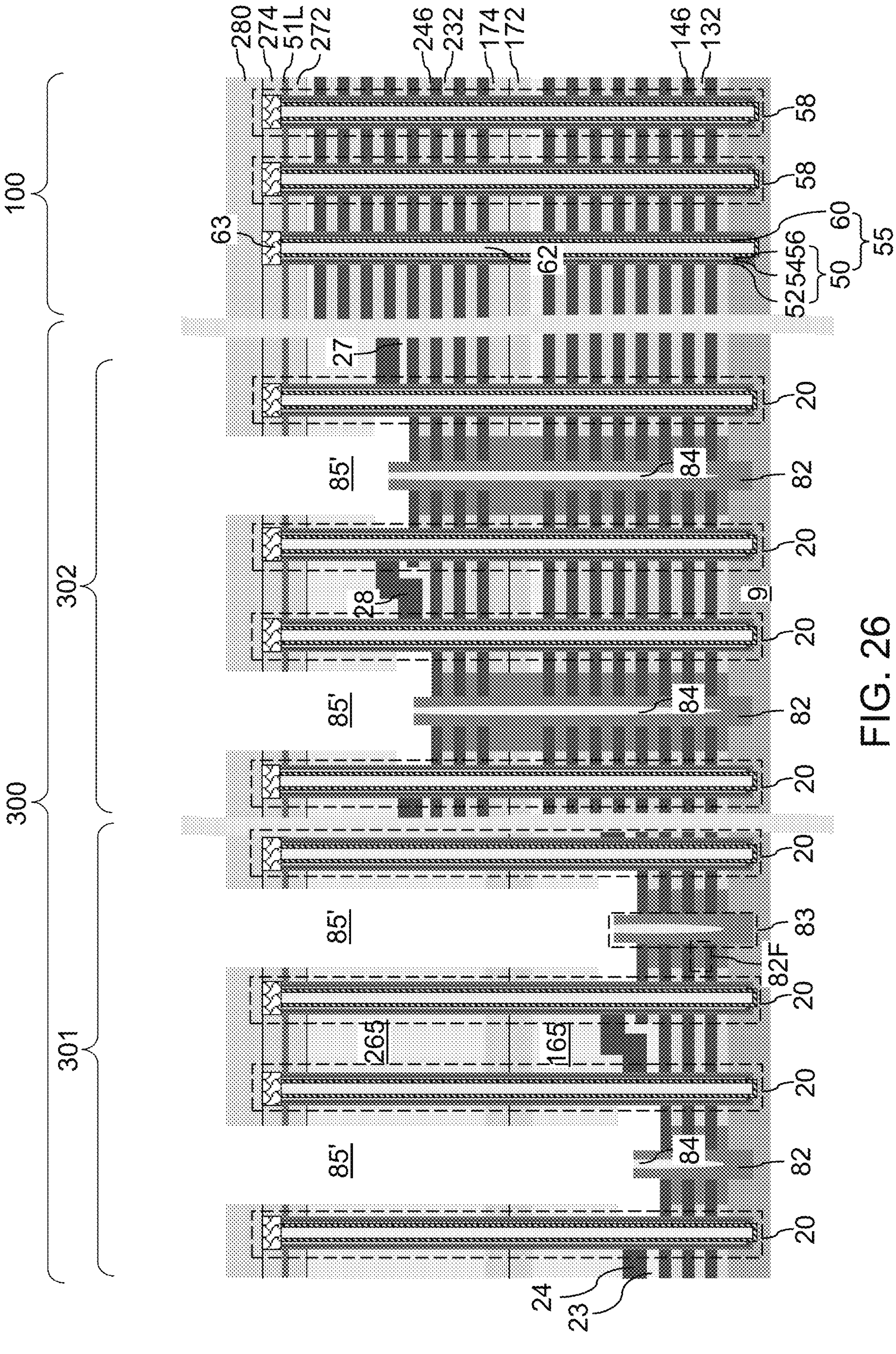
FIG. 26 is a vertical cross-sectional view of the first exemplary structure after isotropically recessing the first dielectric liner and the third dielectric liner according to the first embodiment of the present disclosure.

Referring to FIG. 26, another etch process is performed to recess a lower dielectric liner (23, 27) within each of the at least one dielectric liner (23, 24, 27, 28). For example, proximal portions of the first dielectric liner 23 and the third dielectric liner 27 adjacent to the voids 85' can be removed selective to the materials of the insulating layers (132, 232) and the electrically conductive layers (146, 246). The etch process may comprise an anisotropic etch process or an isotropic etch process. In an illustrative example, the first dielectric liner 23 and the third dielectric liner 27 may comprise silicon oxide, the etch process may comprise an anisotropic etch process that etches the materials of the first dielectric liner 23 and the third dielectric liner 27 (and the material of backside blocking dielectric layers, if employed) selective to the material of the electrically conductive layers (146, 246). Remaining portions of the at least one dielectric liner (23, 24, 27, 28) can be interposed between the at least one retro-stepped dielectric material portion (165, 265) and the stepped surfaces (301, 302) of the alternating stack {(132, 146), (232, 246)}.

If the backside blocking dielectric is formed in the backside recesses, then the backside blocking dielectric is also removed during etch process to expose top surfaces of the electrically conductive layers (146, 246) in the voids 85'.

Figure 27:
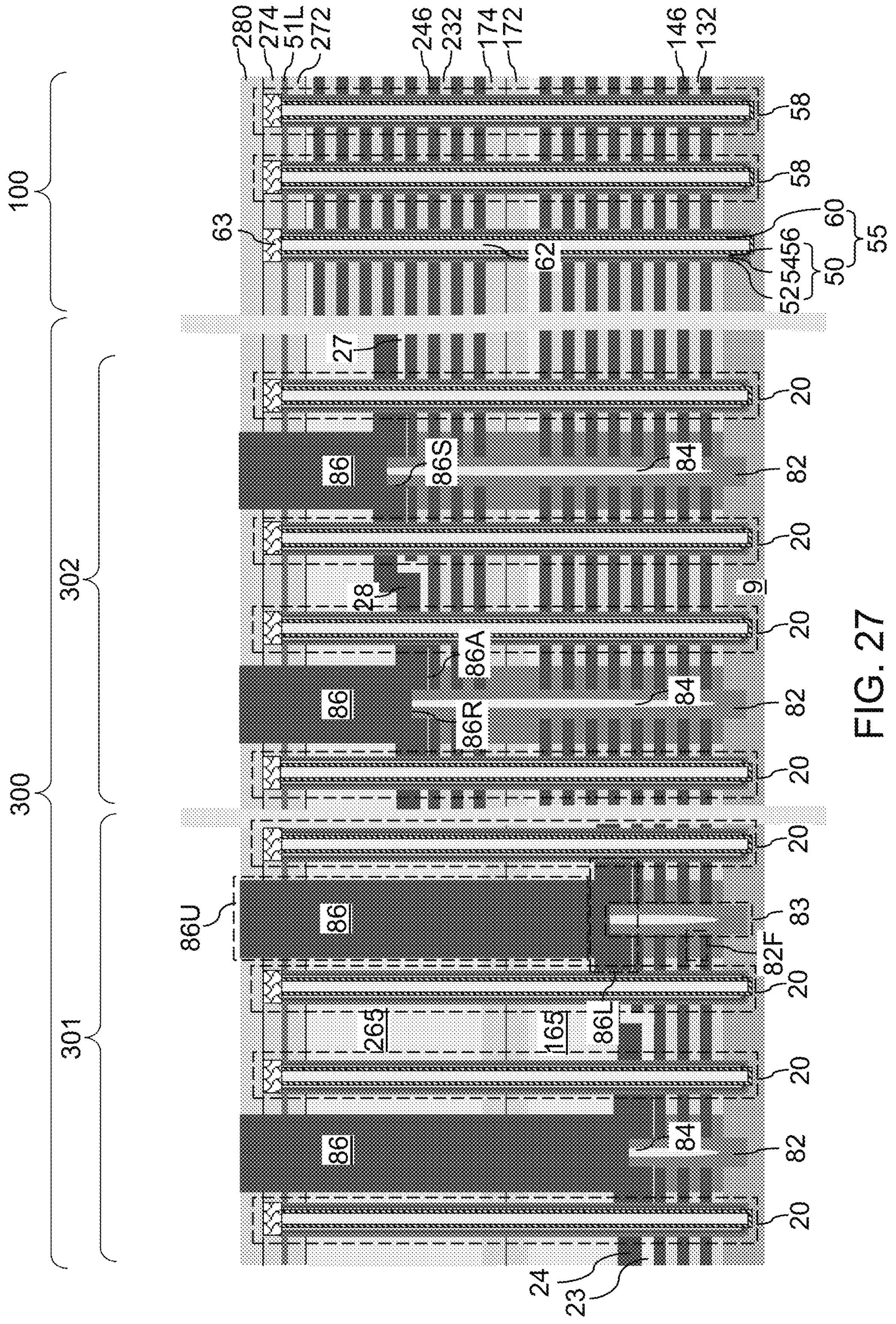
FIG. 27 is a vertical cross-sectional view of the first exemplary structure after formation of layer contact via structures according to the first embodiment of the present disclosure.

Referring to FIG. 27, at least one conductive material, such as at least one metallic material, can be deposited in the voids 85' within the laterally-expanded contact cavities 85 and over the contact-level dielectric layer 280. The at least one conductive material may comprise a metallic barrier material and a metallic fill material. The metallic barrier material may comprise a conductive metallic nitride material such as TiN, TaN, WN, MON, or a combination thereof. The metallic fill material may comprise W, Co, Ru, Mo, Cu, or a combination thereof. Excess portions of the at least one conductive material can be removed from above the horizontal plane including the top surface of the contact-level dielectric layer 280. Each remaining portion of the at least one conductive material filling a respective void 85' within the laterally-expanded contact cavities 85 constitutes a layer contact via structure 86.

The layer contact via structures 86 are formed in upper portions of the laterally-expanded contact cavities 85. The layer contact via structures 86 vertically extend through the at least one retro-stepped dielectric material portion (165, 265), and contact a top surface segment of a respective one of the electrically conductive layers (146, 246). In one embodiment, each of the layer contact via structures 86 comprises a respective annular bottom surface contacting an annular top surface segment of the respective one of the electrically conductive layers (146, 246).

Each of the layer contact via structures 86 overlies and contacts a respective one of the finned dielectric pillar structures (82, 84). Each of the layer contact via structures 86 may comprise a stepped bottom surface including a raised bottom surface 86R at a center portion and an annular bottom surface 86A at a peripheral portion. An underlying finned dielectric pillar structure (82, 84) may protrude through a hole in the annular bottom surface 86A and contact the raised bottom surface 86R of the layer contact via structure 86. In one embodiment, each of the layer contact via structures 86 comprises a respective raised bottom surface 86R contacting a top surface segment of the respective one of the finned dielectric pillar structures (82, 84) and located above a horizontal plane including the respective annular bottom surface 86A. In one embodiment, each of the layer contact via structures 86 comprises an inner cylindrical sidewall 86S contacting an upper portion of a cylindrical sidewall of the respective one of the finned dielectric pillar structures (82, 84). The inner cylindrical sidewall 86S may connect a periphery of the raised bottom surface 86R and an inner periphery of the annular bottom surface 86A of the layer contact via structure 86.

In one embodiment, one, a plurality or each of the layer contact via structures 86 comprises: an upper cylindrical portion 86U contacting the at least one retro-stepped dielectric material portion (165, 265), and a lower pedestal portion 86L having a greater lateral extent than a bottom periphery of a cylindrical sidewall of the upper cylindrical portion 86U and comprising an annular top surface having an inner periphery that coincides with the bottom periphery of the cylindrical sidewall of the upper cylindrical portion 86U. In one embodiment, a horizontal surface of the at least one dielectric liner (23, 24, 27, 28) may be located within a same horizontal plane as the annular top surface of a respective one of the layer contact via structures 86.

Figure 28:
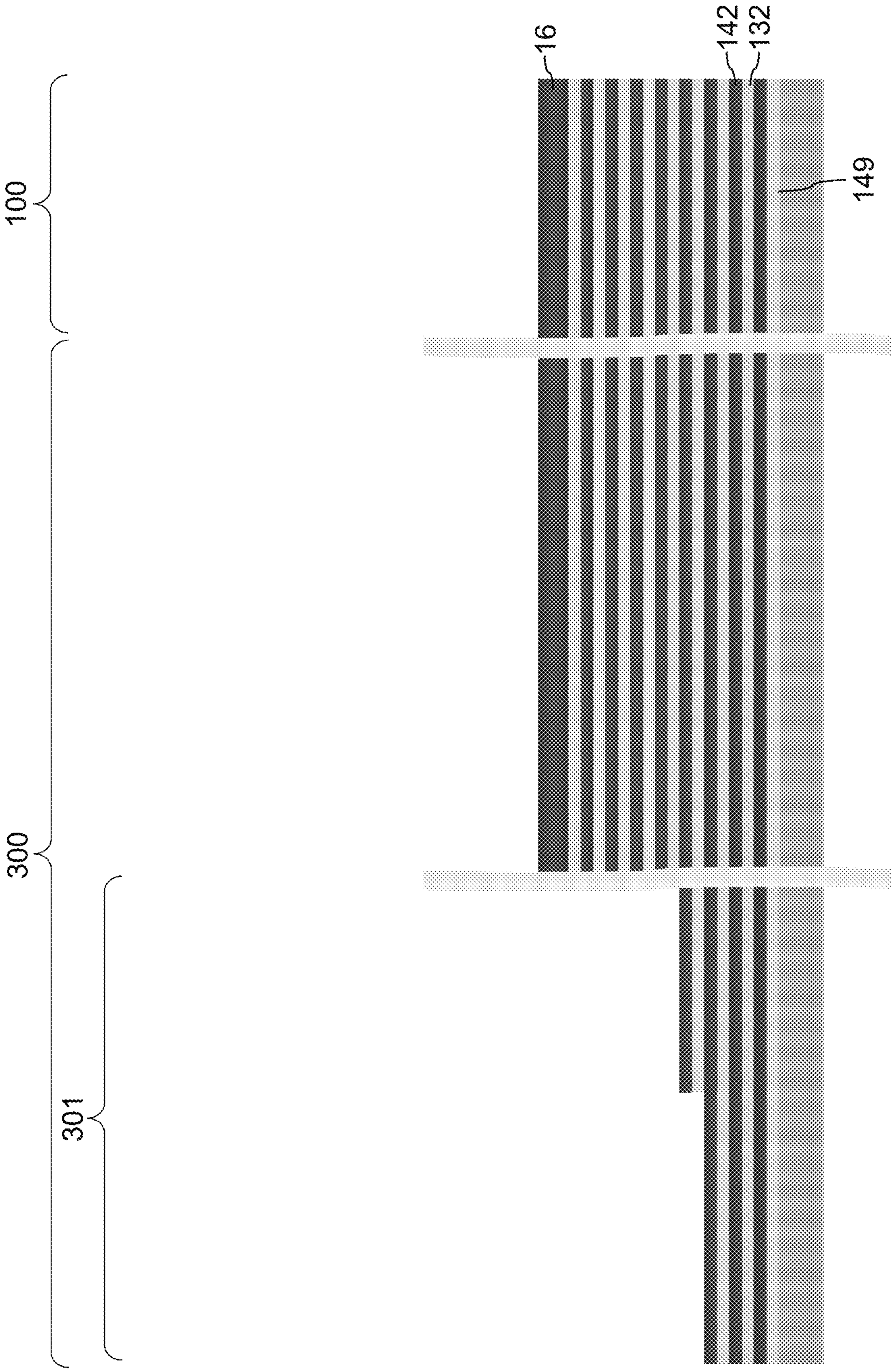
FIG. 28 is a vertical cross-sectional view of a second exemplary structure after formation and patterning of a first-tier alternating stack of first insulating layers and first sacrificial material layers and formation and patterning of a first-tier dielectric liner according to the second embodiment of the present disclosure.

In the second embodiment, the first through fourth dielectric liners (23, 24, 27, 28) of the first embodiment are omitted. Referring to FIG. 28, a second exemplary structure according to the second embodiment of the present disclosure may be derived from the first exemplary structure described with reference to FIG. 2 by forming a patterned stack of a topmost first insulating layer 132 and a hard mask layer 16 within the area located outside the first stepped surfaces 301. For example, the hard mask layer 16 may comprise a silicon nitride pad layer. A first stepped cavity is present over the first stepped surfaces 301.

Figure 29:
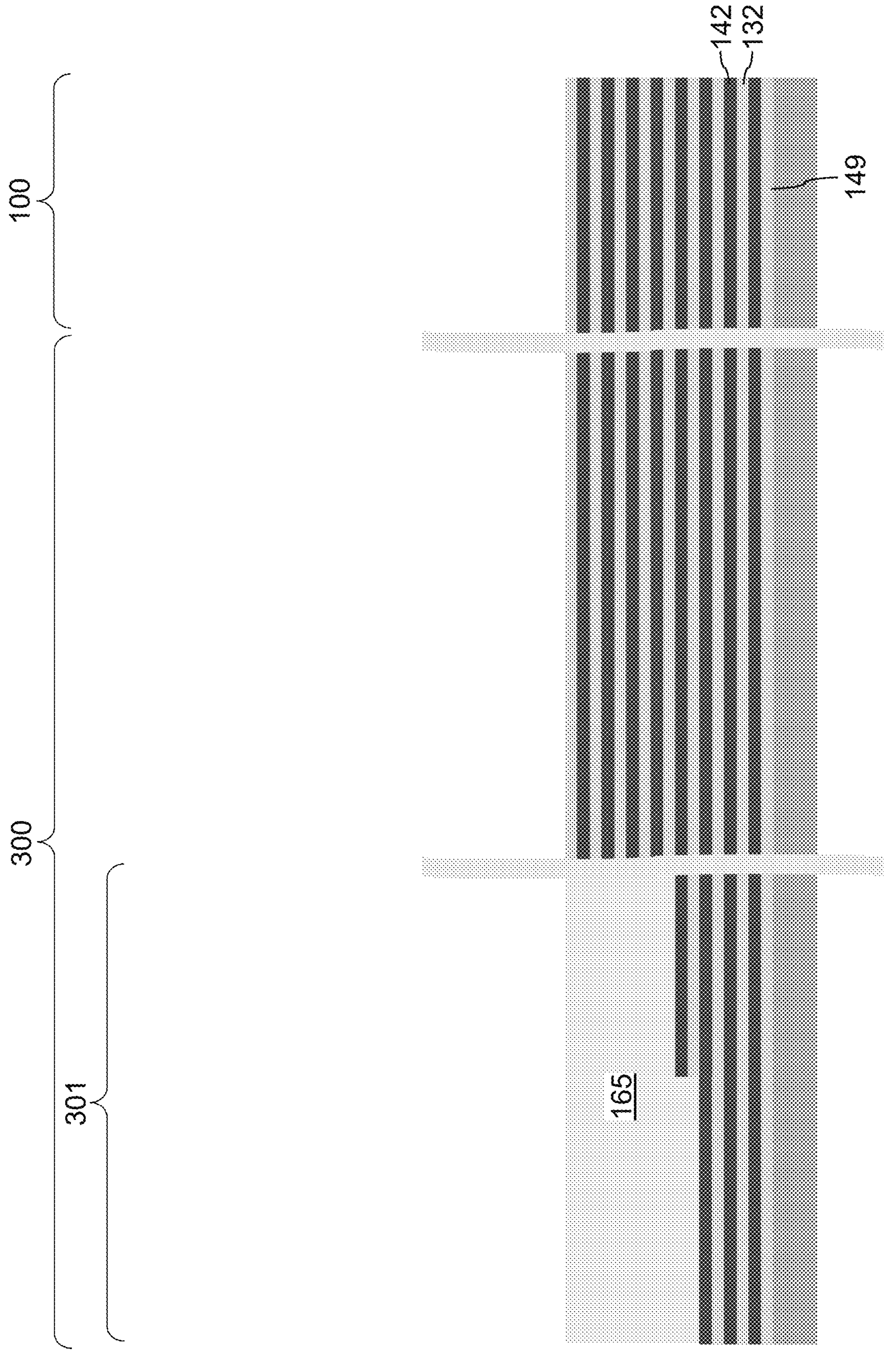
FIG. 29 is a vertical cross-sectional view of the second exemplary structure after formation of a first retro-stepped dielectric material portion according to the second embodiment of the present disclosure.

Referring to FIG. 29, a dielectric fill material (such as undoped silicate glass or doped silicate glass) can be deposited to fill the first stepped cavity. Excess portions of the dielectric fill material can be removed from above the horizontal plane including the top surface of the hard mask layer 16, for example, by performing a chemical mechanical polishing (CMP) process. A remaining portion of the dielectric fill material that fills the region overlying the first stepped surfaces 301 constitute a first retro-stepped dielectric material portion 165. A top surface of the first retro-stepped dielectric material portion 165 can be vertically recessed to a height at, or about, the bottom surface of the hard mask layer 16. The hard mask layer 16 can be subsequently removed selective to the topmost first insulating layer 132. For example, if the hard mask layer 16 comprises silicon nitride, a wet etch process employing hot phosphoric acid may be performed to remove the hard mask layer 16. The physically exposed top surface of the topmost first insulating layer 132 and the top surface of the first retro-stepped dielectric material portion 165 may be formed within a same horizontal plane.

Figure 30:
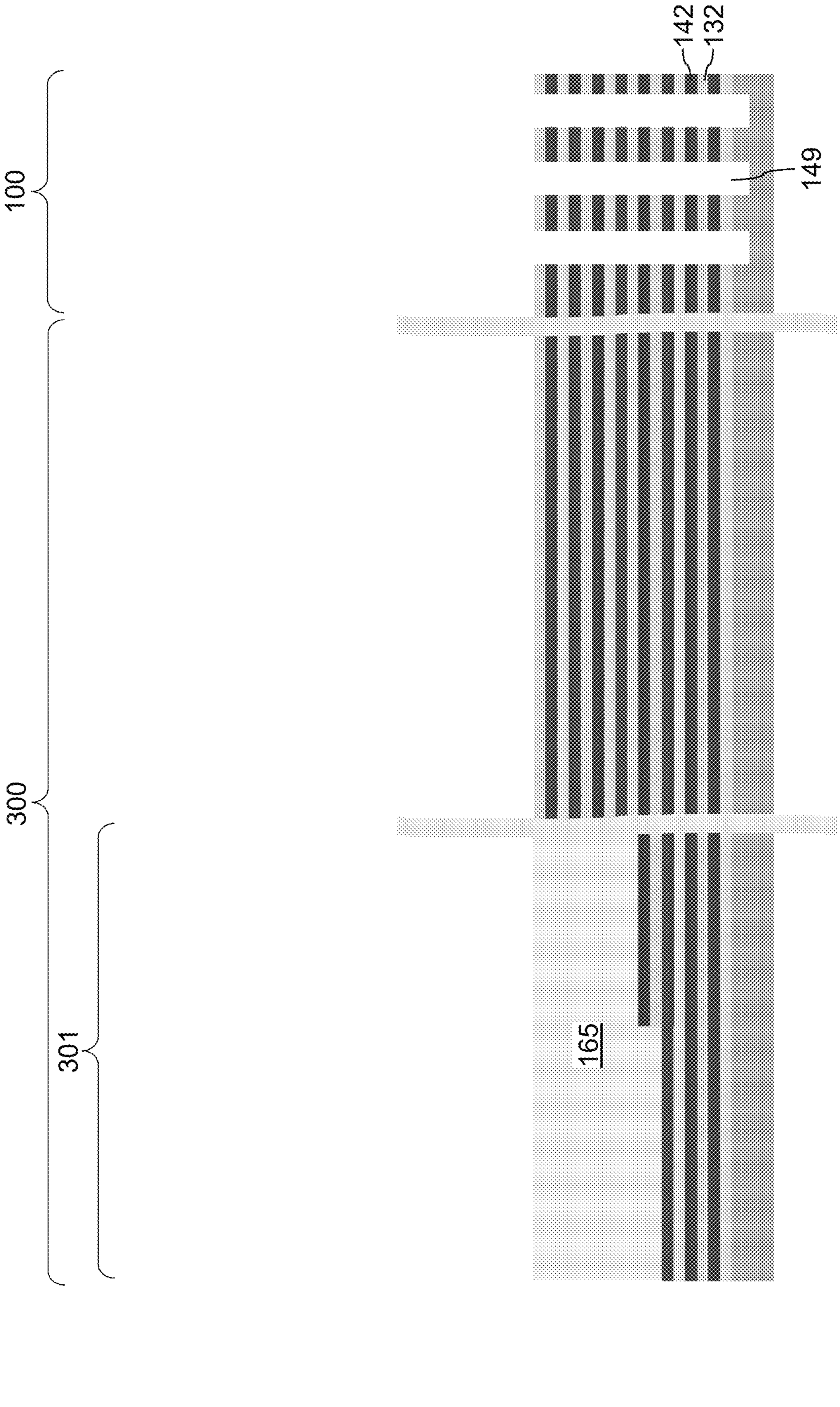
FIG. 30 is a vertical cross-sectional view of the second exemplary structure after formation of first-tier memory openings according to the second embodiment of the present disclosure.

Referring to FIG. 30, the processing steps described with reference to FIG. 5 can be performed to form a two-dimensional array of first-tier memory openings 149.

Figure 31:
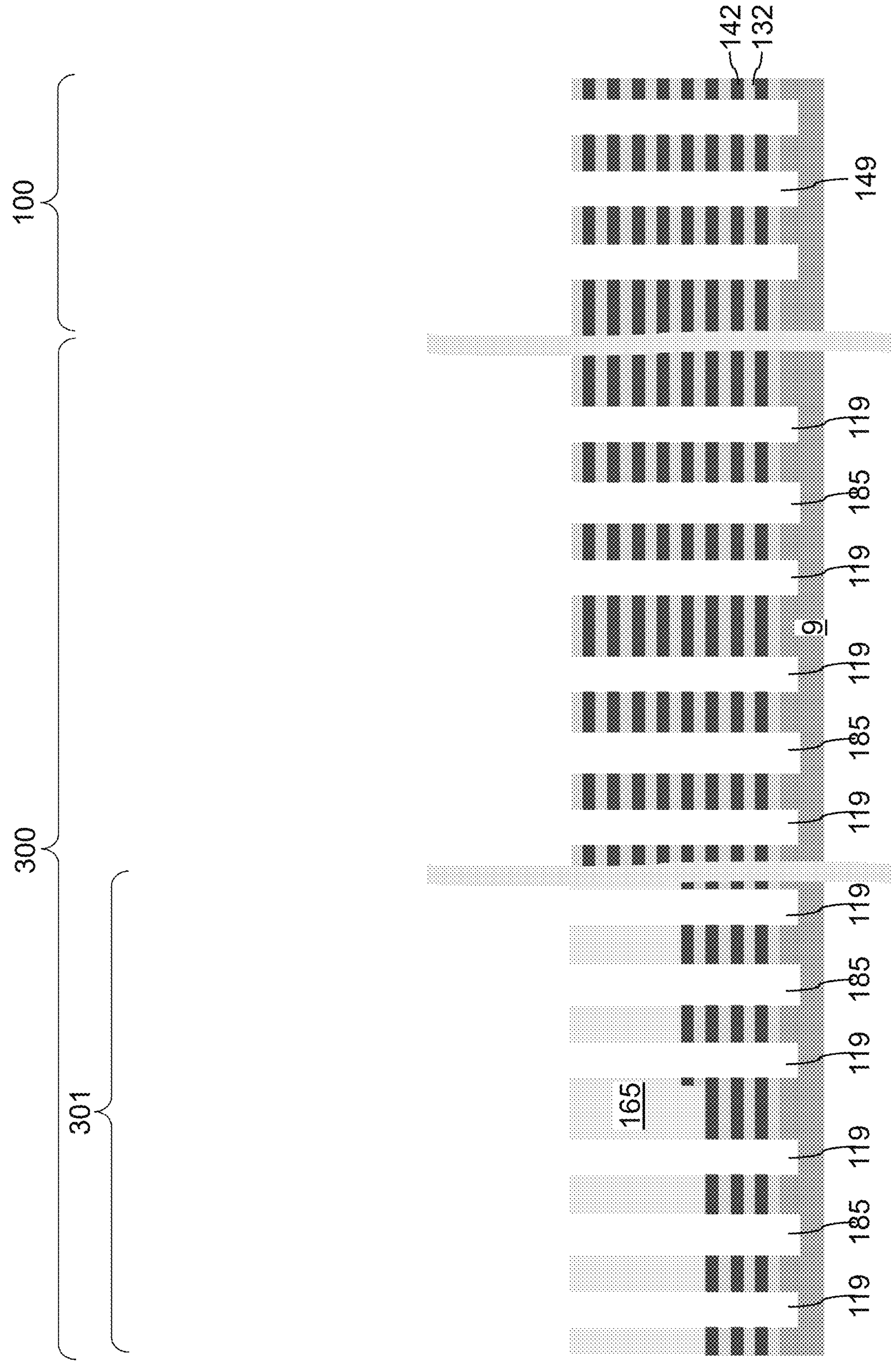
FIG. 31 is a vertical cross-sectional view of the second exemplary structure after formation of first-tier support openings and first-tier contact openings according to the second embodiment of the present disclosure.

Referring to FIG. 31, the processing steps described with reference to FIG. 6 can be performed to form first-tier support openings 119 and first-tier contact openings 185.

Figure 32:
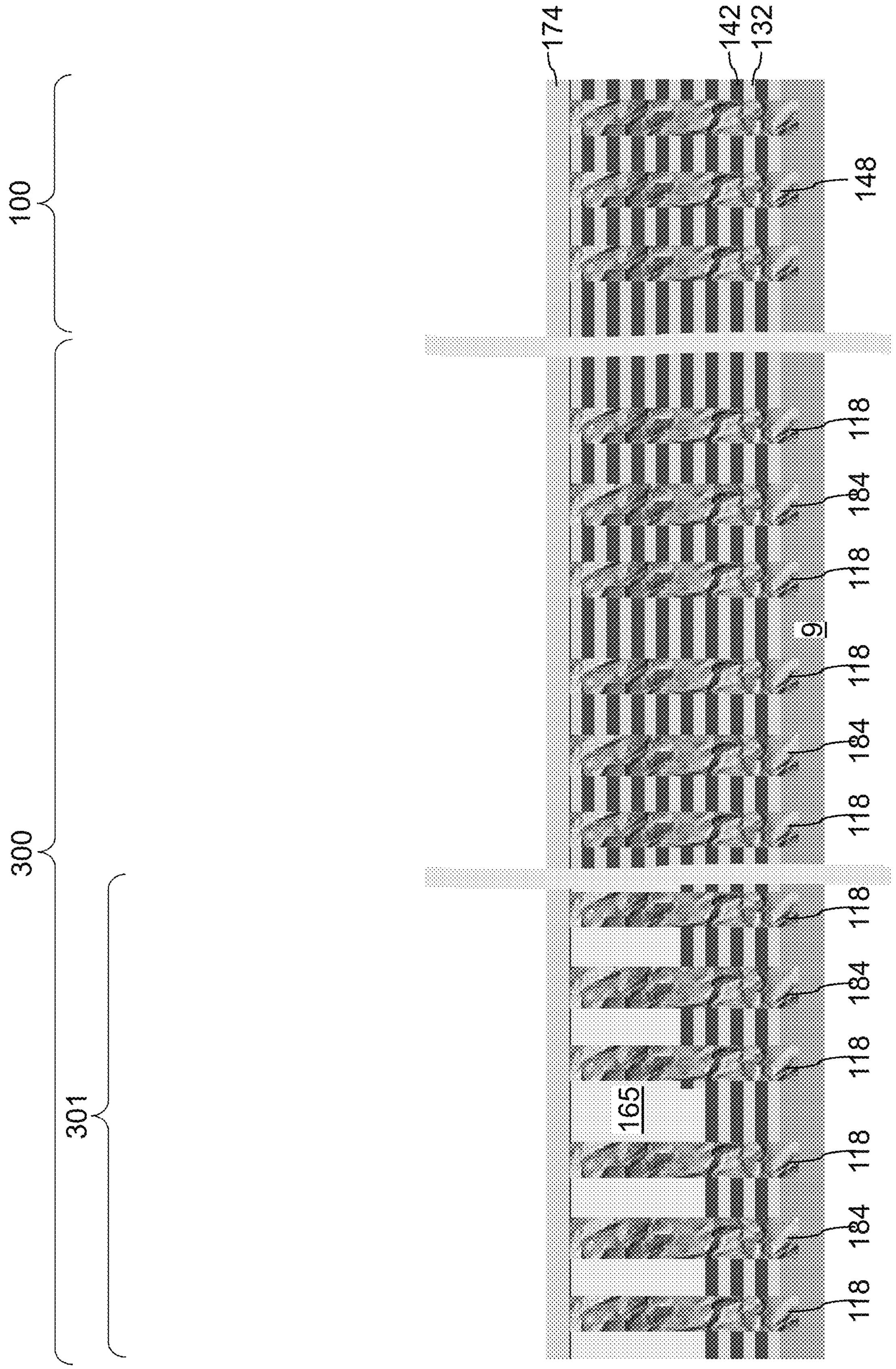
FIG. 32 is a vertical cross-sectional view of the second exemplary structure after formation of various first-tier opening fill structures and an inter-tier dielectric layer according to the second embodiment of the present disclosure.

Referring to FIG. 32, the processing steps described with reference to FIG. 7 can be performed to form various first-tier opening fill structures (148, 118, 184) in the various first-tier openings (149, 119, 185), and optionally to form an inter-tier dielectric layer 174.

Figure 33:
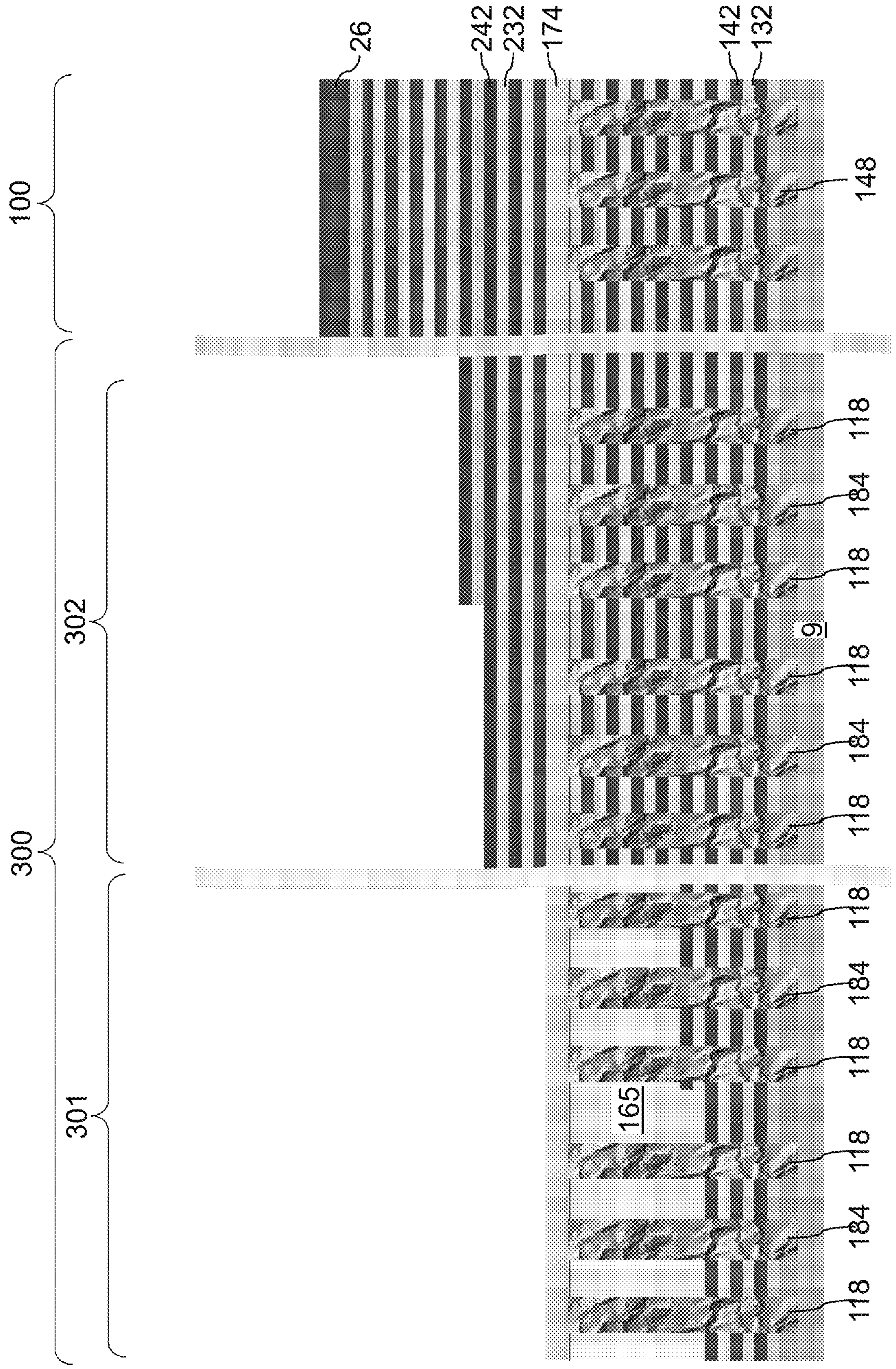
FIG. 33 is a vertical cross-sectional view of the second exemplary structure after formation and patterning of a second-tier alternating stack of second insulating layers and second sacrificial material layers and formation and patterning of a second-tier dielectric liner according to the second embodiment of the present disclosure.

Referring to FIG. 33, the processing steps described with reference to FIG. 8 can be performed to form a second alternating stack (232, 242) with second stepped surfaces. A topmost second insulating layer 232 and a hard mask layer 26 can be formed in the memory array region 100 outside the contact region 300.

Figure 34:
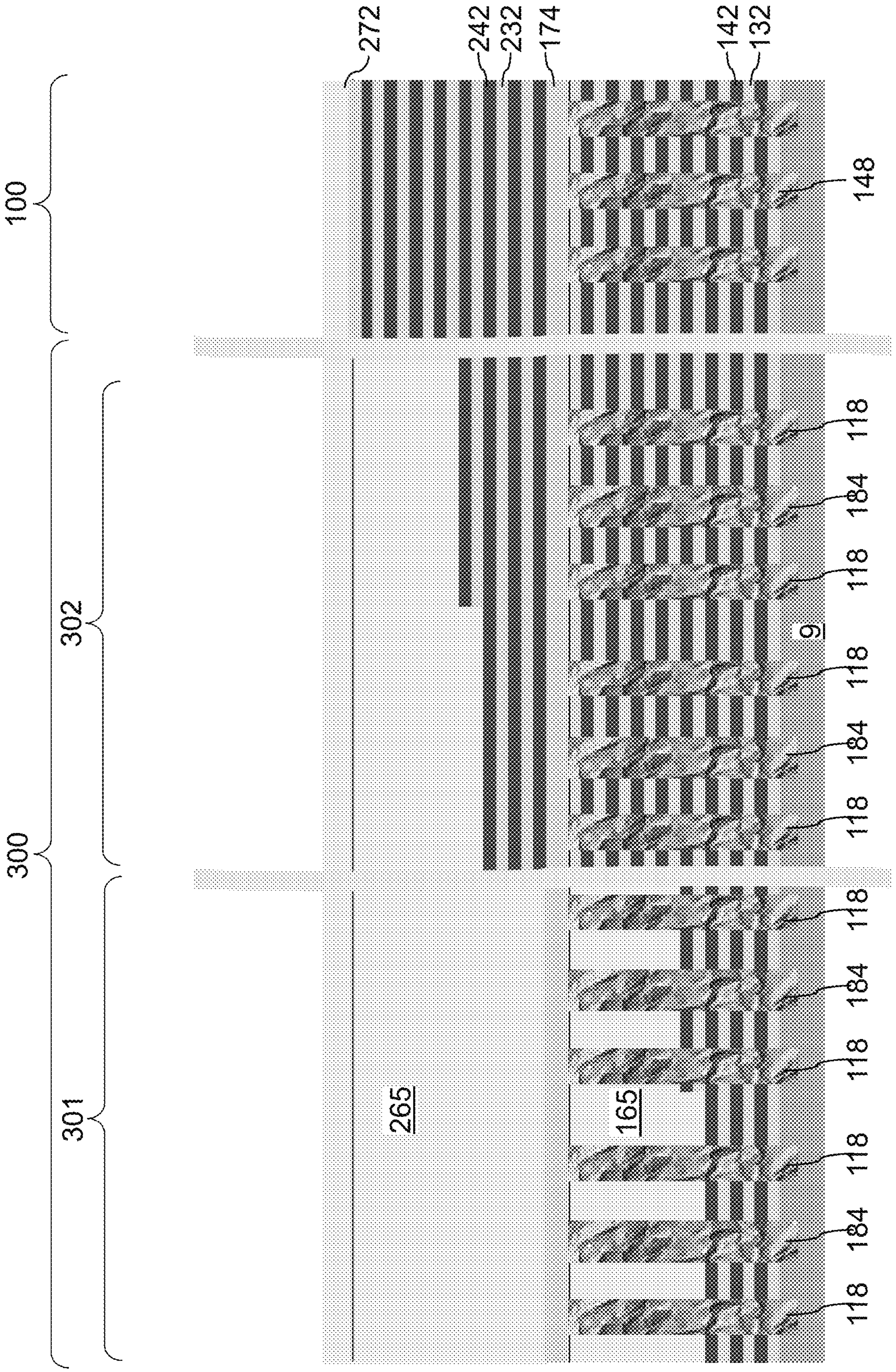
FIG. 34 is a vertical cross-sectional view of the second exemplary structure after formation of a second retro-stepped dielectric material portion and a second insulating cap layer according to the second embodiment of the present disclosure.

Referring to FIG. 34, the processing steps described with reference to FIG. 10 can be performed to form a second retro-stepped dielectric material portion 265. The hard mask layer 26 can be removed. An optional second insulating cap layer 272 can be formed over the second alternating stack (232, 242) and the second retro-stepped dielectric material portion 265.

Figure 35:
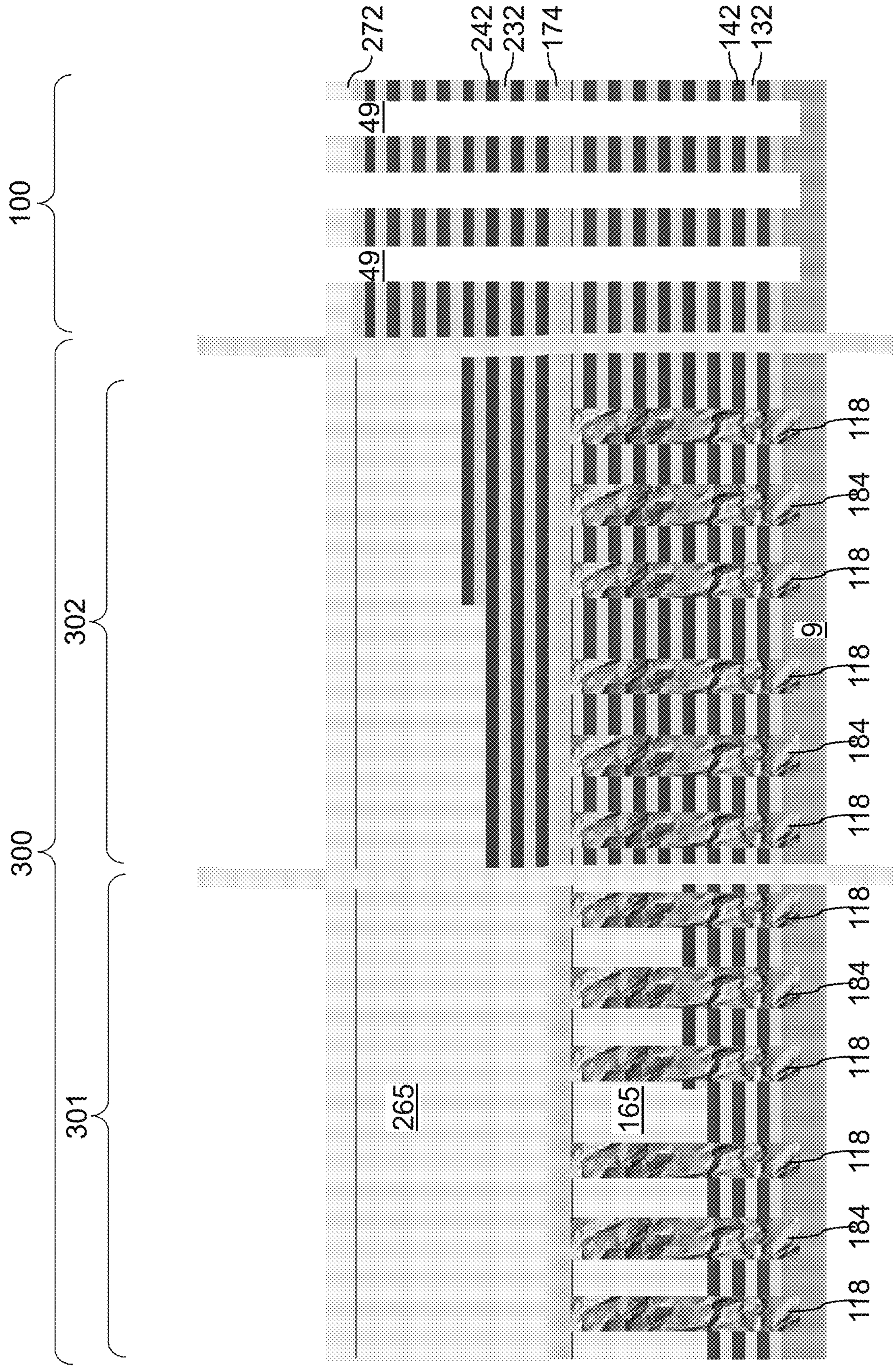
FIG. 35 is a vertical cross-sectional view of the second exemplary structure after formation of inter-tier memory openings according to the second embodiment of the present disclosure.

Referring to FIG. 35, the processing steps described with reference to FIG. 11 can be performed to form memory openings 49 through the first-tier alternating stack (132, 142) and the second-tier alternating stack (232, 242).

Figure 36:
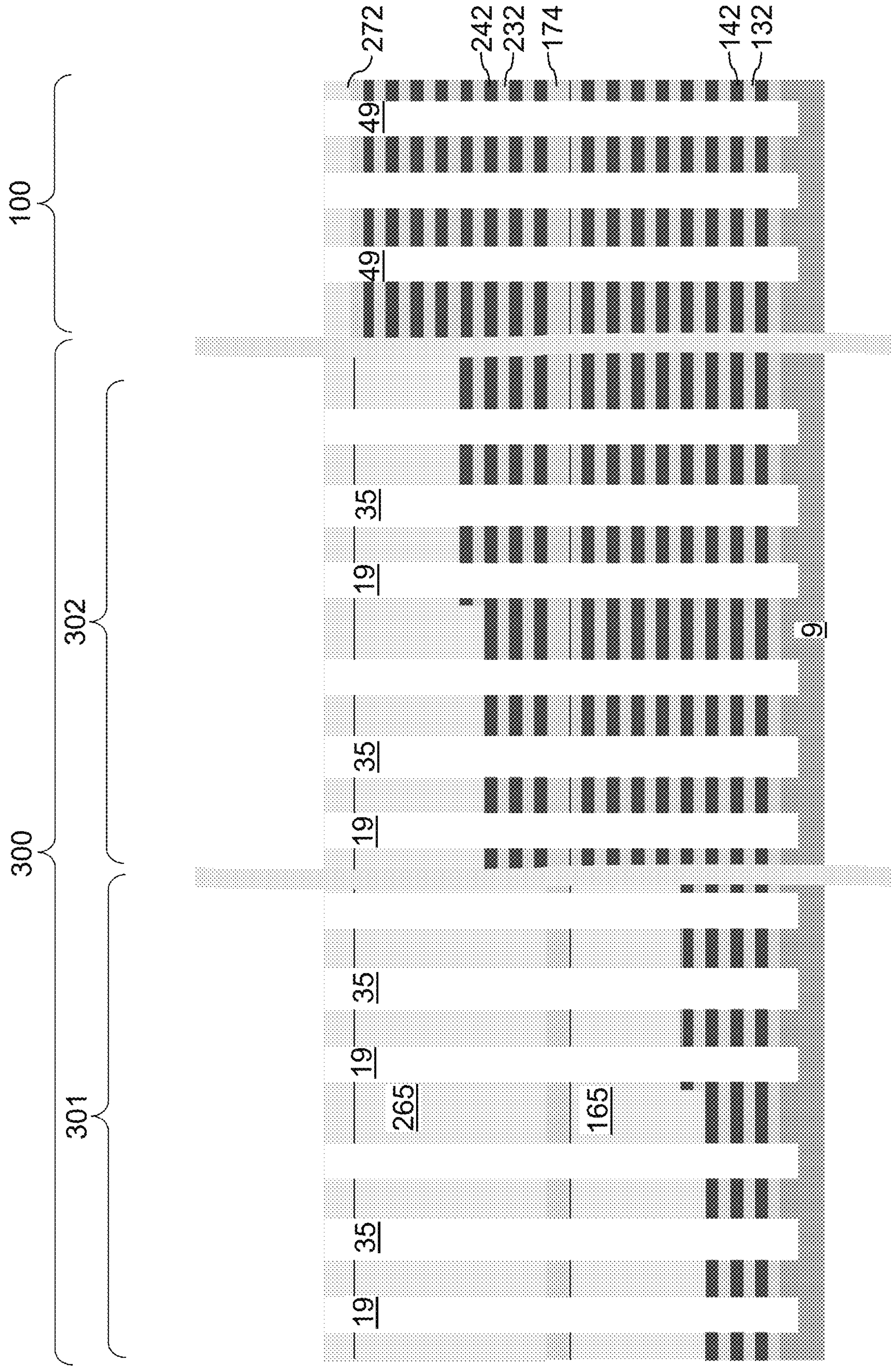
FIG. 36 is a vertical cross-sectional view of the second exemplary structure after formation of inter-tier support openings and inter-tier contact openings according to the second embodiment of the present disclosure.

Referring to FIG. 36, the processing steps described with reference to FIG. 12 can be performed to form support openings 19 and the contact openings 35.

Figure 37:
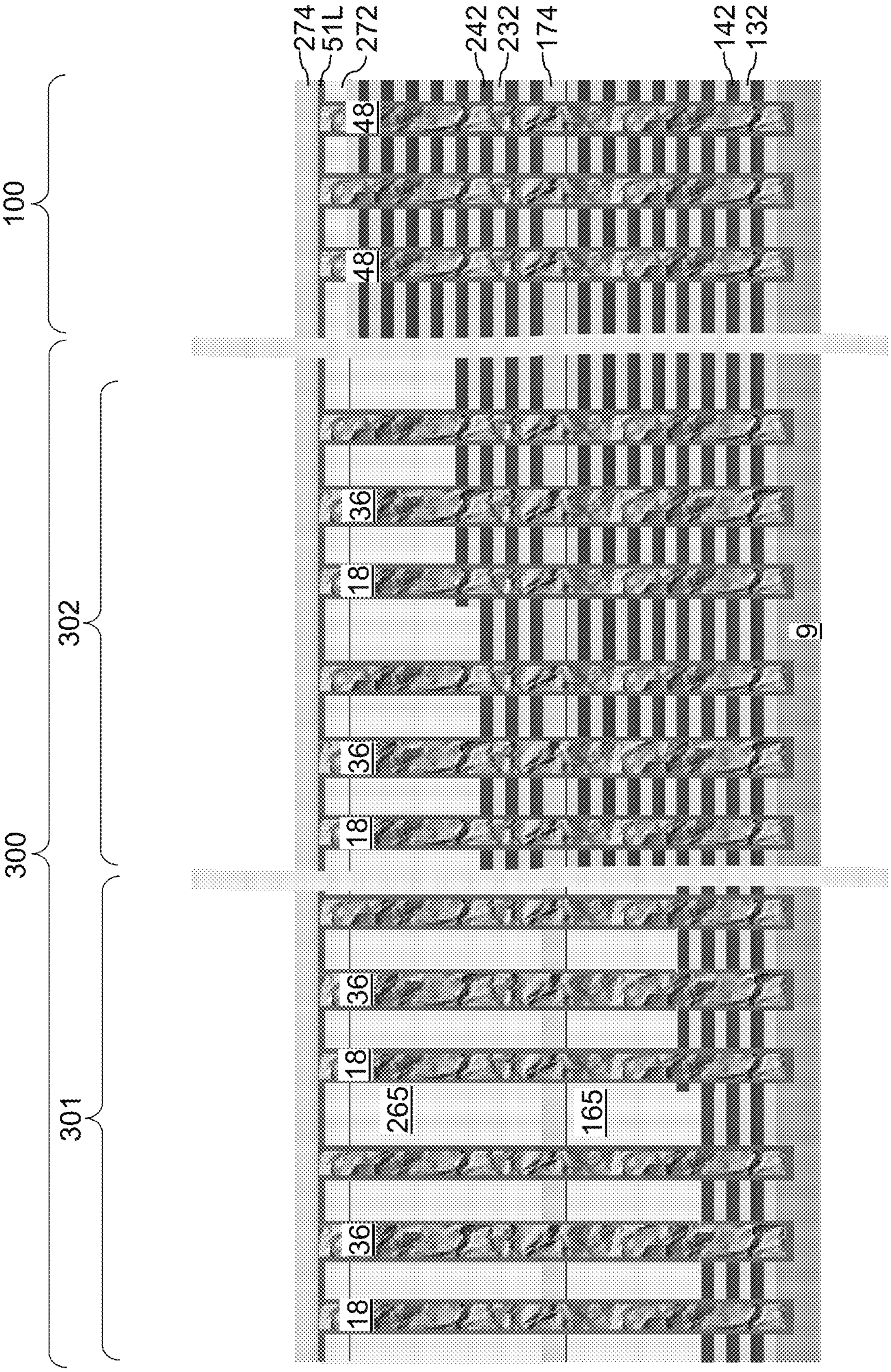
FIG. 37 is a vertical cross-sectional view of the second exemplary structure after formation of a dielectric liner layer, sacrificial opening fill structures, and a dielectric capping layer according to the second embodiment of the present disclosure.

Referring to FIG. 37, the processing steps described with reference to FIG. 13 can be performed to form a dielectric liner layer 51L, and to form sacrificial opening fill structures (48, 18, 36) in the various openings (49, 19, 85) through the alternating stacks {(132, 142), (232, 242)}. An optional dielectric capping layer 274 may be formed above the dielectric liner layer 51L and the sacrificial opening fill structures (48, 18, 36).

Figure 38:
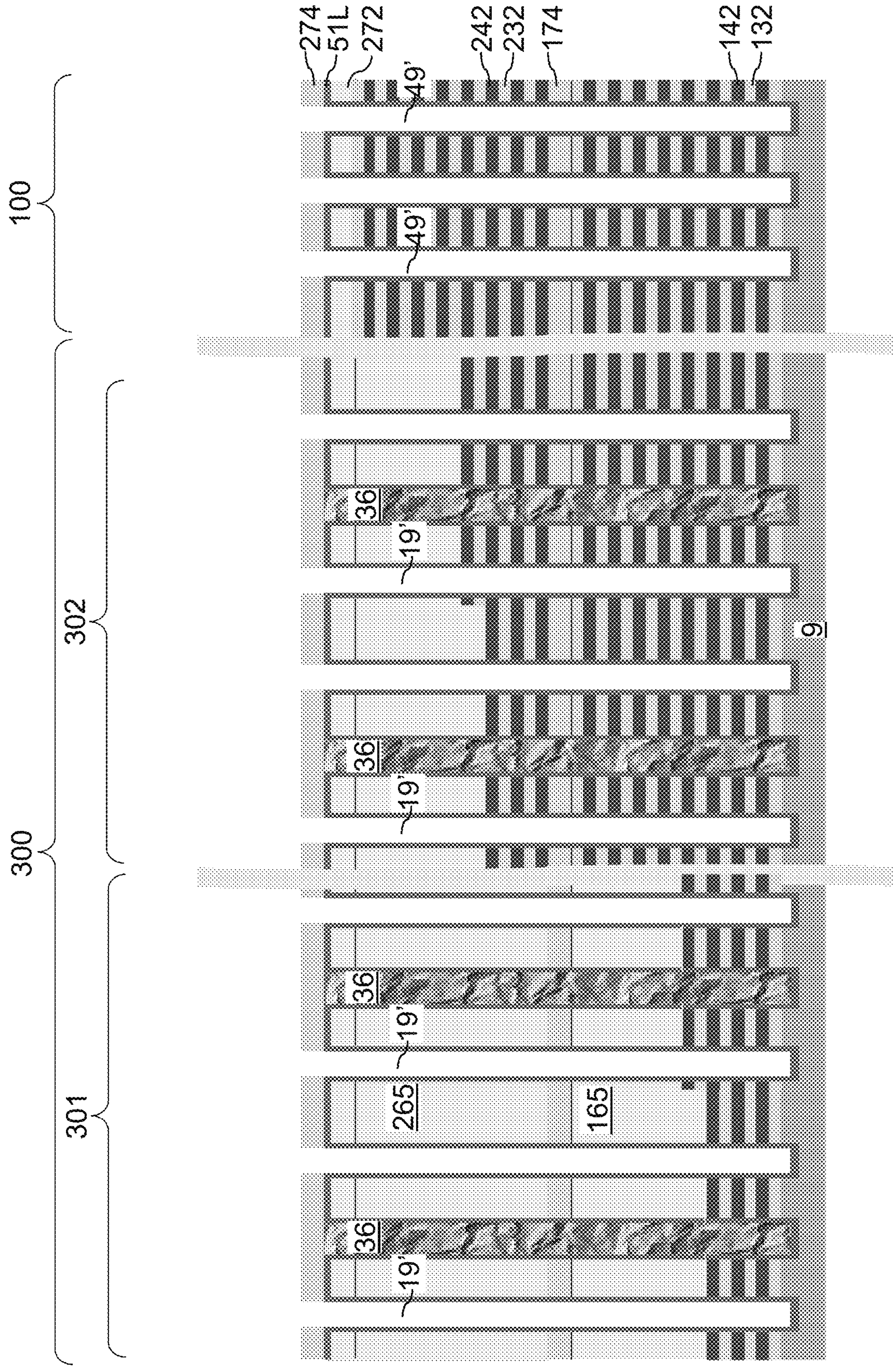
FIG. 38 is a vertical cross-sectional view of the second exemplary structure after formation of memory cavities and support cavities according to the second embodiment of the present disclosure.

Referring to FIG. 38, the processing steps described with reference to FIG. 14 can be performed to form memory cavities 49' and support cavities 19'.

Figure 39:
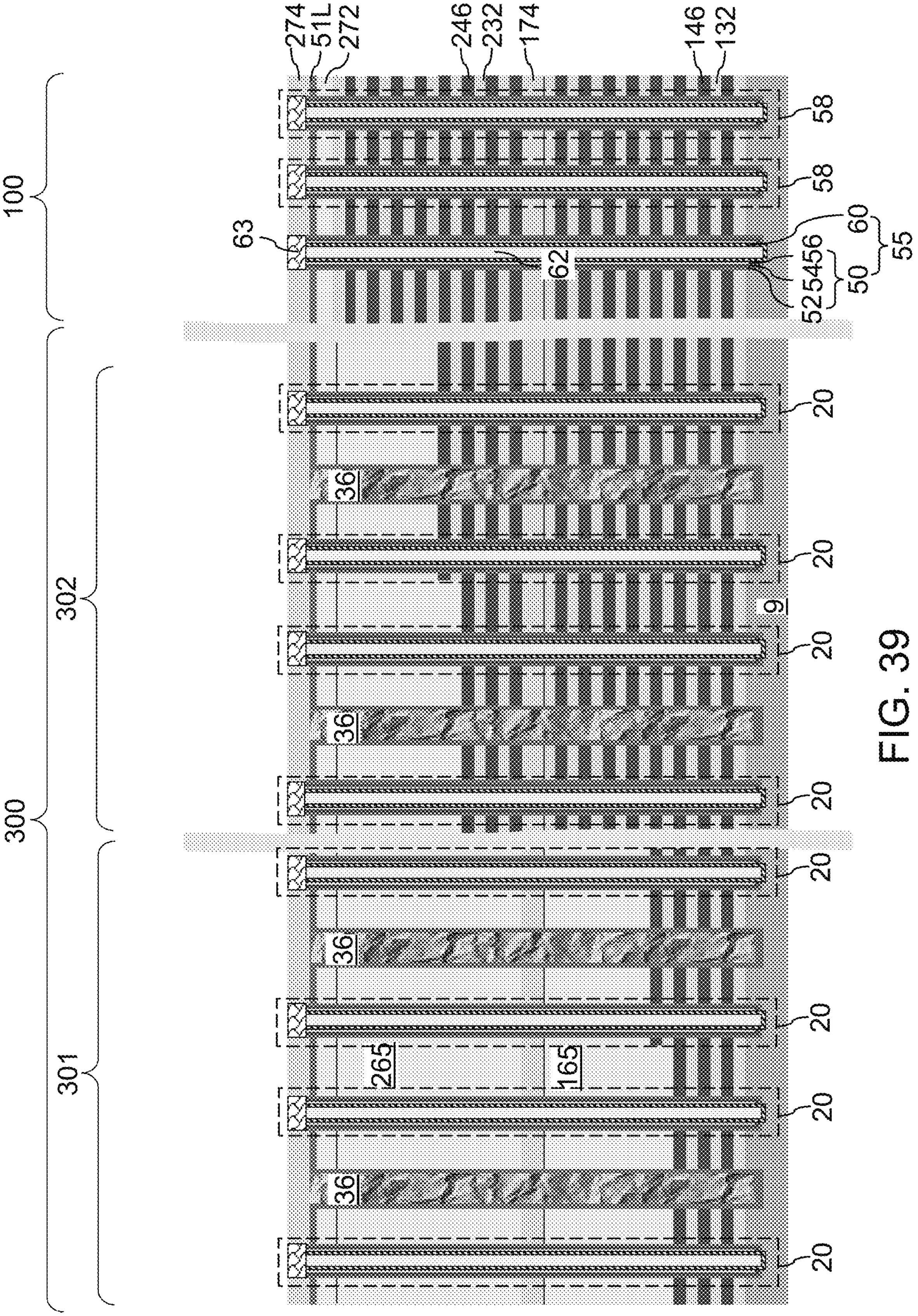
FIG. 39 is a vertical cross-sectional view of the second exemplary structure after formation of memory opening fill structures and support pillar structures according to the second embodiment of the present disclosure.

Referring to FIG. 39, the processing steps described with reference to FIG. 15 can be performed to form memory opening fill structures 58 and support pillar structures 20 in the memory openings 49 and in the support openings 19, respectively.

Figure 40:
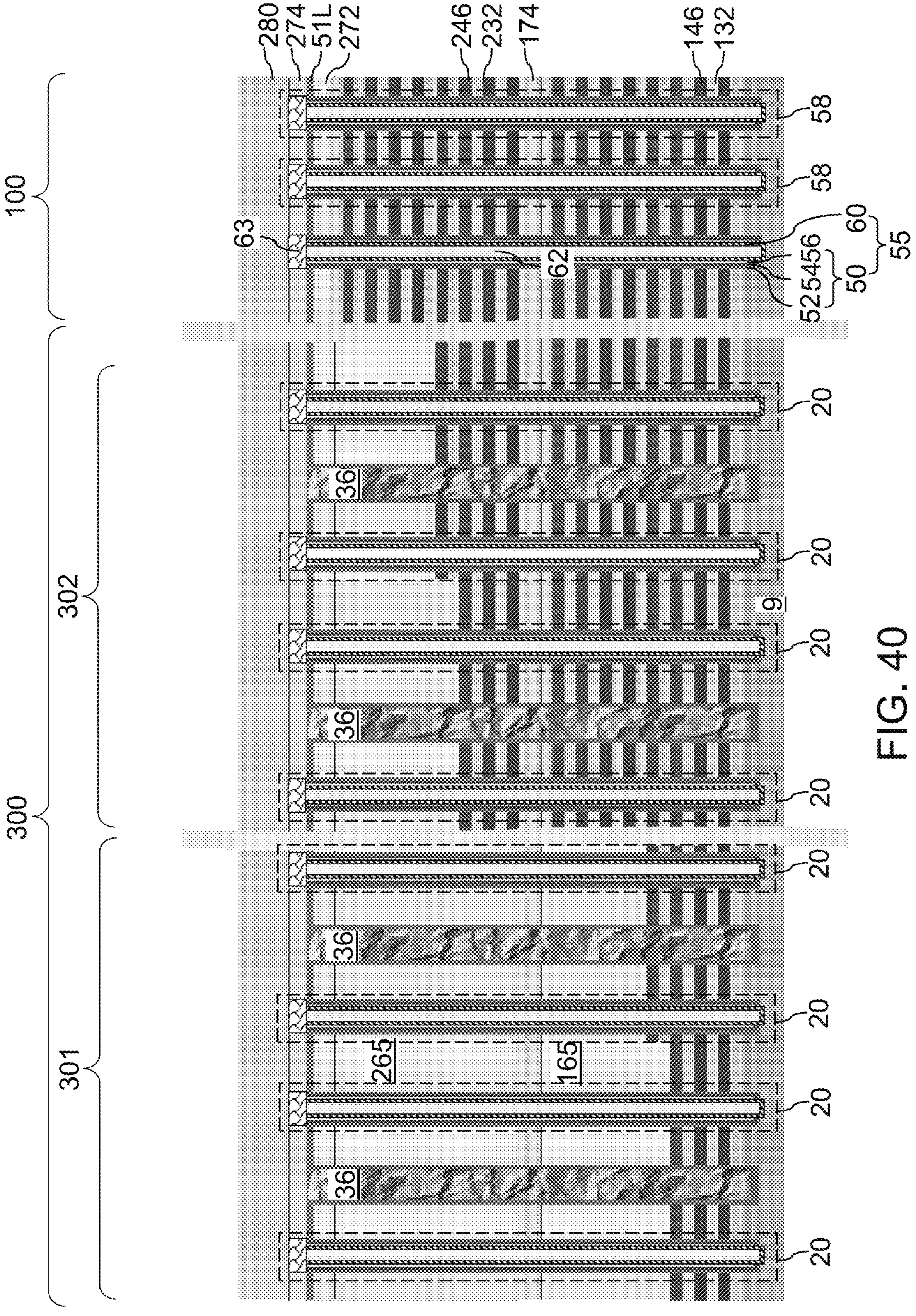
FIG. 40 is a vertical cross-sectional view of the second exemplary structure after formation of a contact-level dielectric layer according to the second embodiment of the present disclosure.

Referring to FIG. 40, the processing steps described with reference to FIG. 16 can be performed to form a contact-level dielectric layer 280.

Figure 17B:
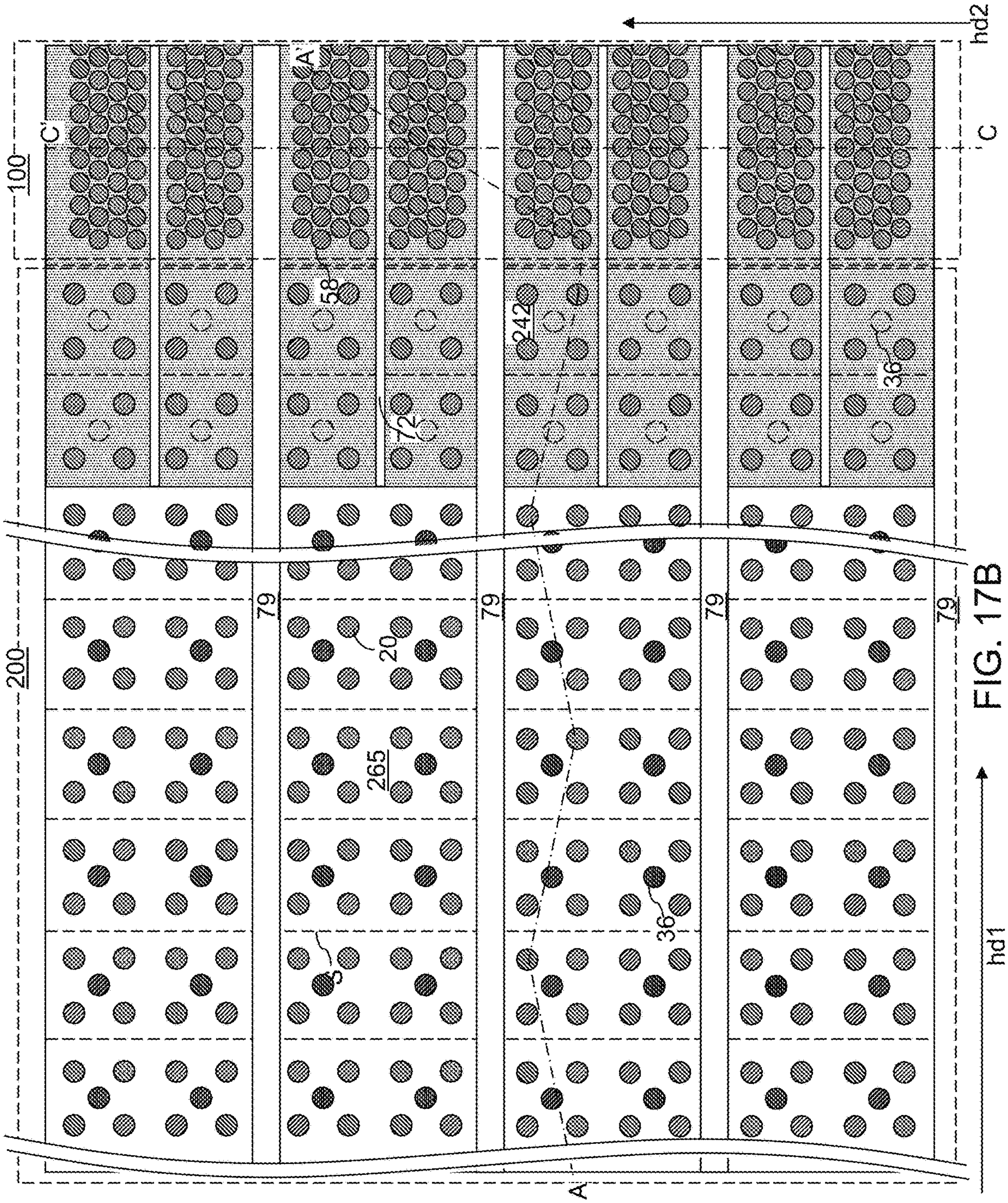
FIG. 17B is a horizontal cross-sectional view of the first exemplary structure along the horizontal plane B-B' of FIG. 17A.
Figure 17C:
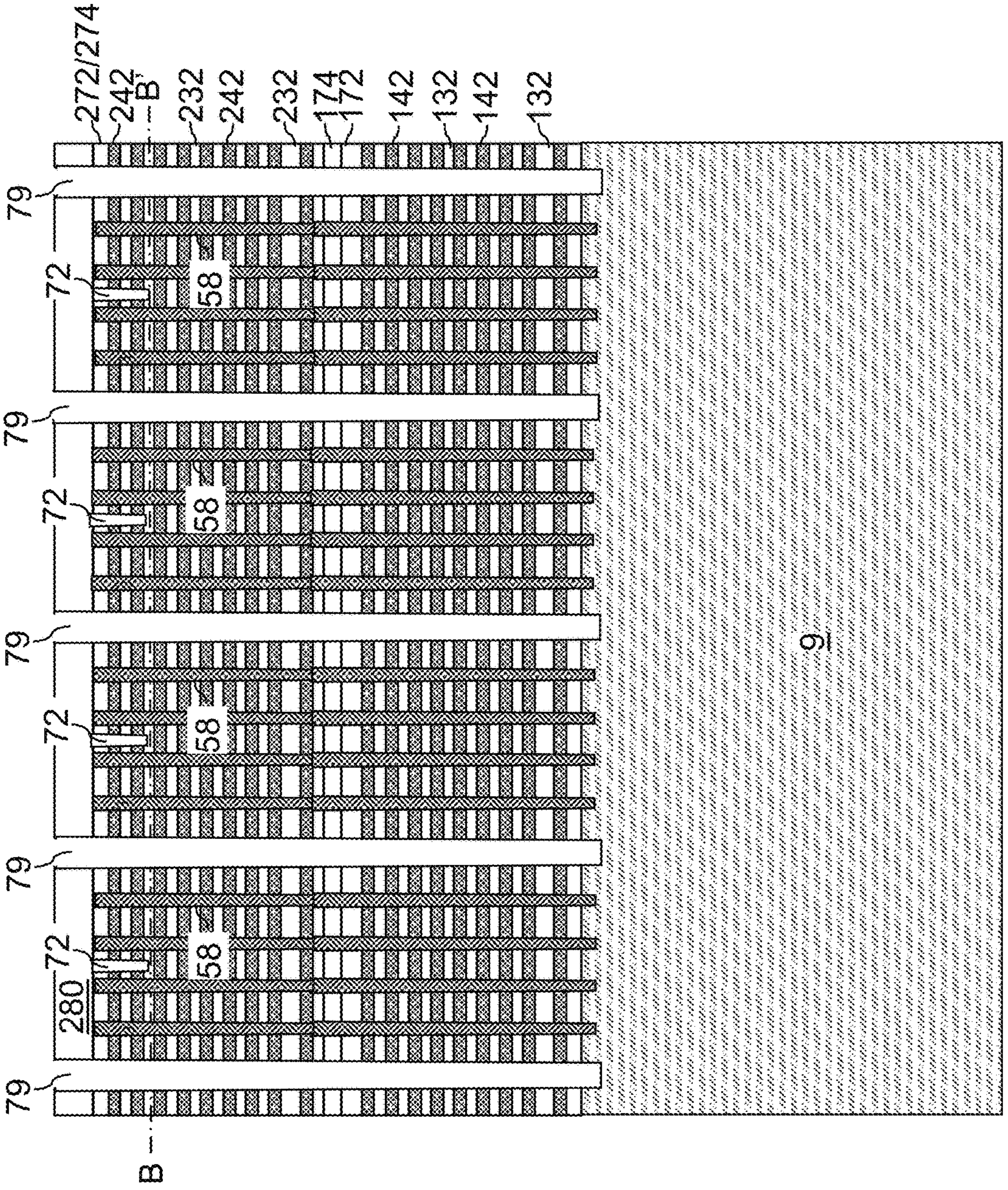
FIG. 17C is a vertical cross-sectional view of the first exemplary structure along the vertical plane C-C' of FIG. 17B.
Figure 41:
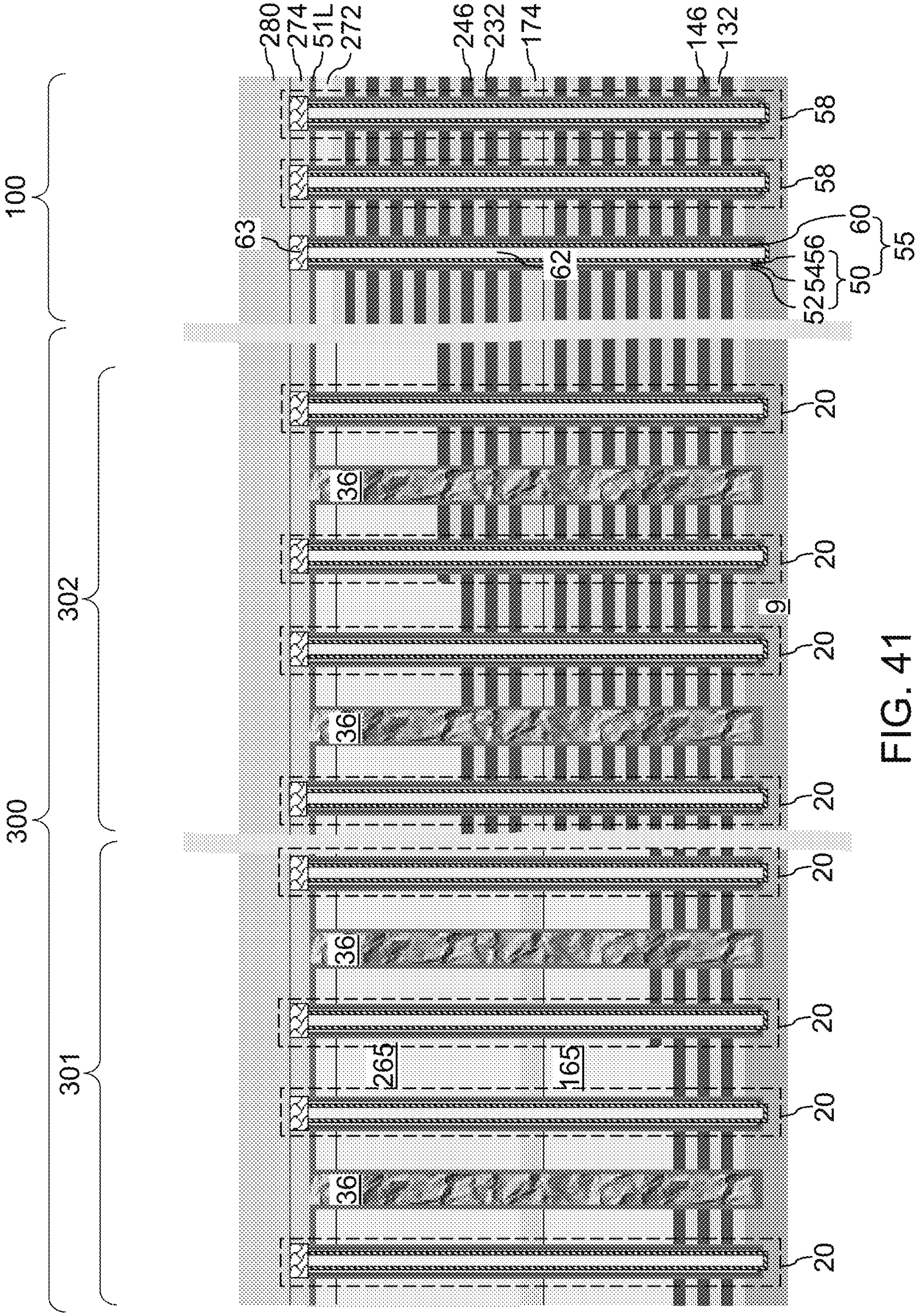
FIG. 41 is a vertical cross-sectional view of the second exemplary structure after replacement of the sacrificial material layers with electrically conductive layers according to the second embodiment of the present disclosure.

Referring to FIG. 41, the processing steps described with reference to FIGS. 17A-17C can be performed to replace the sacrificial material layers (142, 242) with electrically conductive layers (146, 246).

Figure 42:
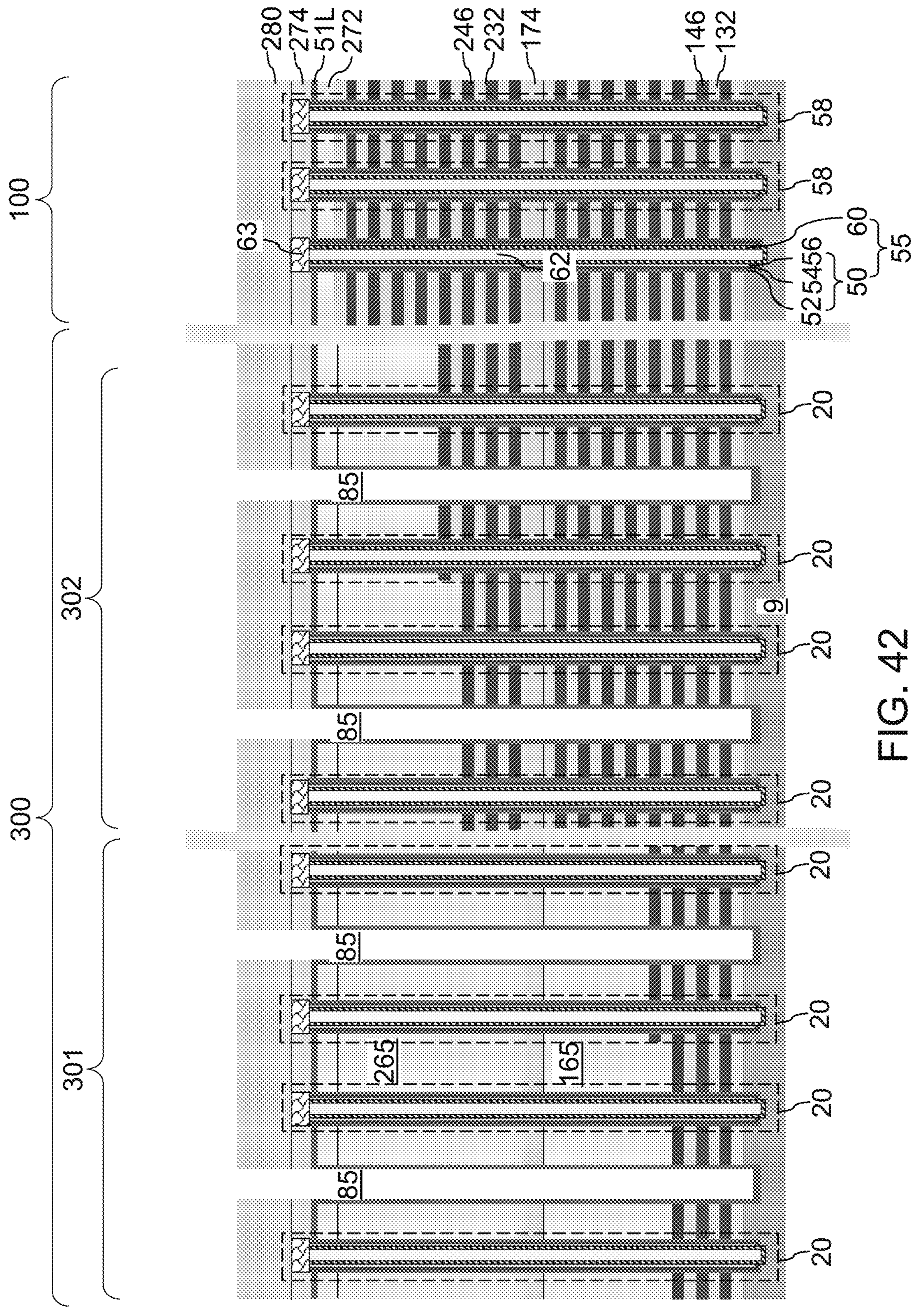
FIG. 42 is a vertical cross-sectional view of the second exemplary structure after formation of contact cavities by removal of sacrificial contact opening fill structures according to the second embodiment of the present disclosure.

Referring to FIG. 42, the processing steps described with reference to FIG. 19 can be performed to form contact cavities 85. The contact cavities 85 are formed in volumes from which the sacrificial contact opening fill structures 36 are removed.

Figure 43:
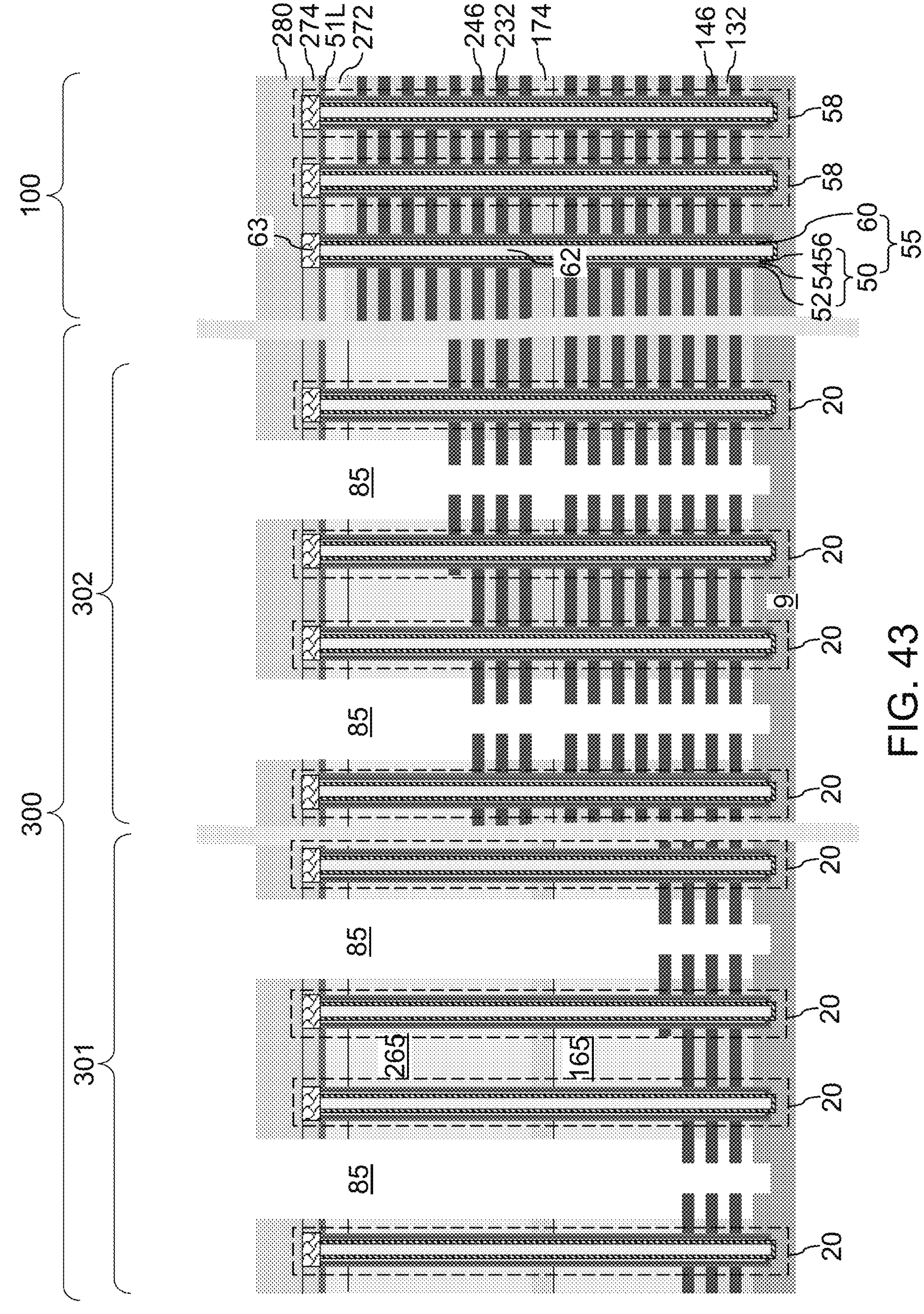
FIG. 43 is a vertical cross-sectional view of the second exemplary structure after laterally expanding the contact cavities according to the second embodiment of the present disclosure.

Referring to FIG. 43, the processing steps described with reference to FIG. 20 can be performed to laterally expand the contact cavities 85, which are also referred to as laterally-expanded contact cavities 85 hereafter.

Figure 44:
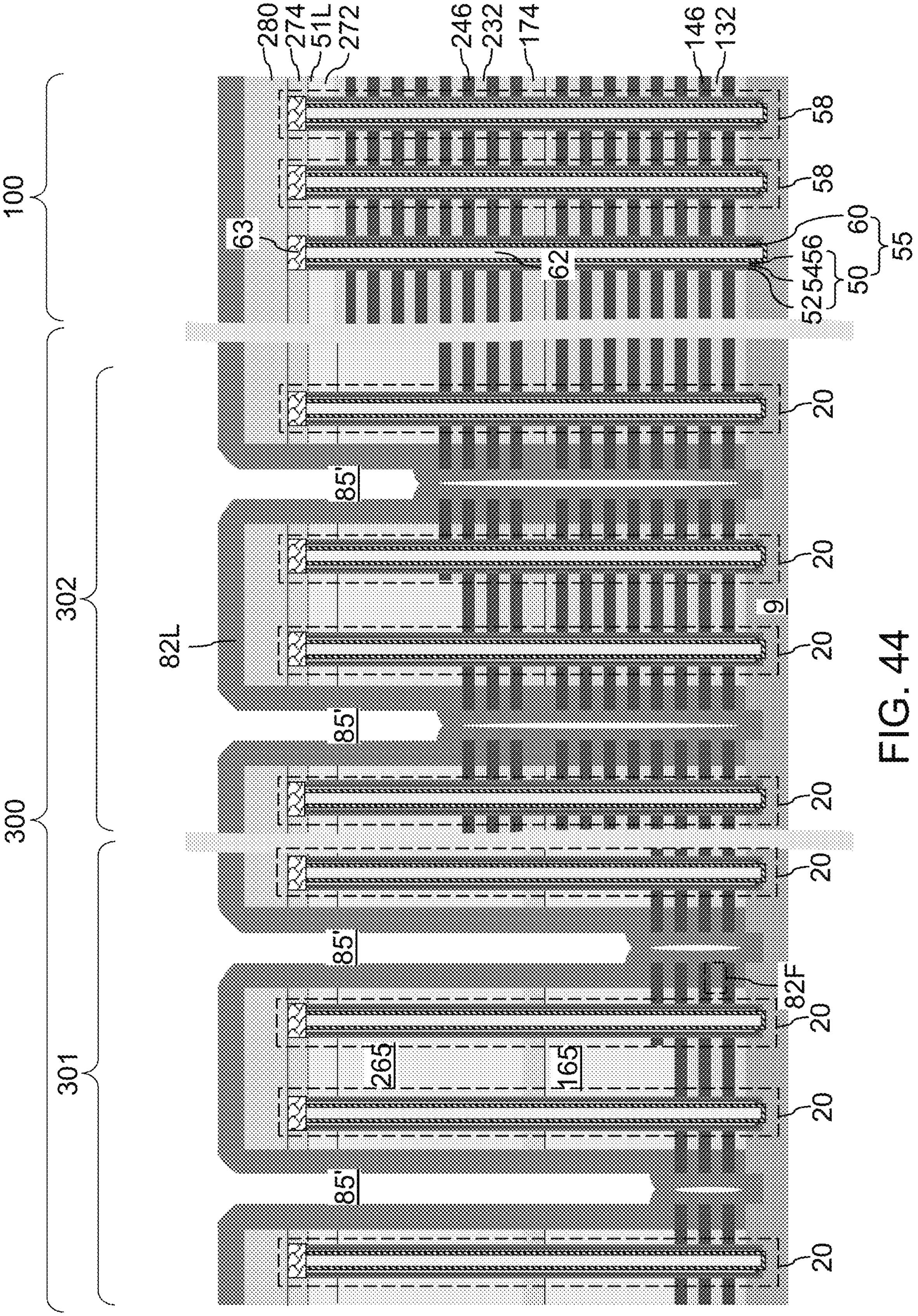
FIG. 44 is a vertical cross-sectional view of the second exemplary structure after deposition of a first dielectric fill material layer according to the second embodiment of the present disclosure.

Referring to FIG. 44, the processing steps described with reference to FIG. 21 can be performed to conformally deposit a first dielectric fill material layer 82L.

Figure 45:
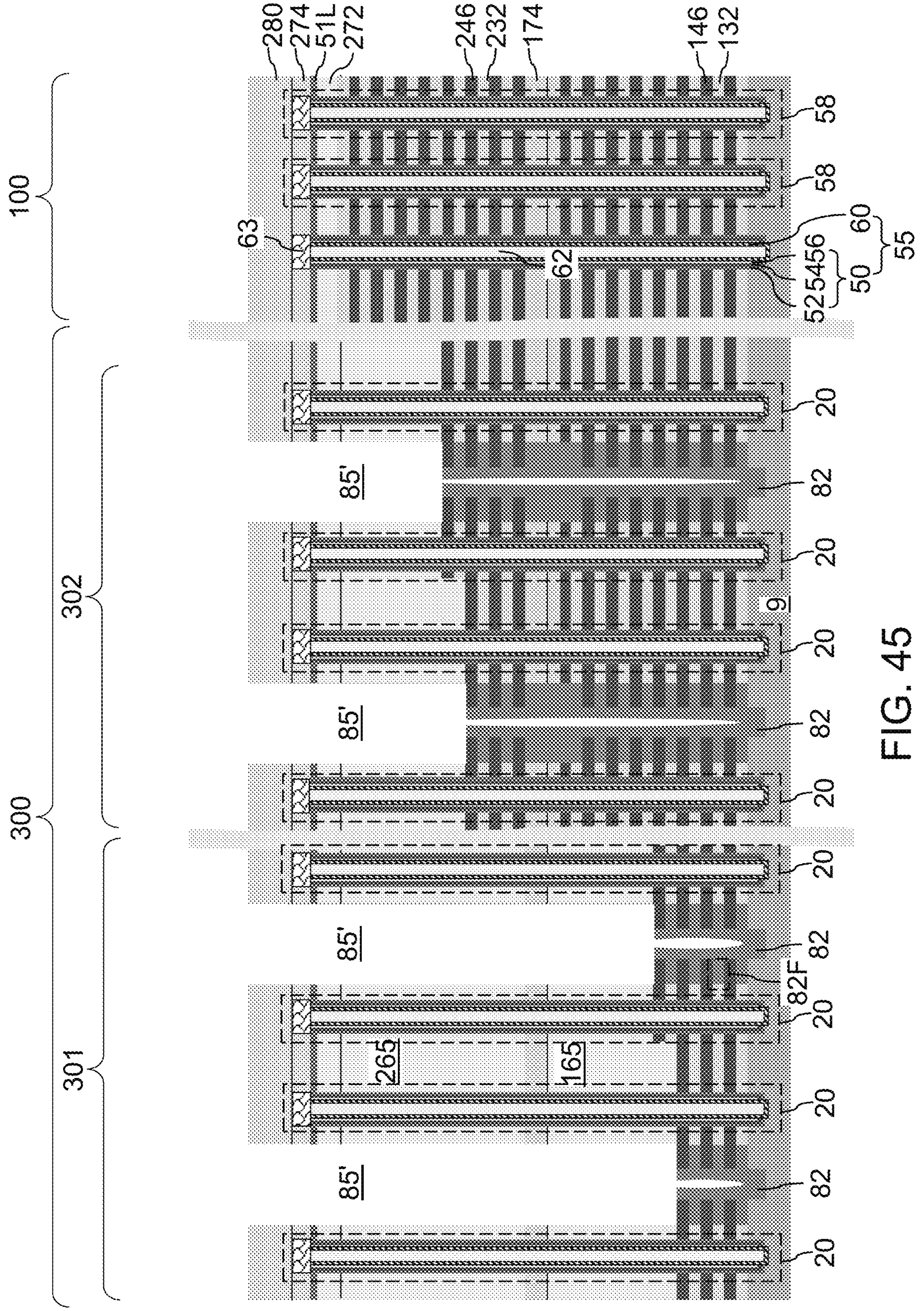
FIG. 45 is a vertical cross-sectional view of the second exemplary structure after isotropic recessing of the first dielectric fill material layer according to the second embodiment of the present disclosure.

Referring to FIG. 45, the processing steps described with reference to FIG. 22 can be performed to isotropically recess the first dielectric fill material layer 82L. First dielectric material portions 82 are formed at a bottom portion of each of the laterally-expanded contact cavities 85.

Figure 46:
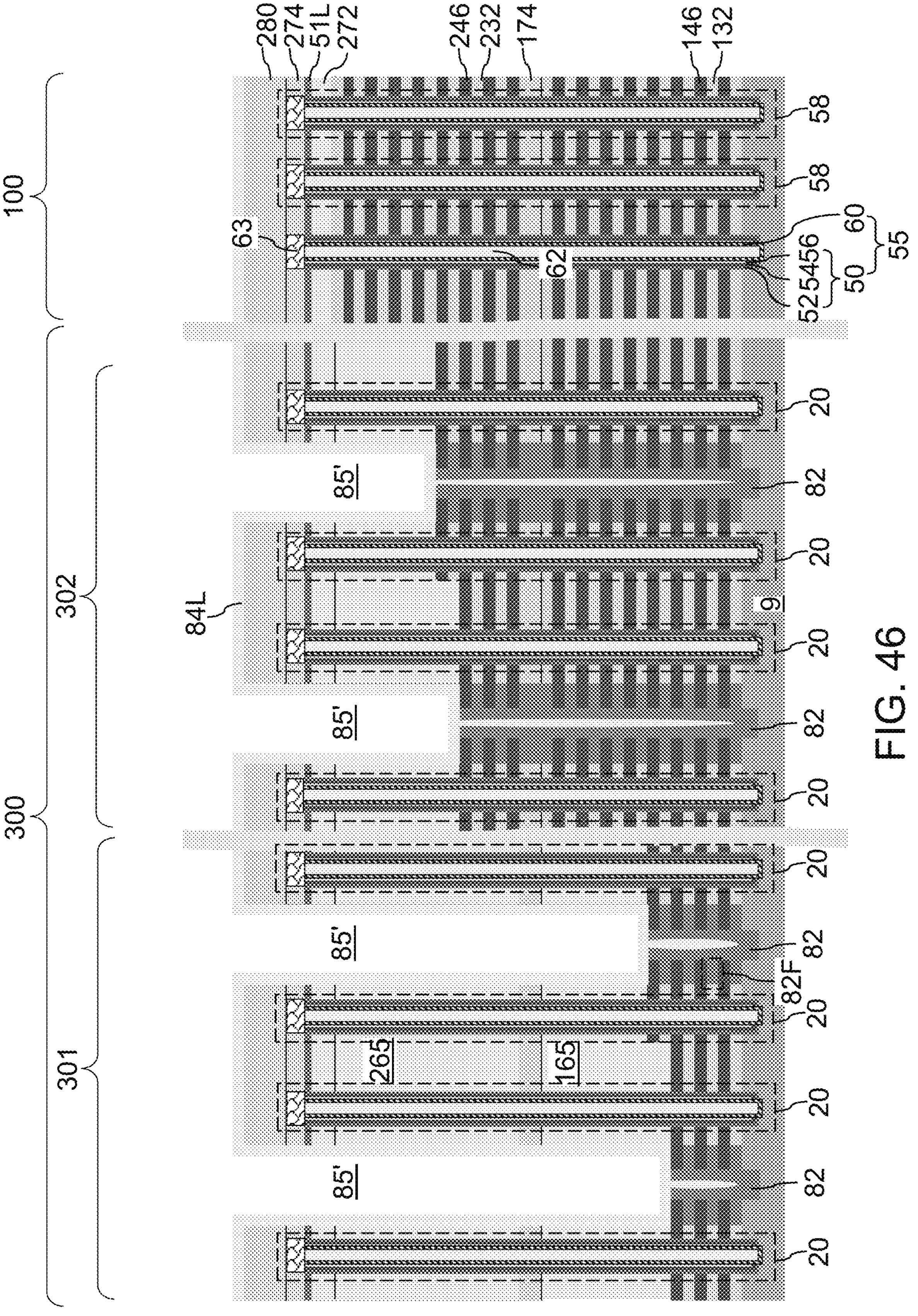
FIG. 46 is a vertical cross-sectional view of the second exemplary structure after deposition of a second dielectric fill material layer according to the second embodiment of the present disclosure.

Referring to FIG. 46, the processing steps described with reference to FIG. 23 can be performed to conformally deposit a second dielectric fill material layer 84L.

Figure 47:
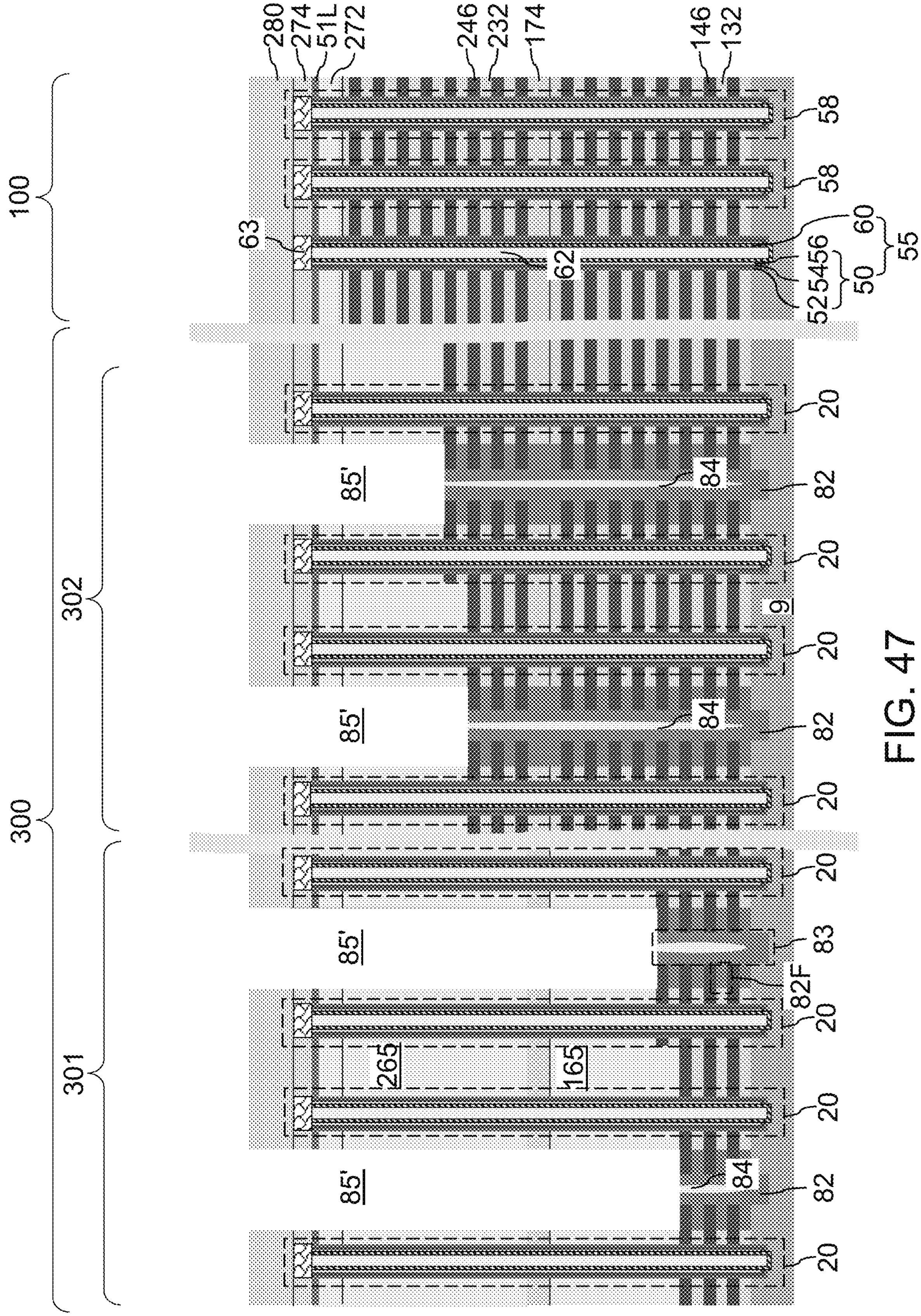
FIG. 47 is a vertical cross-sectional view of the second exemplary structure after isotropic recessing of the second dielectric fill material layer according to the second embodiment of the present disclosure.

Referring to FIG. 47, the processing steps described with reference to FIG. 24 can be performed to isotropically recess the second dielectric fill material layer 84L. Second dielectric material portions 84 are formed at a bottom portion of each of the laterally-expanded contact cavities 85 inside a respective one of the first dielectric material portion 82.

Figure 48:
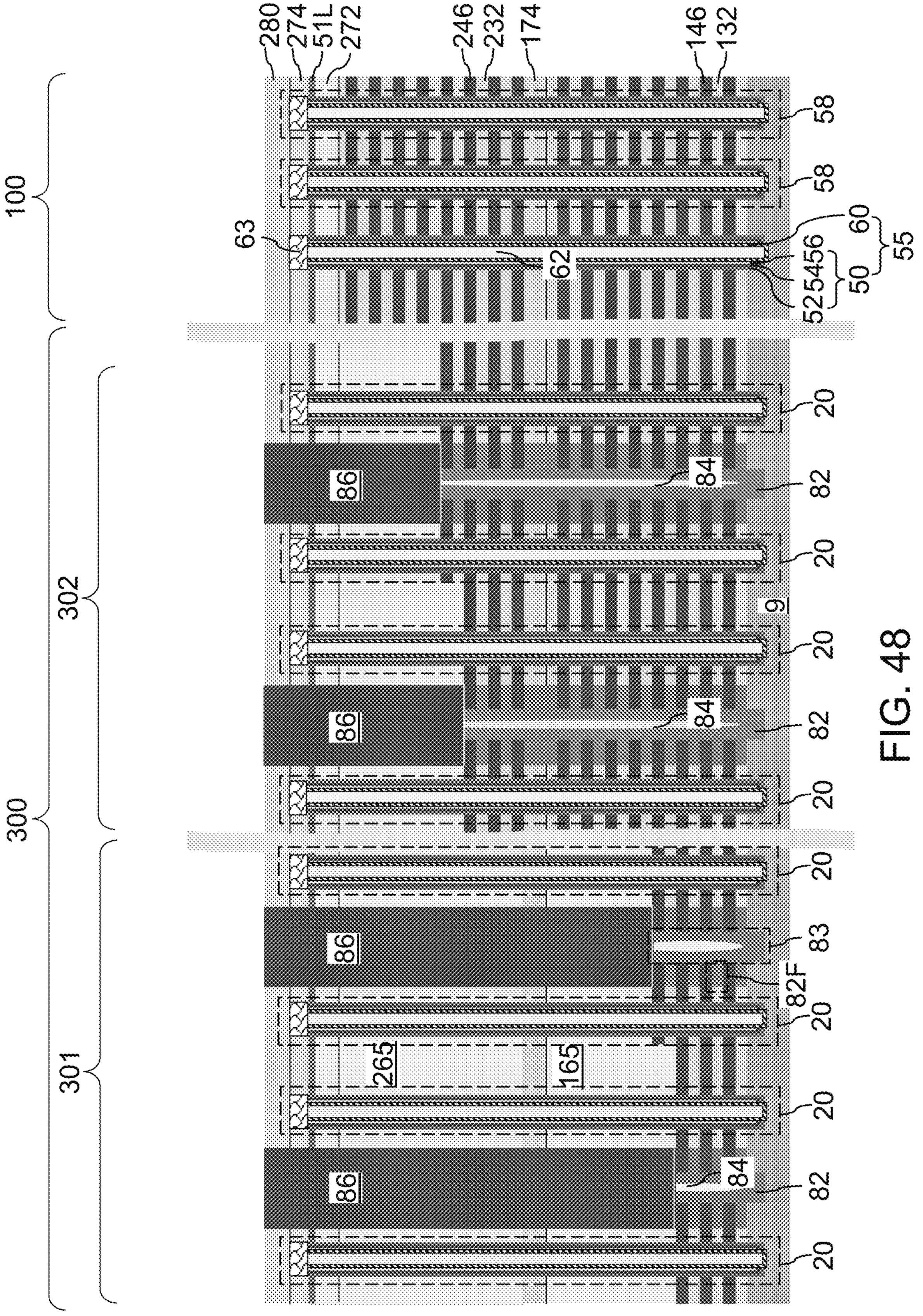
FIG. 48 is a vertical cross-sectional view of the second exemplary structure after formation of layer contact via structures according to the second embodiment of the present disclosure.

Referring to FIG. 48, the processing steps described with reference to FIG. 27 can be performed to form layer contact via structures 86 in upper portions of the laterally-expanded contact cavities 85. In the second exemplary structure, one, a plurality and/or each of the layer contact via structures 86 comprises a straight cylindrical sidewall that vertically extends from a top surface of a respective one of the layer contact via structures 86 to a horizontal surface of a respective one of the electrically conductive layers (146, 246).

Figure 49:
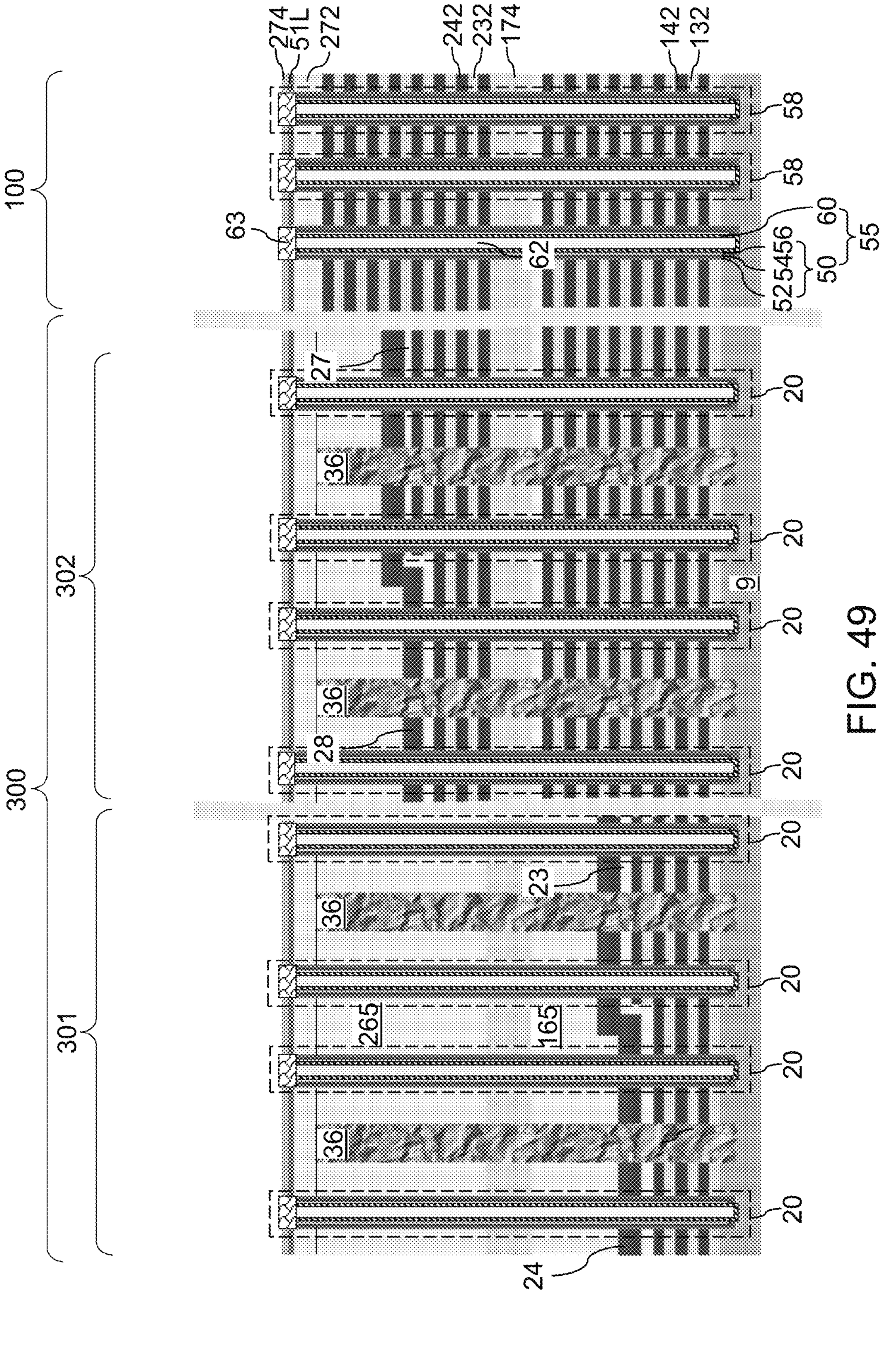
FIG. 49 is a vertical cross-sectional view of a third exemplary structure after formation of memory opening fill structures and support pillar structures according to a third embodiment of the present disclosure.

Referring to FIG. 49, a third exemplary structure according to a third embodiment of the present disclosure can be derived from the first exemplary structure illustrated in FIG. 15 by increasing the thickness of the second dielectric liner 24 and the fourth dielectric liner 28 and by modifying the pattern of the second dielectric liner 24 and the fourth dielectric liner 28.

Specifically, the thickness of the second dielectric liner 24 and the fourth dielectric liner 28 can be greater than the thickness of each of the first sacrificial material layers 142 and the second sacrificial material layers 242. For example, the first sacrificial material layers 142 and the second sacrificial material layers 242 may have the same thickness, and each of the second dielectric liner 24 and the fourth dielectric liner may have a thickness at is greater than two times, such as 2.2 to 5 times the thickness of the first sacrificial material layers 142 and the second sacrificial material layers 242. The ratio of the thickness of the second dielectric liner 24 to the thickness of each of the first sacrificial material layers 142 and the second sacrificial material layers 242 may be in a range from 2.2 to 5, such as from 2.5 to 4, and/or from 2.75 to 3.5, although greater ratios may also be employed. The ratio of the thickness of the fourth dielectric liner 28 to the thickness of each of the first sacrificial material layers 142 and the second sacrificial material layers 242 may be in a range from 2.2 to 5, such as from 2.5 to 4, and/or from 2.75 to 3.5, although greater ratios may also be employed The pattern of the second dielectric liner 24 and the fourth dielectric liner 28 can be modified such that the pattern of the second dielectric liner 24 and the fourth dielectric liner 28 are present in regions in which backside trenches are to be subsequently formed. In one embodiment, the pattern of the second dielectric liner 24 and the fourth dielectric liner 28 may be present over the entire area of the first stepped surfaces and the second stepped surfaces, respectively. In this case, each of the second dielectric liner 24 and the fourth dielectric liner 28 may be formed as a respective continuous material layer, i.e., a respective unitary structure. In one embodiment, the first dielectric liner 23 and the third dielectric liner 27 may also be formed as a respective continuous material layer.

Generally, the support pillar structures 20 may or may not comprise a same set of materials as the memory opening fill structures 58. Likewise, the materials that are deposited in the support openings 19 may or may not be deposited in the memory openings 49. While an embodiment is described in which a same set of materials is deposited in the memory openings 49 and in the support openings 19, embodiments are expressly contemplated herein in which different sets of materials are deposited between the memory openings 49 and the support openings 19. Further, while embodiment is described in which a pedestal channel portion is not formed at the bottom of each memory opening 49, embodiments are expressly contemplated herein in which a pedestal channel portion is formed as a bottommost component within each memory opening fill structure 58.

Generally, each of the second insulating cap layer 272, the dielectric liner layer 51L, and the dielectric capping layer 274 is an optional layer, and as such, may or may not be employed in the various exemplary structures. The topmost surface of the alternating stack {(132, 142), (232, 242)} is located at or below the horizontal plane including the top surfaces of the drain regions 63.

Figure 50:
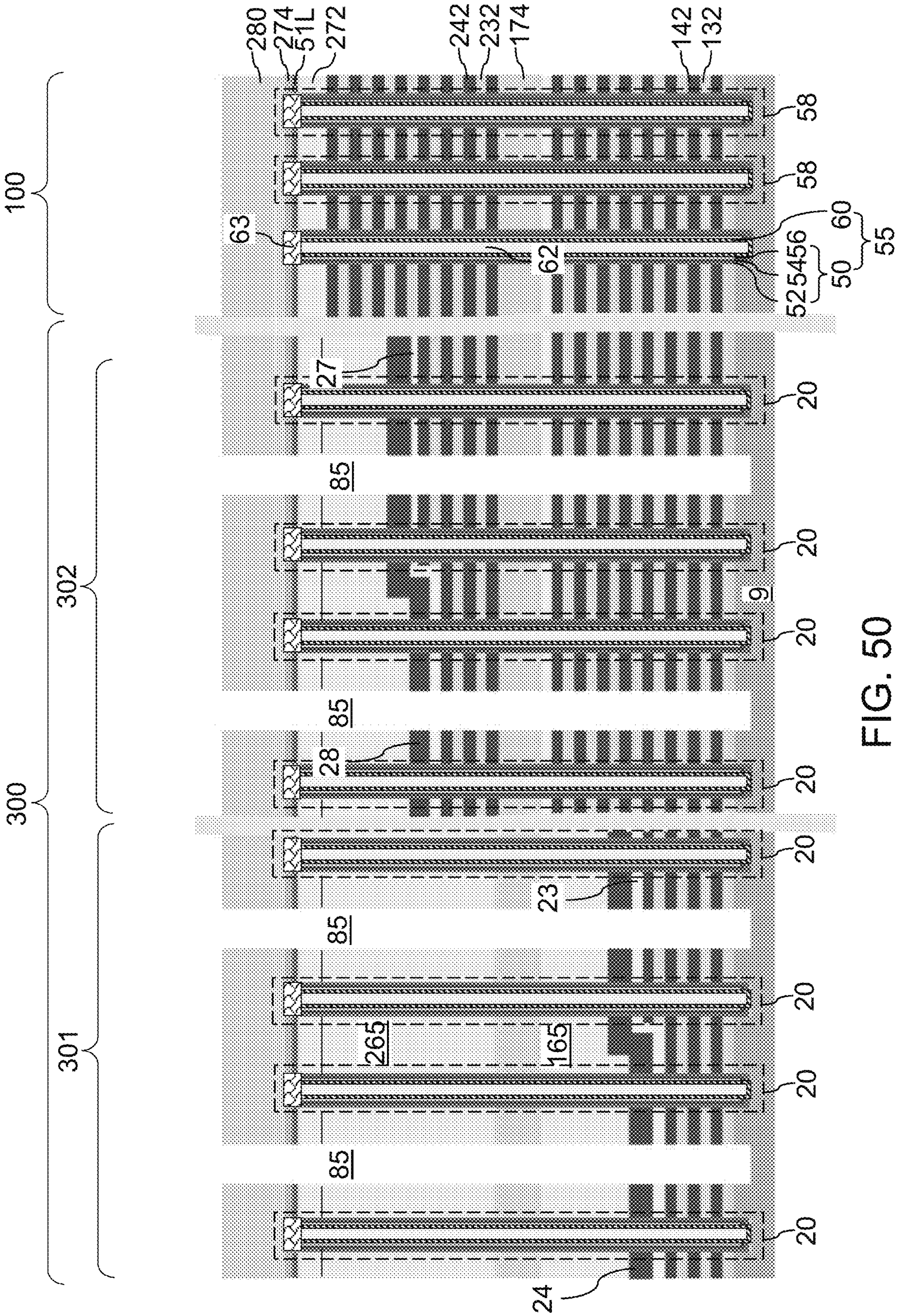
FIG. 50 is a vertical cross-sectional view of the third exemplary structure after formation of a contact-level dielectric layer and formation of contact cavities by removal of sacrificial contact opening fill structures according to the third embodiment of the present disclosure.

Referring to FIG. 50, the processing steps described with reference to FIG. 16 can be performed to form a contact-level dielectric layer 280. Subsequently, the processing steps described with reference to FIG. 19 can be performed to remove the sacrificial contact opening fill structures 36, thereby forming contact cavities 85.

Figure 51:
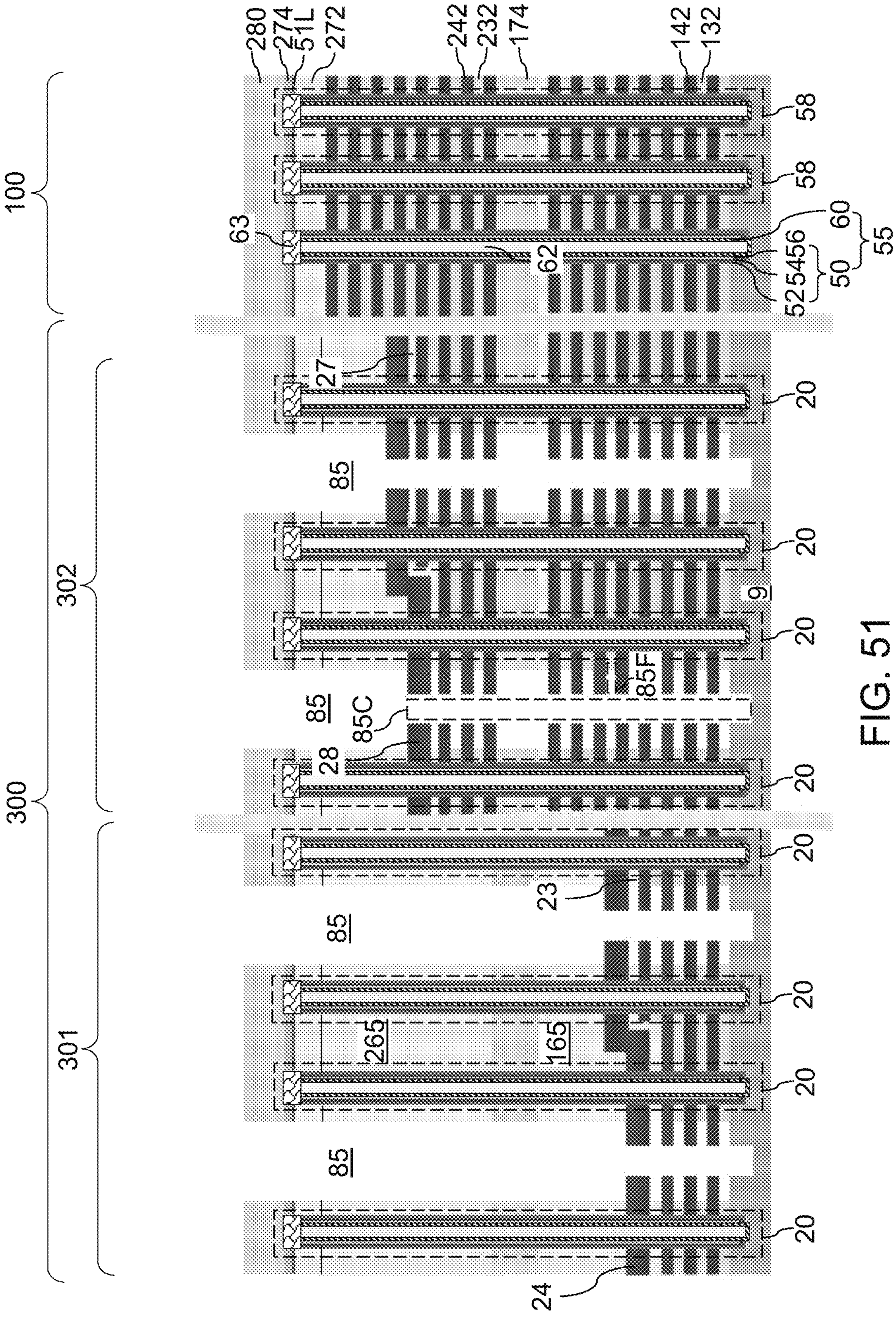
FIG. 51 is a vertical cross-sectional view of the third exemplary structure after laterally expanding the contact cavities according to the third embodiment of the present disclosure.

Referring to FIG. 51, the processing steps described with reference to FIG. 20 may be performed with an optional modification in the etch chemistry. Specifically, the contact cavities 85 can be laterally expanded by performing an isotropic etch process that laterally recesses proximal portions of the insulating layers (132, 232), retro-stepped dielectric material portions (165, 265), the optional first insulating cap layer 172, the optional inter-tier dielectric layer 174, the optional dielectric capping layer 274, and the contact-level dielectric layer 280 around each of the contact cavities 85 selective to the sacrificial material layers (142, 242). In an illustrative example, the insulating layers (132, 232), retro-stepped dielectric material portions (165, 265), the optional first insulating cap layer 172, the optional inter-tier dielectric layer 174, the optional dielectric capping layer 274, and the contact-level dielectric layer 280 may comprise silicon oxide materials (such as undoped silicate glass or a doped silicate glass), and the second isotropic etch process may comprise a wet etch process employing dilute hydrofluoric acid. The duration of the second isotropic etch process can be selected such that the lateral recess distance of the sidewalls of the insulating layers (132, 232) around each of the contact cavities 85 is in a range from 20 nm to 200 nm, such as from 40 nm to 100 nm, although lesser and greater lateral recess distances may also be employed. If a silicon oxide dielectric liner layer 51L is present in the third embodiment, then portions of the dielectric liner layer 51L that are exposed to the contact cavities 85 are also removed during the etch.

The contact cavities 85, which are also referred to as laterally-expanded contact cavities 85 hereafter, comprise a respective upper portion that is formed by laterally recessing the at least one retro-stepped dielectric material portion (165, 265), and a respective lower portion that extends through at least one dielectric liner {(23, 24) or (27, 28)} and a respective set of layers in the at least one alternating stack {(132, 142), (232, 242)} of insulating layers (132, 232) and sacrificial material layers (142, 242). The upper portion of each contact cavity 85 comprises a respective cylindrical cavity that is laterally surrounded by a remaining portion of the at least one retro-stepped dielectric material portion (165, 265). The lower portion of each contact cavity 85 comprises a respective finned cavity that underlies the respective cylindrical cavity. Each finned cavity has a central cavity 85C and at least one fin-shaped cavity 85F that that laterally extends outward from the central cavity 85C and having a respective vertical extent that is less than the vertical extent of the central cavity 85C. Each finned cavity comprises a central cavity 85C and at least one fin-shaped cavity 85F that laterally protrudes outward from the central cavity. In one embodiment, each of the fin-shaped cavities may have a respective tubular shape.

Figure 52:
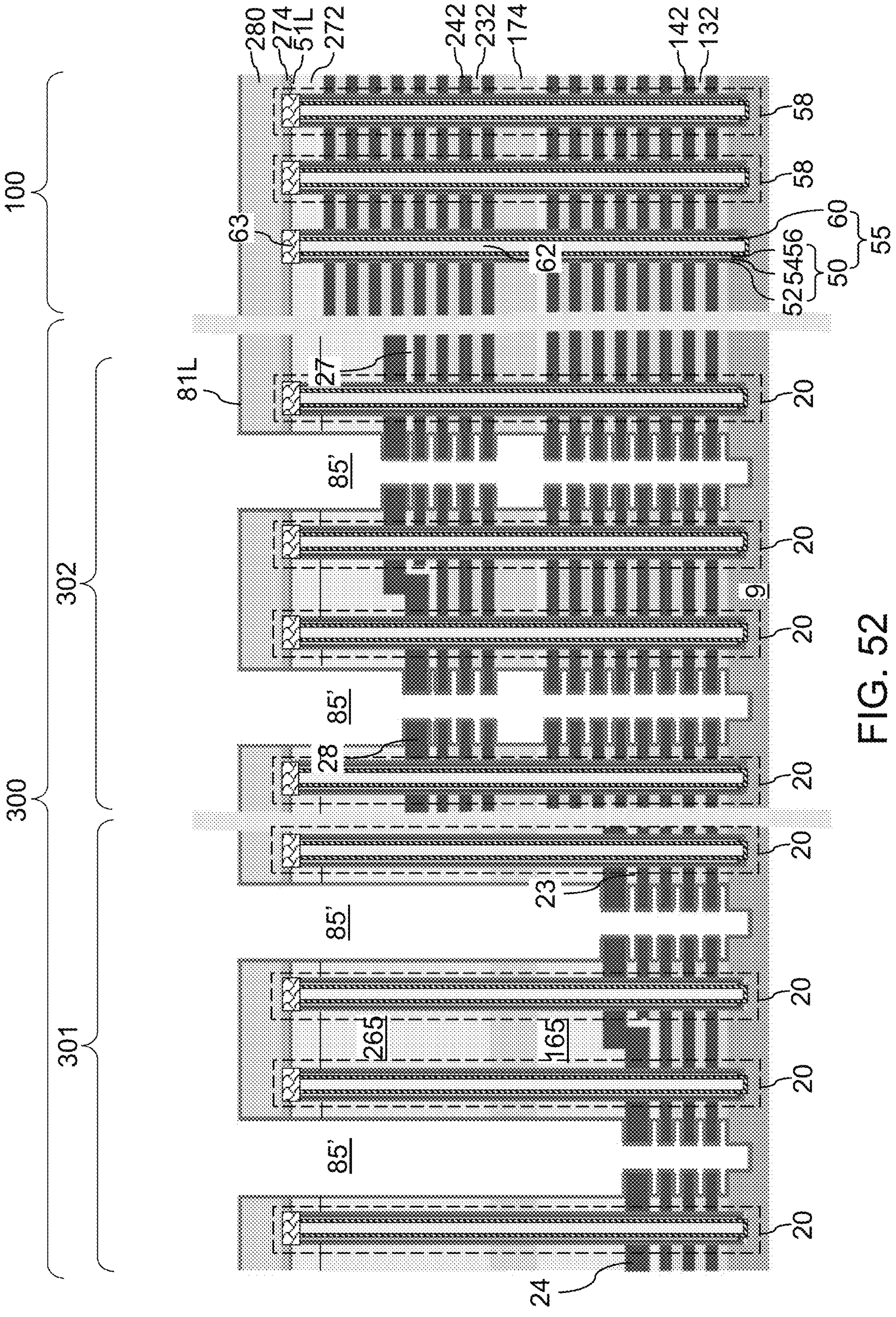
FIG. 52 is a vertical cross-sectional view of the third exemplary structure after formation of a first dielectric via liner layer according to the third embodiment of the present disclosure.

Referring to FIG. 52, an optional first dielectric via liner layer 81L can be formed by conformally depositing a dielectric material that is different from the material of the sacrificial material layers (142, 42). For example, the first dielectric via liner layer 81L may comprise undoped silicate glass, a doped silicate glass, a silicon carbide, a silicon carbide nitride, or a dielectric metal oxide that is resistant to an etchant to be subsequently employed to remove the sacrificial material layers (142, 242). The thickness of the first dielectric via liner layer 81L may be less than one half of the thickness of each of the sacrificial material layers (142, 242). The thickness of the first dielectric via liner layer 81L may be 2 nm to 3 nm. Thus, a finned void that remains within the volume of a respective finned cavity.

Figure 53:
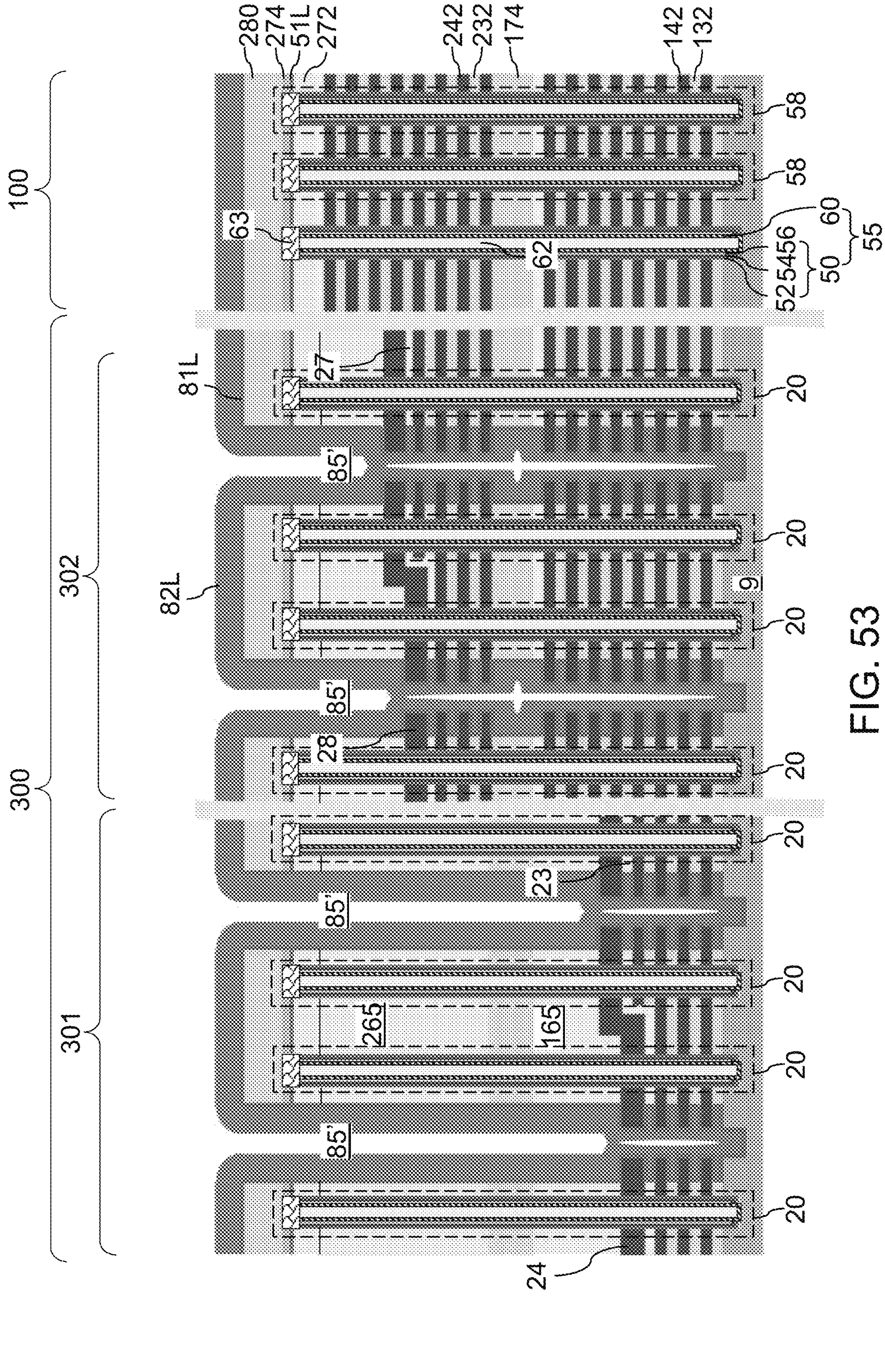
FIG. 53 is a vertical cross-sectional view of the third exemplary structure after deposition of a first dielectric fill material layer according to the third embodiment of the present disclosure.

Referring to FIG. 53, the processing steps described with reference to FIG. 21 may be performed to form a first dielectric fill material layer 82L. Seams may or may not be formed within the volumes of the fin-shaped cavities (as formed at the processing steps of FIG. 50).

Figure 54:
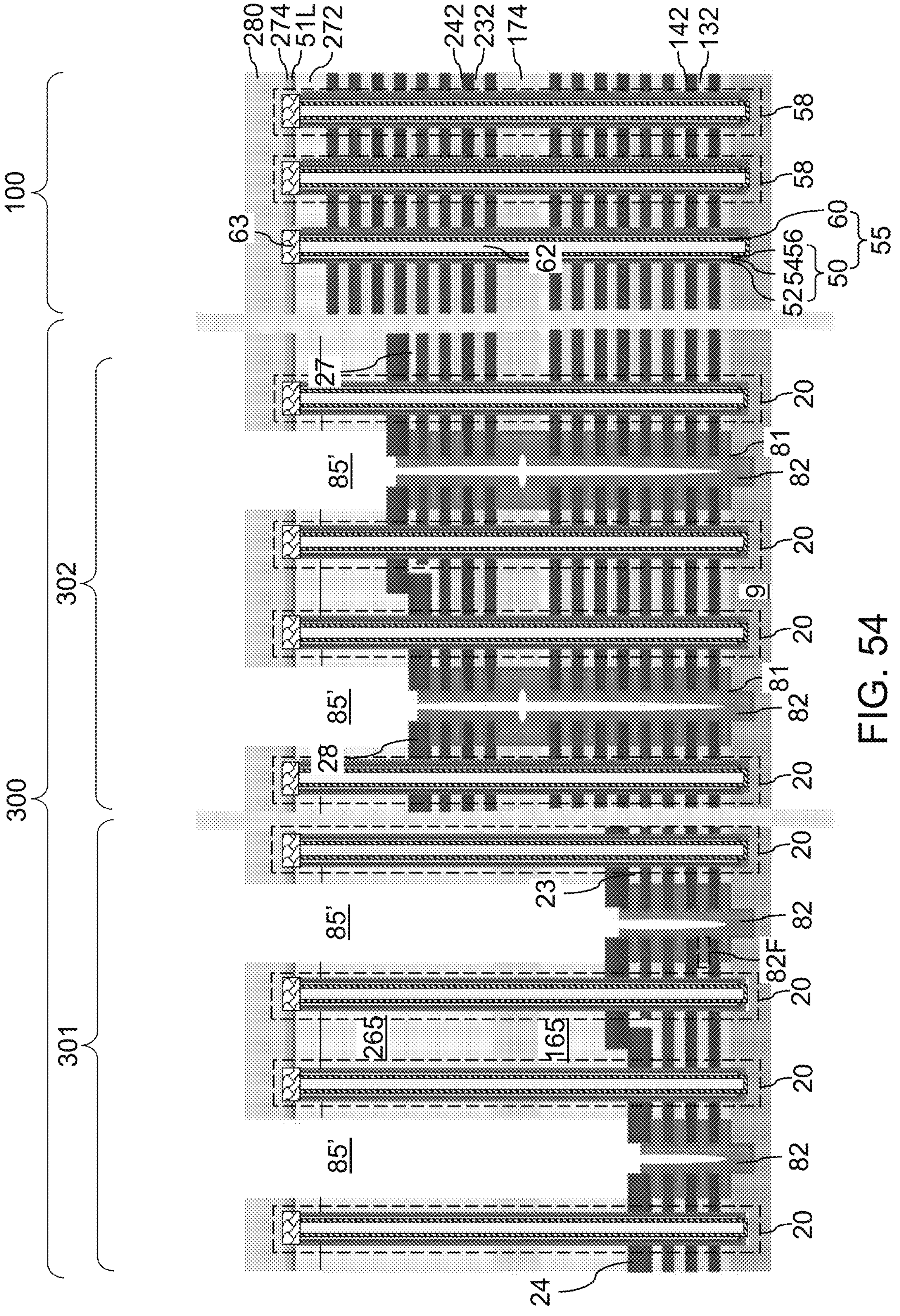
FIG. 54 is a vertical cross-sectional view of the third exemplary structure after isotropic recessing of the first dielectric fill material layer and the first dielectric via liner layer according to the third embodiment of the present disclosure.

Referring to FIG. 54, the processing steps described with reference to FIG. 22 may be performed to isotropically recess the first dielectric fill material layer 82L and to remove portions of the first dielectric via liner layer 81L that overlie the second dielectric liner 24 or the fourth dielectric liner 28. Each remaining portion of the first dielectric via liner layer 81L is herein referred to as a first dielectric via liner 81. Each first dielectric via liner 81 is laterally surrounded by a subset of layers of the alternating stack {(132, 142), (232, 242)} and underlies a respective void having a grater lateral dimension than an opening in an overlying second dielectric liner 24 or in an overlying fourth dielectric liner 28.

Figure 55:
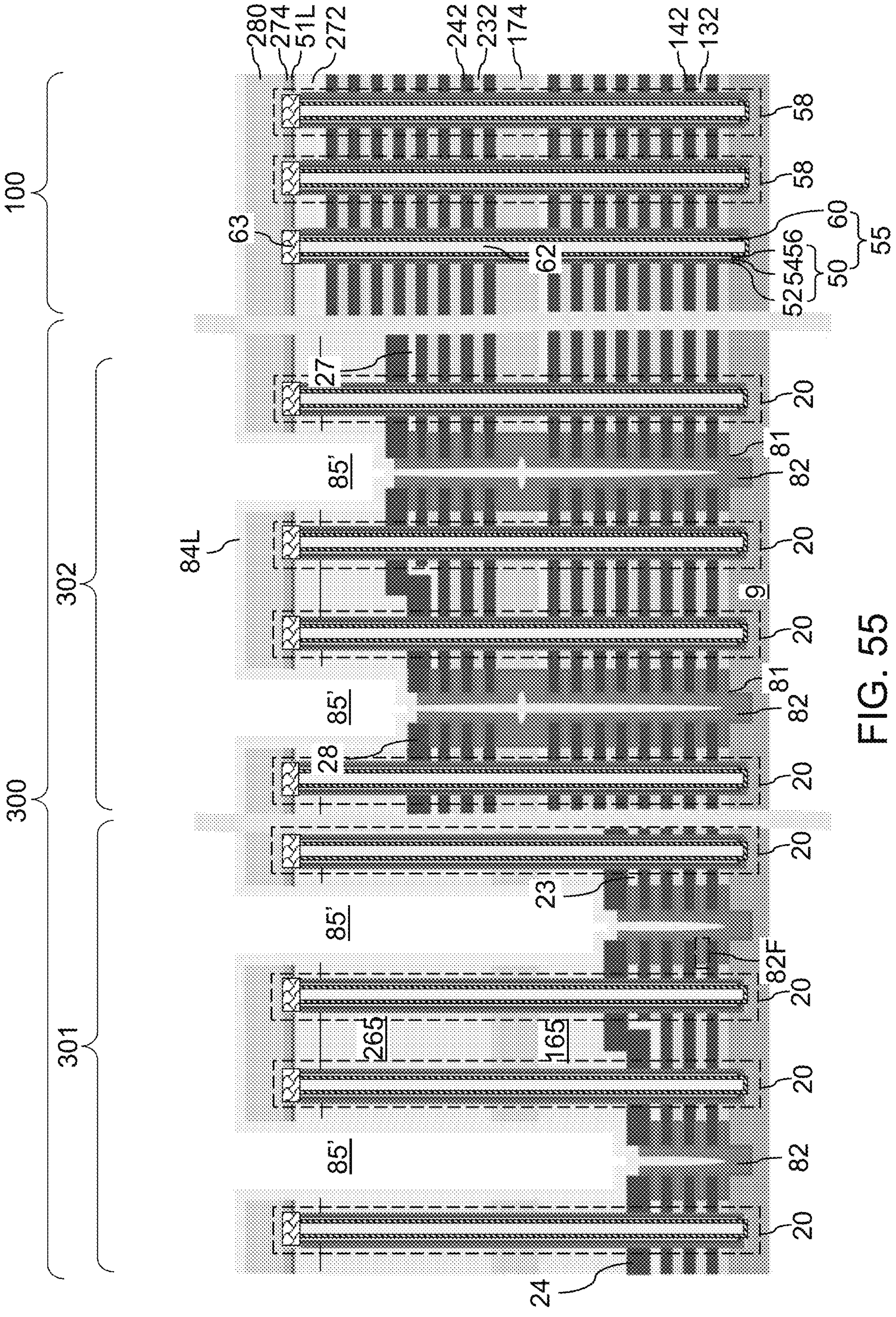
FIG. 55 is a vertical cross-sectional view of the third exemplary structure after deposition of a second dielectric fill material layer according to the third embodiment of the present disclosure.

Referring to FIG. 55, the processing steps described with reference to FIG. 23 can be optionally performed to form a second dielectric fill material layer 84L.

Figure 56:
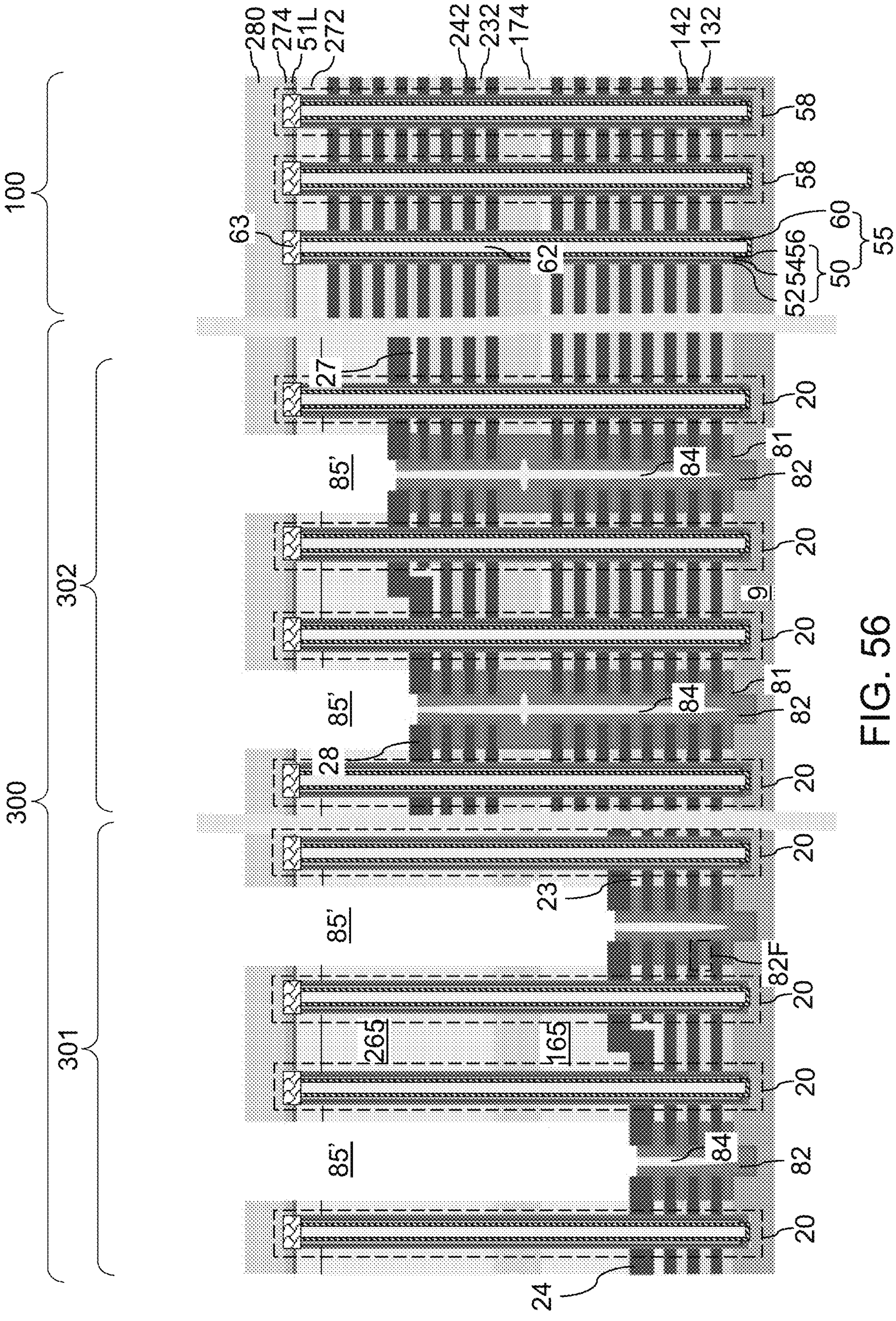
FIG. 56 is a vertical cross-sectional view of the third exemplary structure after isotropic recessing of the second dielectric fill material layer according to the third embodiment of the present disclosure.

Referring to FIG. 56, the processing steps described with reference to FIG. 24 can be performed to form second dielectric fill material portions 84.

Figure 57:
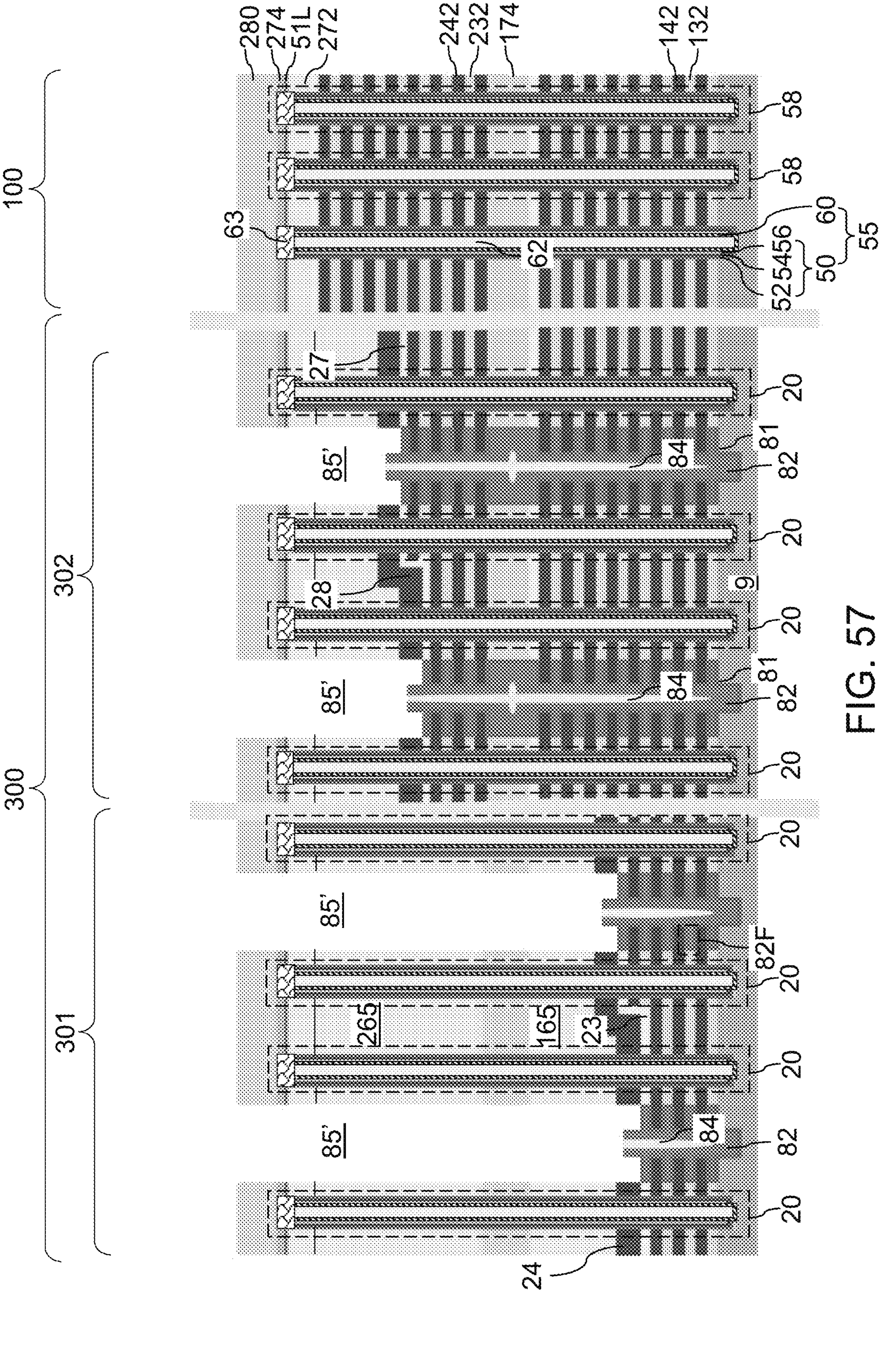
FIG. 57 is a vertical cross-sectional view of the third exemplary structure after recessing the second dielectric liner and the fourth dielectric liner according to the third embodiment of the present disclosure.

Referring to FIG. 57, an etch process can be performed to remove portions of the second dielectric liner 24 and the fourth dielectric liner 28 that underlie the voids 85'. The etch process may comprise an anisotropic etch process or an isotropic etch process. In one embodiment, the processing steps described with reference to FIG. 25 may be performed. Physically exposed sidewalls of the second dielectric liner 24 and the fourth dielectric liner 28 may or may not be laterally recessed outward, and/or may or may not comprise concave annular surfaces depending on an isotropic etch process or an anisotropic etch process is employed to etch uncovered portions of the second dielectric liner 24 and the fourth dielectric liner 28.

A finned dielectric pillar structure (81, 82, 84) can be formed in a bottom portion of each contact cavity 85. Each of the finned dielectric pillar structures (81, 82, 84) comprises a first dielectric via liner 81 having a laterally-undulating vertical cross-sectional profile and laterally protruding outward at each level of the insulating layers (132, 232) that underlies a void 85' located in an upper portion of a respective contact cavity 85. Each of the first dielectric via liners 81 has a thickness less than one half of a minimum thickness of the sacrificial material layers (142, 242).

Figure 58:
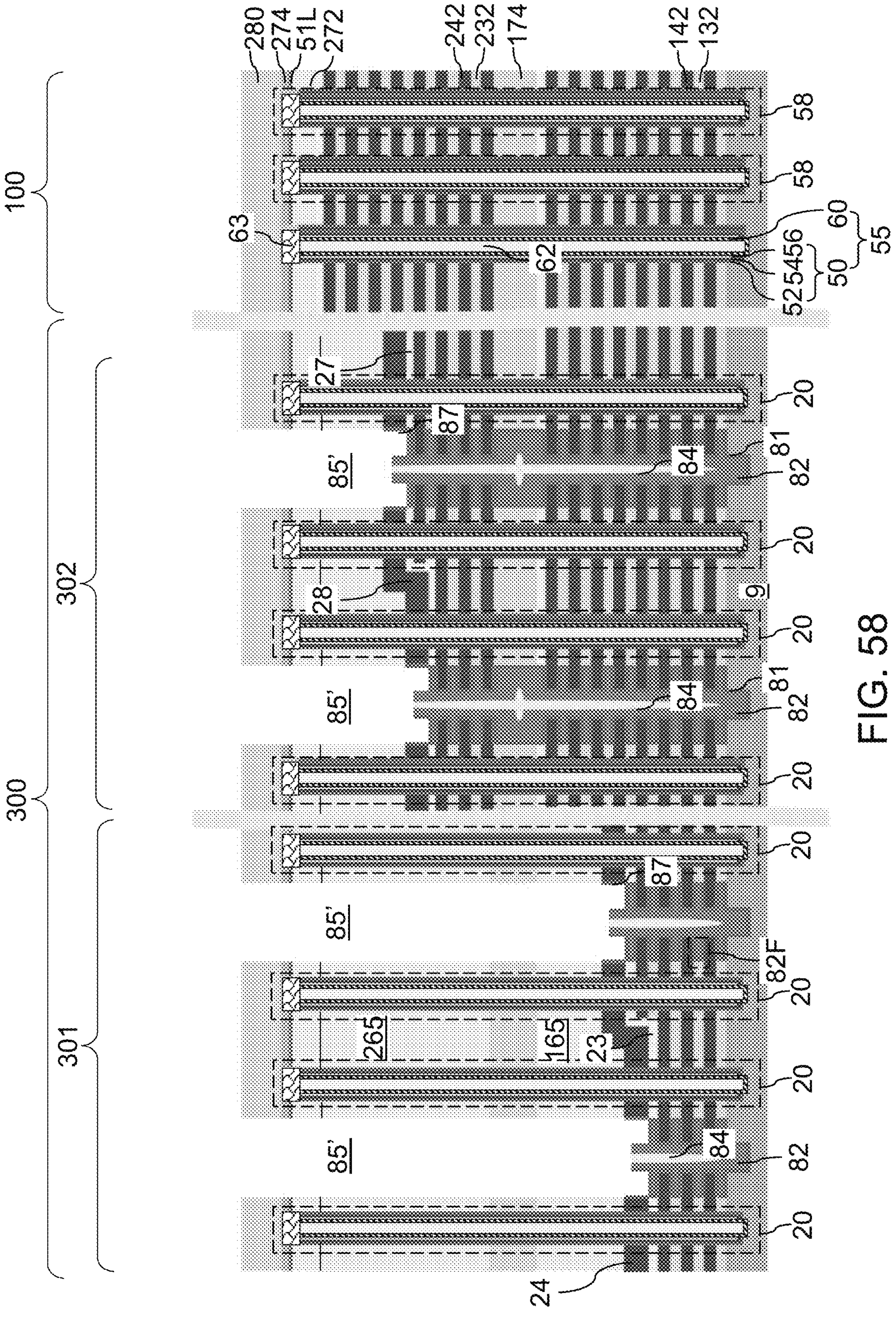
FIG. 58 is a vertical cross-sectional view of the third exemplary structure after conversion of surface portions of the second dielectric liner and the fourth dielectric liner into dielectric oxide liners according to the third embodiment of the present disclosure.

Referring to FIG. 58, an oxidation process may be optionally performed to convert physically exposed surface portions of the second dielectric liner 24 and the fourth dielectric liner 28 into dielectric oxide liners 87. For example, if the second dielectric liner 24 and the fourth dielectric liner 28 comprise silicon nitride, the dielectric oxide liners 87 may comprise silicon oxide or silicon oxynitride having a lateral nitrogen concentration gradient in which the atomic concentration of nitrogen atoms increases with a lateral distance from a respective interface between a void 85' and a respective dielectric oxide liner 86. The thickness of the dielectric oxide liners 87 may be in a range from 1 nm to 5 nm, such as from 2 nm to 3 nm, although lesser and greater thicknesses may also be employed.

Figure 59:
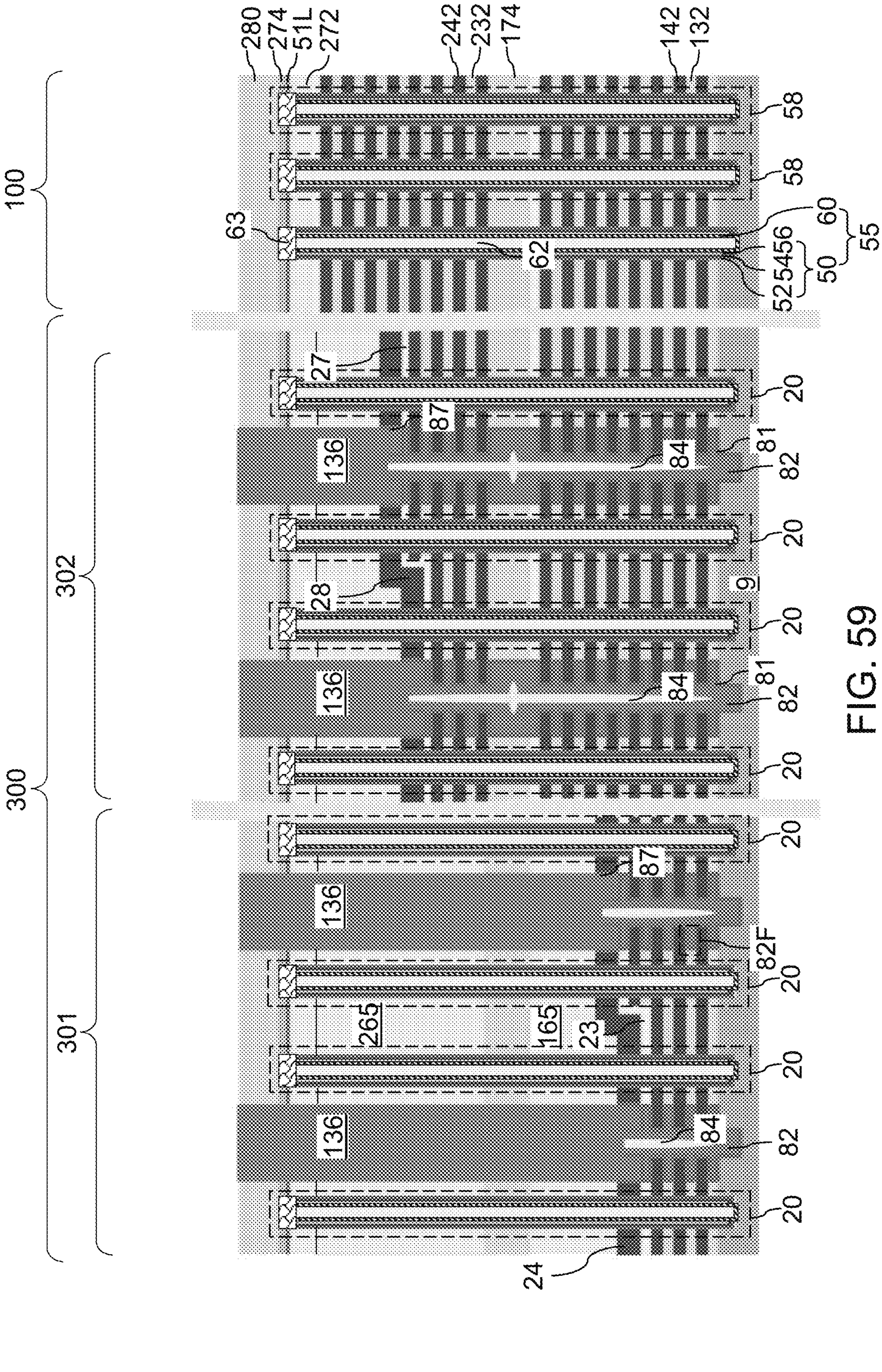
FIG. 59 is a vertical cross-sectional view of the third exemplary structure after formation of sacrificial contact opening fill structures according to the third embodiment of the present disclosure.

Referring to FIG. 59, processing steps described with reference to FIG. 13 may be performed to form sacrificial contact opening fill structures 36 in the voids 85'. The sacrificial contact opening fill structures 136 comprise a sacrificial fill material such as carbon, such as amorphous carbon or diamond-like carbon, a semiconductor material, such as amorphous silicon or a silicon-germanium alloy, organosilicate glass, and/or a polymer material. Top surface of the sacrificial contact opening fill structures 136 can be formed within the horizontal plane including the top surface of the contact-level dielectric layer 280.

Figure 60:
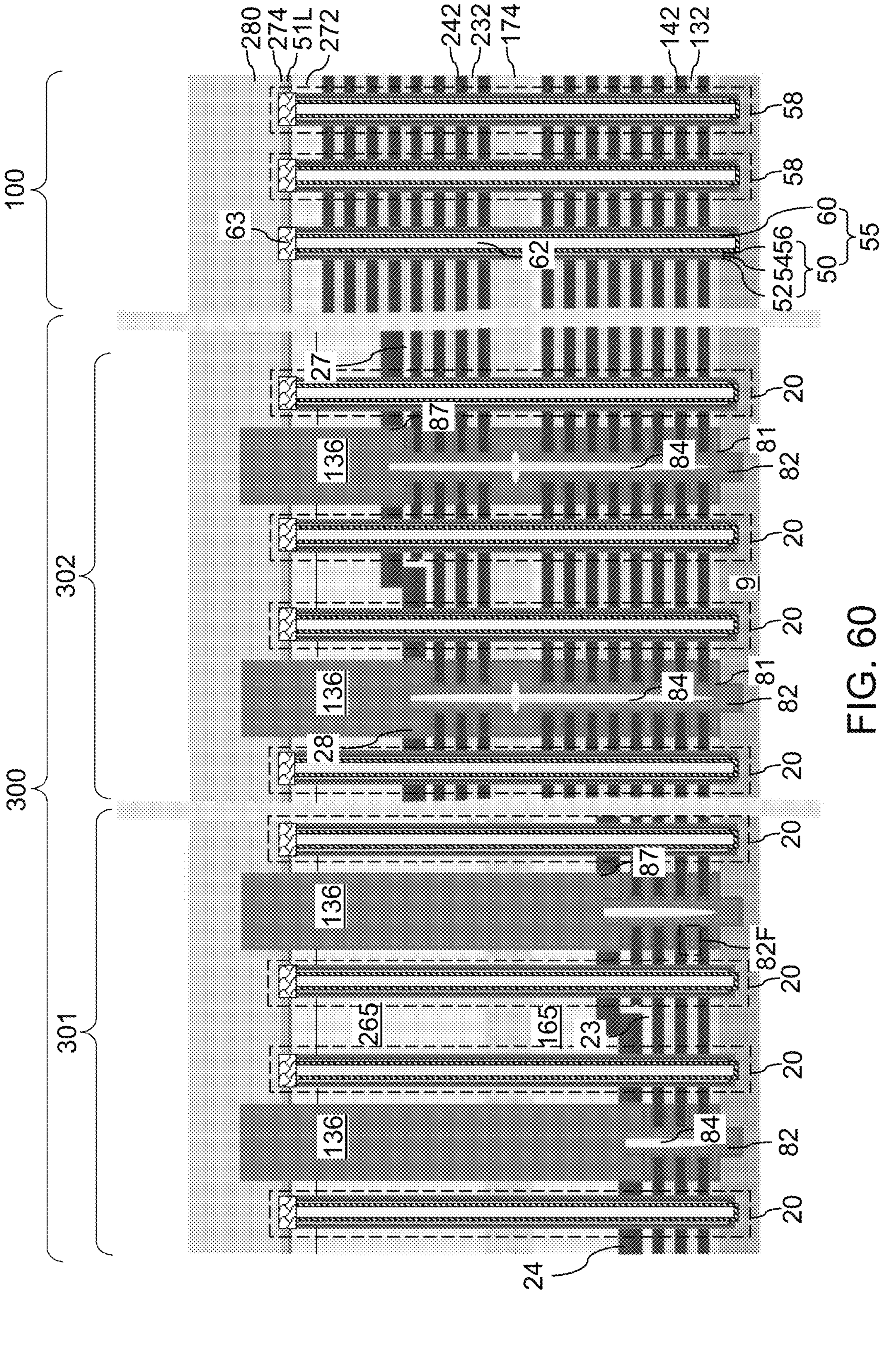
FIG. 60 is a vertical cross-sectional view of the third exemplary structure after adding more dielectric material to the contact-level dielectric layer according to the third embodiment of the present disclosure.

Referring to FIG. 60, an additional dielectric material may be deposited over the contact-level dielectric layer 280. The additional dielectric material is incorporated into the contact-level dielectric layer 280. The contact-level dielectric layer 280, as increased in volume upon incorporation of the additional dielectric material, covers the sacrificial contact opening fill structures 136.

Figure 61:
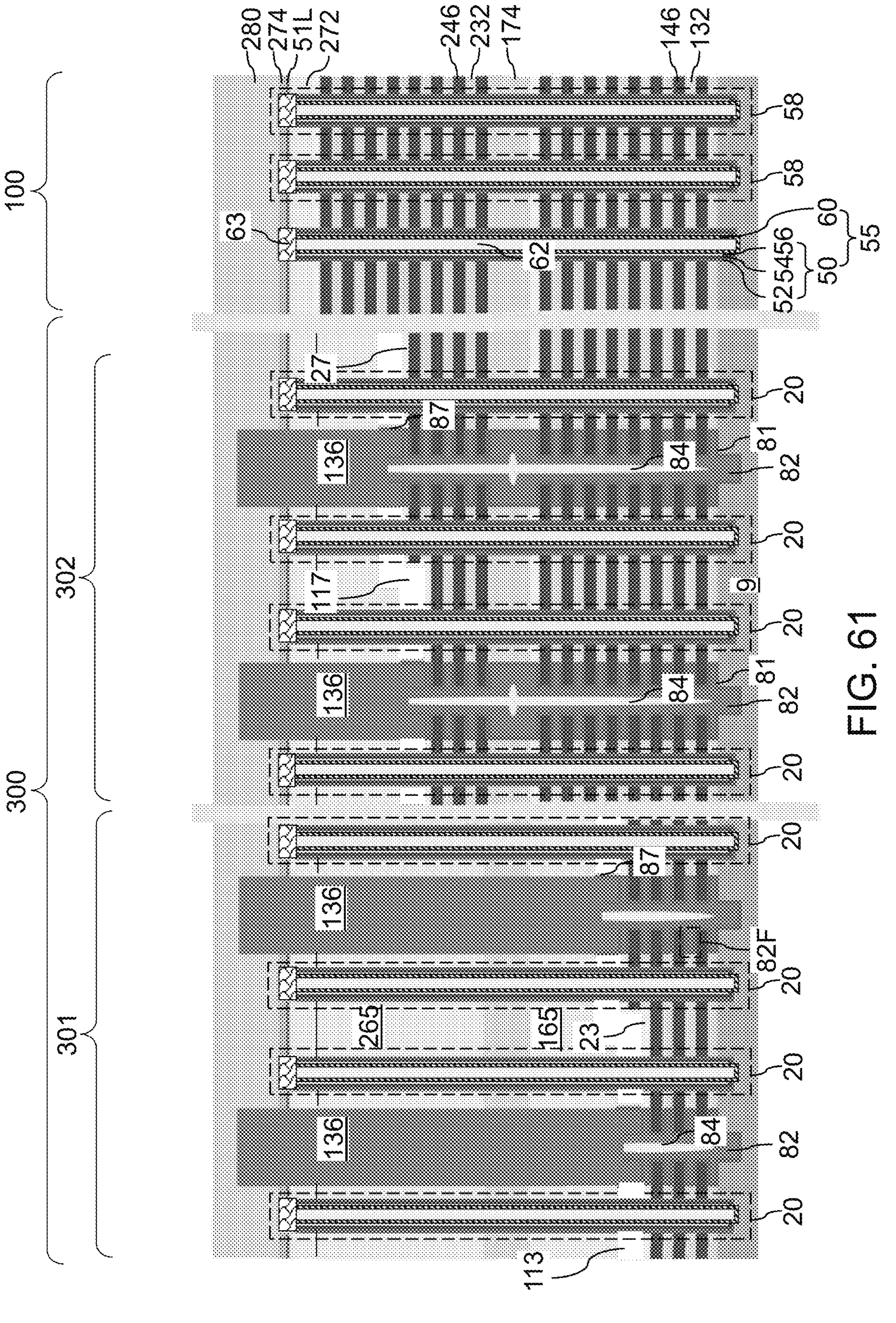
FIG. 61 is a vertical cross-sectional view of the third exemplary structure after replacement of the sacrificial material layers with electrically conductive layers and formation of inter-trench stepped cavities according to the third embodiment of the present disclosure.

Referring to FIG. 61, the processing steps described with reference to FIGS. 17A-17C and 18 can be performed. As discussed above, the second dielectric liner 24 and the fourth dielectric liner 28 are present within the areas in which the backside trenches 79 are formed. The second dielectric liner 24 can be divided into a plurality of second dielectric liners 24 laterally extending between a respective neighboring pair of backside trenches 79. The fourth dielectric liner 28 can be divided into a plurality of fourth dielectric liners 28 laterally extending between a respective neighboring pair of backside trenches 79.

Subsequently, an etchant that selectively etches the materials of the first and second sacrificial material layers (142, 242) with respect to the materials of the first and second insulating layers (132, 232), the first and second retro-stepped dielectric material portions (165, 265), and the material of the outermost layer of the memory films 50 can be introduced into the backside trenches 79, for example, employing an isotropic etch process. According to an aspect of the present disclosure, the second dielectric liners 24 and the fourth dielectric liners 28 can be collaterally etched during the isotropic etch process. In one embodiment, the second dielectric liners 24 and the fourth dielectric liners 28 comprise a same material as the sacrificial material layers (142, 242), and are removed during removal of the sacrificial material layers (142, 242). In one embodiment, the second dielectric liners 24, the fourth dielectric liners 28, and the sacrificial material layers (142, 242) comprise silicon nitride, and the isotropic etch process comprises a wet etch process employing hot phosphoric acid. Backside recesses are formed in volumes form which the sacrificial material layers (142, 242) are removed. Inter-trench stepped cavities (113, 117) are formed in the volumes from which the second dielectric liners 24 and the fourth dielectric liners 28 are removed. Specifically, a first inter-trench stepped cavity 113 is formed in each volume from which a second dielectric liner 24 is removed, and a second inter-trench stepped cavity 117 is formed in each volume from which a fourth dielectric liner 28 is removed.

A backside blocking dielectric layer (not shown) can be optionally deposited in the backside recesses, the inter-trench stepped cavities (113, 117), and in the backside trenches 79. At least one electrically conductive material can be conformally deposited in the plurality of backside recesses, on physically exposed surfaces around the inter-trench stepped cavities (113, 117), on the sidewalls of the backside trench 79, and over the contact-level dielectric layer 280. The at least one electrically conductive material can include at least one metallic material, i.e., an electrically conductive material that includes at least one metal element, such as a metal nitride barrier and a tungsten fill. According to an aspect of the present disclosure, the thickness of the inter-trench stepped cavities (113, 117) is at least two times greater than the thickness of each of the backside recesses. Therefore, the at least one electrically conductive material only partially fills the inter-trench stepped cavities (113, 117), while completely filling the backside recesses. Thus, a continuous void connected to a pair of voids within a pair of backside trenches 79 is present within the volume of each of the inter-trench stepped cavities (113, 117). In contrast, each backside recess is completely filled with a respective electrically conductive layer (146, 246) without a void therein.

Portions of the deposited at least one electrically conductive material can be isotropically etched back from inside the volumes of the partially filled inter-trench stepped cavities (113, 117), from the sidewalls of each backside trench 79, and from above the contact-level dielectric layers 280. Each remaining portion of the deposited metallic material in the first backside recesses constitutes a first electrically conductive layer 146. Each remaining portion of the deposited metallic material in the second backside recesses constitutes a second electrically conductive layer 246. Each electrically conductive layer (146, 246) can be a conductive line structure. Each of the inter-trench stepped cavities (113, 117) comprises a void that is free of any solid phase material. The void of each inter-trench stepped cavity (113, 117) extends from a top surface of a first dielectric liner 23 or a third dielectric liner 27 to a stepped bottom surface of an overlying retro-stepped dielectric material portion (165, 265). Generally, the void of each inter-trench stepped cavity (113, 117) can be formed by isotropically recessing the at least one electrically conductive material of the electrically conductive layers (146, 246).

Figure 62A:
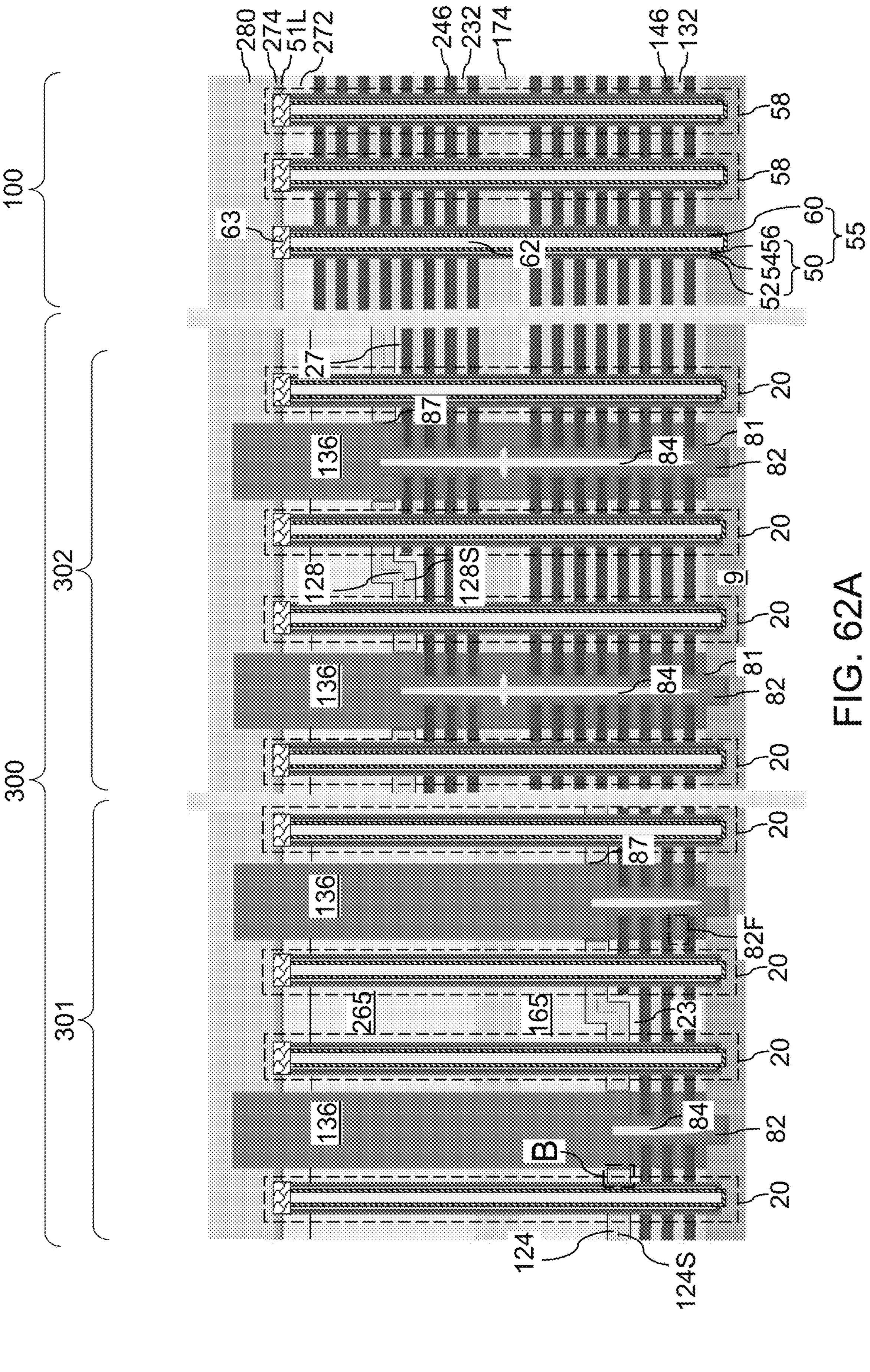
FIG. 62A is a vertical cross-sectional view of the third exemplary structure after formation of a first replacement dielectric liner and a second replacement dielectric liner according to the third embodiment of the present disclosure.
Figure 62B:
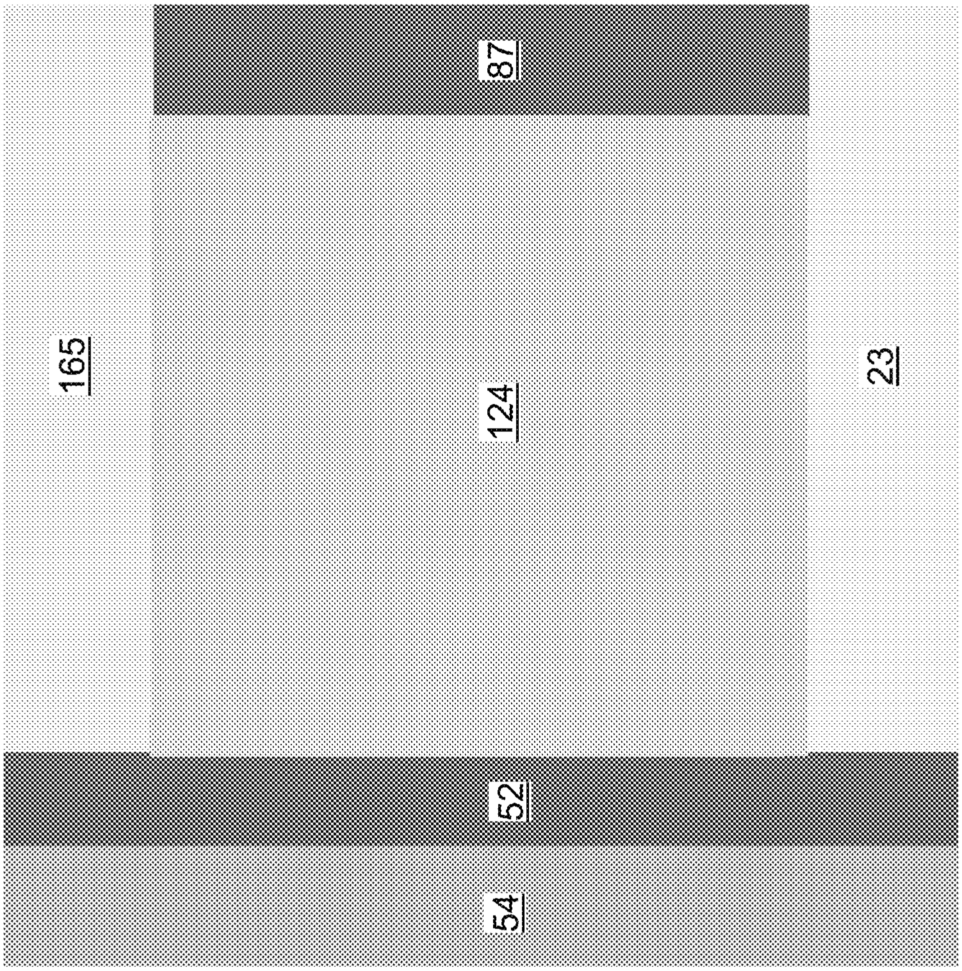
FIG. 62B is a magnified view of region B in FIG. 62A.

Referring to FIGS. 62A and 62B, a dielectric material layer (which is also referred to as a replacement dielectric material layer) can be conformally deposited in the volumes of the inter-trench stepped cavities (113, 117), at peripheral portions of the backside trenches 79, and above the top surface of the contact-level dielectric layer 280 by performing a conformal deposition process (such as a low-pressure chemical vapor deposition). The thickness of the dielectric material layer is greater than one half of the height of each inter-trench stepped cavity (113, 117). An etch back process (such as an anisotropic etch process) can be preformed to remove horizontal portions of the replacement dielectric material layer that are located within the backside trenches 79 or above the contact-level dielectric layer 280. Each remaining portion of the replacement dielectric material layer that fills the inter-trench stepped cavities (113, 117) constitutes a replacement dielectric liner (124, 128). The replacement dielectric liners (124, 128) comprise first replacement dielectric liners 124 that replace the second dielectric liners 24, and second replacement dielectric liners 128 that replace the fourth dielectric liners 28. The first replacement dielectric liners 124 may be referred to as second dielectric liners and the second replacement dielectric liners 128 may be referred to as fourth dielectric liners or additional second dielectric liners. The replacement dielectric liners (124, 128) comprise a dielectric material such as silicon oxide, silicon nitride, silicon carbide, silicon carbide nitride, a dielectric metal oxide, or a combination thereof.

Generally, the replacement dielectric liners (124, 128) can be formed within the voids within the volumes of the inter-trench stepped cavities (113, 117) after formation of the electrically conductive layers (146, 246). The replacement dielectric liners (124, 128) can be formed after formation of the sacrificial contact via structures 136. The replacement dielectric liners (124, 128) can laterally surround the sacrificial contact via structures 136. In one embodiment, the second dielectric liners (124, 128) can have a respective thickness that is greater than the maximum thickness of the electrically conductive layers (146, 246). In one embodiment, the electrically conductive layers (146, 246) may have the same thickness.

The replacement dielectric liners (124, 128) (which may also be referred to as dielectric liners or second dielectric liners) are formed by conformal or near-conformal deposition of dielectric fill material in the voids of the volumes of the inter-trench stepped cavities (113, 117), and as such, may comprise a respective seam (124S or 128S) located midway between a first interface between the second dielectric liner (124 or 128) and the first dielectric liner (23 or 27) and a second interface between the second dielectric liner (124 or 128) and the retro-stepped dielectric material portion (165, 265). In one embodiment, each seam (124S or 128S) comprises horizontally-extending seam sections that are interconnected with and adjoined to vertically-extending seam sections. In one embodiment, each seam (124S or 128S) is laterally spaced from cylindrical openings in a respective replacement dielectric liner (124 or 128) through which the sacrificial contact via structures 136 extend.

Figure 63:
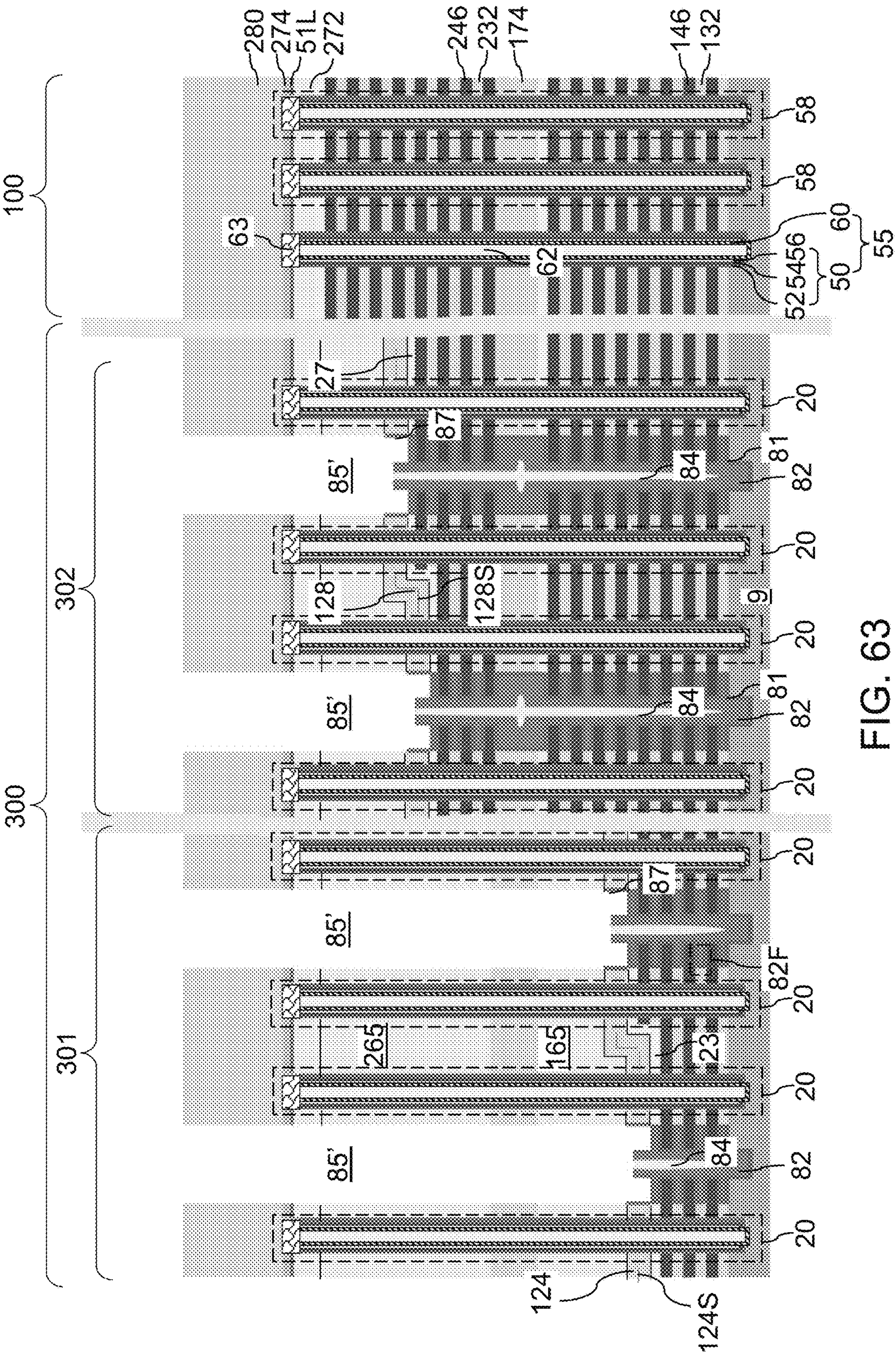
FIG. 63 is a vertical cross-sectional view of the third exemplary structure after removal of the sacrificial contact opening fill structures according to the third embodiment of the present disclosure.

Referring to FIG. 63, the processing steps described with reference to FIG. 19 can be performed, with a modification in the size of the openings through an upper portion of the contact-level dielectric layer 280, to remove the sacrificial contact opening fill structures 136. Voids 85' are formed in volumes form which the sacrificial contact opening fill structures 136 are removed and through overlying portions of the contact-level dielectric layer 280.

Figure 64:
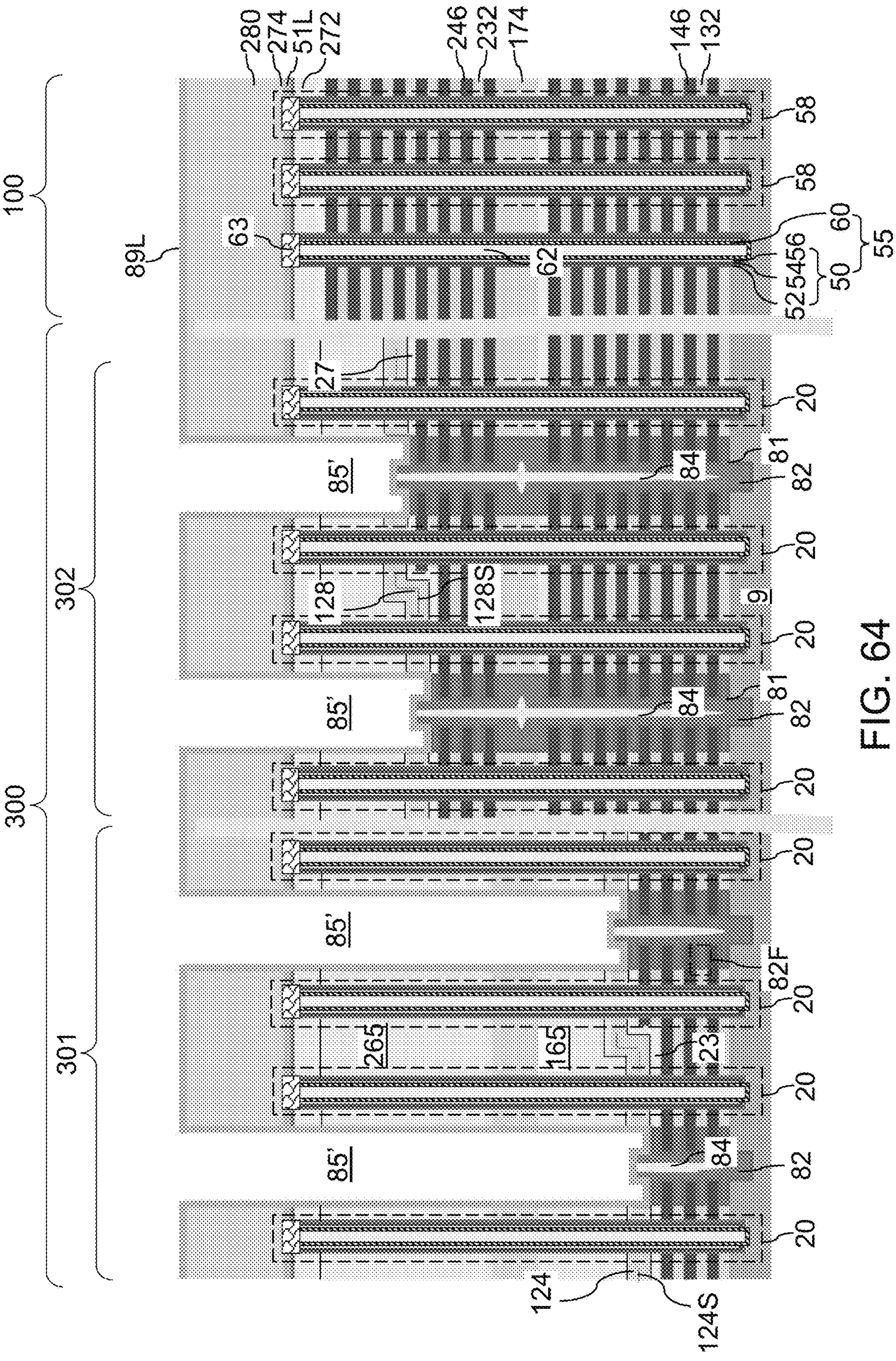
FIG. 64 is a vertical cross-sectional view of the third exemplary structure after deposition of a second dielectric via liner layer according to the third embodiment of the present disclosure.

Referring to FIG. 64, a second dielectric via liner layer 89L may be optionally deposited at peripheries of the voids 85' and above the contact-level dielectric layer 280 by a conformal deposition process. The second dielectric via liner layer 89L comprises a dielectric material such as silicon oxide, silicon nitride, silicon carbide, silicon carbide nitride, or a dielectric metal oxide. The second dielectric via liner layer 89L may have a thickness in a range from 1 nm to 30 nm, such as from 3 nm to 10 nm, although lesser and greater thicknesses may also be employed.

Figure 65:
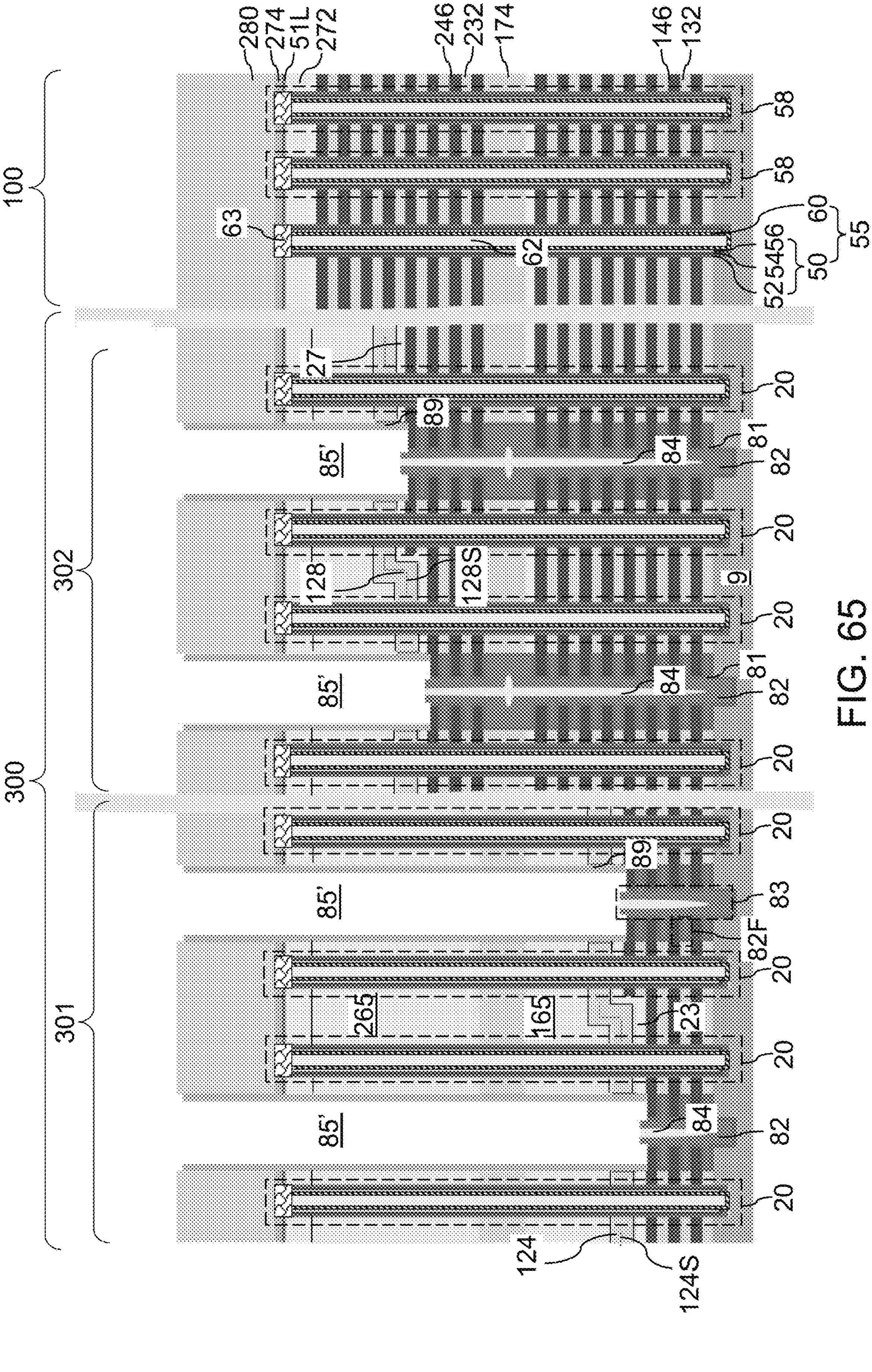
FIG. 65 is a vertical cross-sectional view of the third exemplary structure after anisotropically etching the second dielectric via liner layer according to the third embodiment of the present disclosure.

Referring to FIG. 65, an anisotropic etch process may be performed to remove horizontally-extending portions of the second dielectric via liner layer 89L. Each remaining vertically-extending portion of the second dielectric via liner layer 89L comprises a second dielectric via liner 89. In one embodiment, each of the finned dielectric pillar structures (81, 82, 84) comprises a first dielectric via liner 81 having a laterally-undulating vertical cross-sectional profile and laterally protruding outward at each level of the insulating layers (132, 232) that underlies a respective layer contact via structure 86. In one embodiment, each of the first dielectric via liners 81 has a thickness less than one half of a minimum thickness of the electrically conductive layers (146, 246). In one embodiment, one, a plurality and/or each of the electrically conductive layers (146, 246) comprises a respective opening having a respective cylindrical sidewall that contacts a respective one of the first dielectric via liners 81. In one embodiment, each of the first dielectric via liners 81 comprises a respective annular top surface that is exposed to an overlying void 85'. In one embodiment, the second dielectric via liners 89 differ from the first dielectric via liners 81 at least by one of material composition and thickness.

Figure 66:
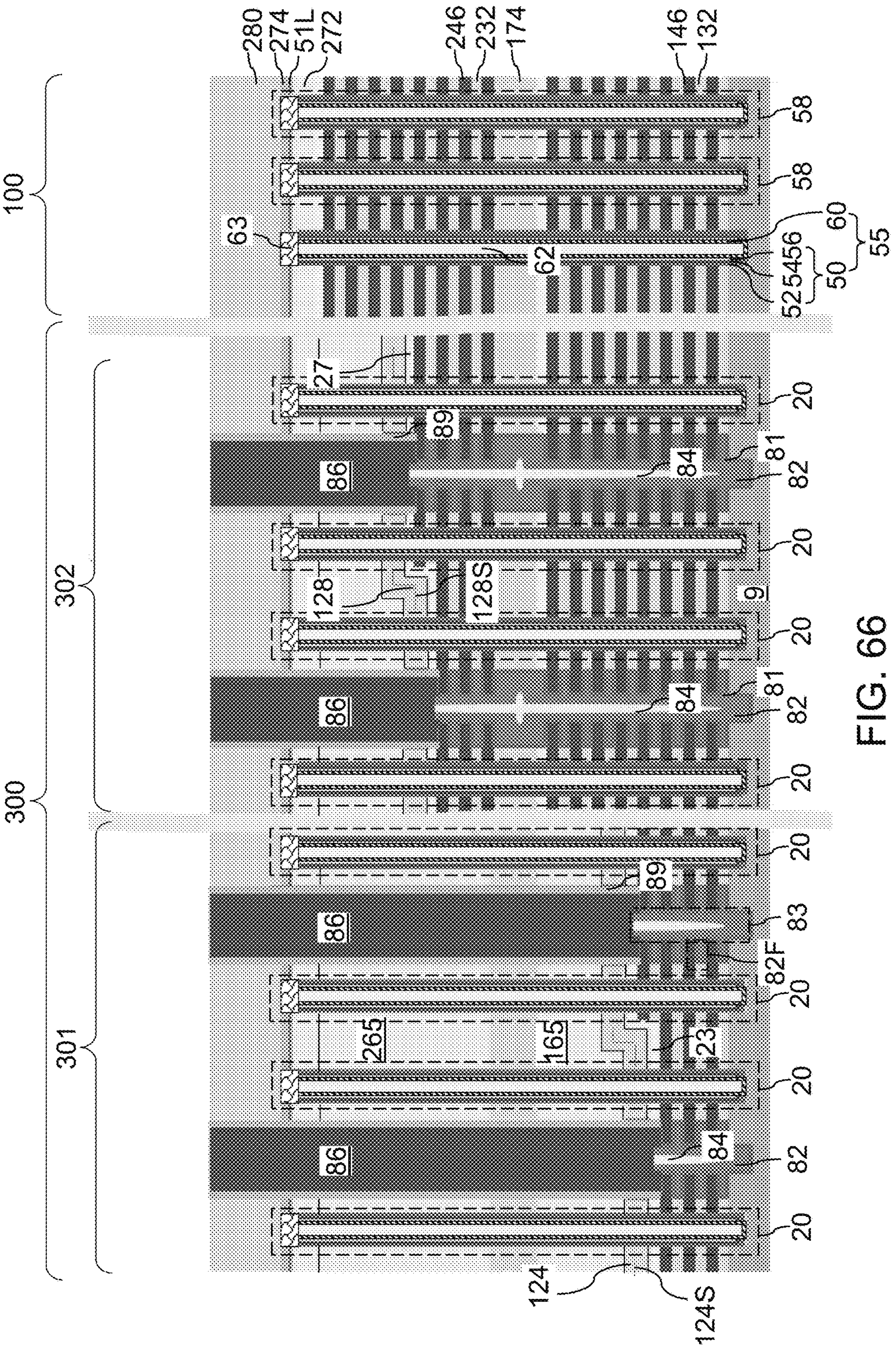
FIG. 66 is a vertical cross-sectional view of the third exemplary structure after formation of layer contact via structures according to the third embodiment of the present disclosure.

Referring to FIG. 66, the processing steps described with reference to FIG. 27 can be performed to form layer contact via structures 86 within the voids 85'.

Each layer contact via structure 86 in the third exemplary structure overlies a finned dielectric pillar structure (81, 82, 84) including a first dielectric via liner 81, a first dielectric fill material portion 82, and an optional second dielectric fill material portion 84. Further, each layer contact via structure 86 is laterally surrounded by a second dielectric via liner 89. The second dielectric via liner 89 and the first dielectric via liner 81 may be different from each other at least by one of material composition and thickness. In one embodiment, the finned dielectric pillar structure (81, 82, 84) may protrude above a horizontal plane including an annular interface between the layer contact via structure 86 and an underlying electrically conductive layer (146, 246).

Referring to all drawings and according to various embodiments of the present disclosure, a three-dimensional memory device is provided, which comprises: an alternating stack {(132, 146), (232, 246)} of insulating layers (132, 232) and electrically conductive layers (146, 246) having stepped surfaces (301, 302) in a contact region 300: memory openings 49 vertically extending through the alternating stack {(132, 146), (232, 246)}; memory opening fill structures 58 located in the memory openings 49, wherein each of the memory opening fill structures 58 comprises a respective vertical stack of memory elements and a respective vertical semiconductor channel 60: at least one retro-stepped dielectric material portion (165, 265) overlying the alternating stack {(132, 146), (232, 246)}: finned dielectric pillar structures (optionally 81, 82, 84) vertically extending through the alternating stack {(132, 146), (232, 246)} in the contact region 300: support pillar structures 20 vertically extending through the at least one retro-stepped dielectric material portion (165, 265) and the alternating stack {(132, 146), (232, 246)} and located in the contact region 300, wherein top surfaces of the support pillar structures are located in a horizontal plane including top surface of the memory opening fill structures 58: and layer contact via structures 86 vertically extending through the at least one retro-stepped dielectric material portion (165, 265), wherein each of the layer contact via structures 86 contacts a respective one of the electrically conductive layers (146, 246) and a respective one of the finned dielectric pillar structures (optionally 81, 82, 84).

In one embodiment, each of the finned dielectric pillar structures (optionally 81, 82, 84) comprises at least one dielectric fin 82F that laterally protrudes outward at a level of a respective one of the insulating layers (132, 232). In one embodiment, one or more of the at least one dielectric fin 82F comprises a cylindrical sidewall in contact with a respective one of the insulating layers (132, 232). In one embodiment, each of the finned dielectric pillar structures (optionally 81, 82, 84) comprises a dielectric pedestal structure 83 that vertically extends from the substrate 9 to a bottom surface of a respective one of the layer contact via structures 86. In one embodiment, for each of the finned dielectric pillar structures (optionally 81, 82, 84), the at least one dielectric fin 82F and a tubular portion of the dielectric pedestal structure 83 comprise a first dielectric fill material: and a cylindrical core portion 84 of the dielectric pedestal structure 83 comprises a second dielectric fill material.

In various embodiments, a top surface of the respective one of the finned dielectric pillar structures (optionally 81, 82, 84) is located at or above a top surface of the respective one of the electrically conductive layers (146, 246) which is contacted by the layer contact via structure 86 which contacts the respective one of the finned dielectric pillar structures (optionally 81, 82, 84). In the first embodiment, the top surface of the respective one of the finned dielectric pillar structures (optionally 81, 82, 84) is located above the top surface of the respective one of the electrically conductive layers (146, 246). In the second embodiment, the top surface of the respective one of the finned dielectric pillar structures (optionally 81, 82, 84) is located at (i.e., in the same horizontal plane as) the top surface of the respective one of the electrically conductive layers (146, 246)

In one embodiment, each of the memory opening fill structures 58 comprises a respective memory film 50 that contains the respective vertical stack of memory elements; each of the support pillar structures 20 comprises a respective vertical semiconductor channel 60 and a respective memory film 50: the memory films 50 of the support pillar structures 20 and the memory films 50 of the memory opening fill structures 58 comprises a same material layer stack: and the vertical semiconductor channels 60 of the support pillar structures 20 and the vertical semiconductor channels 60 of the memory opening fill structures 58 have a same material composition and a same thickness.

In one embodiment, each of the layer contact via structures 86 comprises a respective annular bottom surface contacting an annular top surface segment of the respective one of the electrically conductive layers (146, 246). In one embodiment, each of the layer contact via structures 86 comprises a respective raised bottom surface contacting a top surface segment of the respective one of the finned dielectric pillar structures (optionally 81, 82, 84) and located above a horizontal plane including the respective annular bottom surface.

In one embodiment, each of the layer contact via structures 86 comprises an inner cylindrical sidewall contacting an upper portion of a cylindrical sidewall of the respective one of the finned dielectric pillar structures (optionally 81, 82, 84). In one embodiment, one, a plurality, or each, of the layer contact via structures 86 comprises: an upper cylindrical portion 80U contacting the at least one retro-stepped dielectric material portion (165, 265); and a lower pedestal portion 86L having a greater lateral extent than a bottom periphery of a cylindrical sidewall of the upper cylindrical portion 80U and comprising an annular top surface having an inner periphery that coincides with the bottom periphery of the cylindrical sidewall of the upper cylindrical portion 80U.

In one embodiment, the three-dimensional memory device comprises at least one dielectric liner (23, 24, 27, 28) interposed between the at least one retro-stepped dielectric material portion (165, 265) and the stepped surfaces (301, 302) of the alternating stack {(132, 146), (232, 246)}, wherein a horizontal surface of the at least one dielectric liner (23, 24, 27, 28) is located within a same horizontal plane as the annular top surface of the one of the layer contact via structures 86.

In one embodiment, one, a plurality, or each, of the layer contact via structures 86 comprises a straight cylindrical sidewall that vertically extends from a top surface of the one of the layer contact via structures 86 to a horizontal surface of one of the electrically conductive layers (146, 246).

According to another aspect of the present disclosure, a three-dimensional memory device is provided, which comprises: an alternating stack {(132, 146), (232, 246)} of insulating layers (132, 232) and electrically conductive layers (146, 246) having stepped surfaces in a contact region 300; memory openings 49 vertically extending through the alternating stack {(132, 146), (232, 246)}: memory opening fill structures 58 located in the memory openings 49, wherein each of the memory opening fill structures 58 comprises a respective vertical stack of memory elements (such as portions of a respective charge storage layer 54) and a respective vertical semiconductor channel 60; a dielectric liner (124 or 128) overlying multiple horizontal surface segments and multiple vertical surfaces segments of the stepped surfaces and extending over multiple levels of the electrically conductive layers (146, 246): a retro-stepped dielectric material portion (165, 265) contacting top surface segments of the dielectric liner (124 or 128): finned dielectric pillar structures (optionally 81, 82, 84) vertically extending through the alternating stack {(132, 146), (232, 246)} in the contact region 300; and layer contact via structures 86 vertically extending through the retro-stepped dielectric material portion (165, 265) and contacting a respective one of the electrically conductive layers (146, 246) and a respective one of the finned dielectric pillar structures (optionally 81, 82, 84).

In one embodiment, the dielectric liner (124 or 128) has a thickness that is greater than a thickness of the electrically conductive layers (146, 246). In one embodiment, an additional dielectric liner such as a first dielectric liner (or 27) underlies the dielectric liner (124 or 128), which is also referred to as a second dielectric liner (124 or 128). In one embodiment, the second dielectric liner (124 or 128) comprises a seam (124S or 128S) located midway between a stepped bottom surface of the dielectric liner (124 or 128) and a stepped top surface that contacts the retro-stepped dielectric material portion (165 or 265).

In one embodiment, the second dielectric liner (124 or 128) comprises a seam (124S or 128S) located midway between a first interface between the second dielectric liner (124 or 128) and the first dielectric liner (23 or 27) and a second interface between the second dielectric liner (124 or 128) and the retro-stepped dielectric material portion (165, 265). In one embodiment, the seam (124S or 128S) comprises horizontally-extending seam sections that are interconnected with, and adjoined to, vertically-extending seam sections. In one embodiment, the seam (124S or 128S) is laterally spaced from cylindrical openings in the dielectric liner (124 or 128) through which the layer contact via structures 86 extend.

In one embodiment, the device also includes an underlying dielectric liner (23 or 27) contacting the multiple horizontal surface segments and the multiple vertical surfaces segments of the stepped surfaces and extending over multiple levels of the electrically conductive layers (146, 246) and under the dielectric liner (124 or 128).

In one embodiment, each of the finned dielectric pillar structures (optionally 81, 82, 84) comprises a first dielectric via liner 81 having a laterally-undulating vertical cross-sectional profile and laterally protruding outward at each level of the insulating layers (132, 232) that underlies a respective layer contact via structure 86 among the layer contact via structures 86; and each of the first dielectric via liners 81 has a thickness less than one half of a thickness of the electrically conductive layers (146, 246).

In one embodiment, the respective one of the electrically conductive layers (146, 246) comprises a respective opening having a respective cylindrical sidewall that contacts a respective one of the first dielectric via liners 81: and each of the first dielectric via liners 81 comprises a respective annular top surface contacting a respective one of the layer contact via structures 86.

In one embodiment, the layer contact via structures 86 are laterally surrounded by a respective second dielectric via liner 89 having a respective annular bottom surface that contacts the respective one of the electrically conductive layers (146, 246): and the second dielectric via liners 89 differ from the first dielectric via liners 81 at least by one of material composition and thickness.

In one embodiment, each of the finned dielectric pillar structures (optionally 81, 82, 84) comprises at least one dielectric fin 82F that laterally protrudes outward at a level of a respective one of the insulating layers (132, 232). In one embodiment, one or more of the at least one dielectric fin 82F comprises a cylindrical sidewall in contact with a respective one of the insulating layers (132, 232).

In one embodiment, each of the finned dielectric pillar structures (optionally 81, 82, 84) comprises a dielectric pedestal structure 83 that vertically extends from a substrate underlying the alternating stack {(132, 146), (232, 246)} to a bottom surface of a respective one of the layer contact via structures 86. In one embodiment, for each of the finned dielectric pillar structure (optionally 81, 82, 84): the at least one dielectric fin 82F and a tubular portion of the dielectric pedestal structure 83 comprise a first dielectric fill material; and a cylindrical core portion of the dielectric pedestal structure 83 comprises a second dielectric fill material.

In one embodiment, each of the layer contact via structures 86 comprises a respective annular bottom surface contacting an annular top surface segment of the respective one of the electrically conductive layers (146, 246).

While two tiers of alternating stacks {(132, 146), (232, 246)} are described in the above embodiments, in alternative embodiments, one tier or three or more tiers may be included in the memory device.

The various embodiments of the present disclosure can be employed to provide a three-dimensional memory device including self-aligned layer contact via structures 86 that contact a respective electrically conductive layer (146, 246) with precise control of the depth of the layer contact via structures 86 relative to the top surface of a respective one of the electrically conductive layers (146, 246), thereby ensuring reliable electrical contact therebetween. Thus, electrical opens between the layer contact via structures 86 and the electrically conductive layers (146, 246) can be minimized. Further, unwanted electrical shorts between the layer contact via structures 86 and additional electrically conductive layers (146, 246) can be avoided by the self-aligned layer contact via structures 86 of the embodiments of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers having stepped surfaces in a contact region;

memory openings vertically extending through the alternating stack;

memory opening fill structures located in the memory openings, wherein each of the memory opening fill structures comprises a respective vertical stack of memory elements and a respective vertical semiconductor channel;

a dielectric liner overlying multiple horizontal surface segments and multiple vertical surfaces segments of the stepped surfaces and extending over multiple levels of the electrically conductive layers;

a retro-stepped dielectric material portion contacting top surface segments of the dielectric liner;

finned dielectric pillar structures vertically extending through the alternating stack in the contact region; and layer contact via structures vertically extending through the retro-stepped dielectric material portion and contacting a respective one of the electrically conductive layers and a respective one of the finned dielectric pillar structures, wherein the dielectric liner has a thickness that is greater than a thickness of the electrically conductive layers; and wherein the dielectric liner comprises a seam located midway between a stepped bottom surface of the dielectric liner and a stepped top surface that contacts the retro-stepped dielectric material portion.

2. The three-dimensional memory device of claim 1, wherein:

the seam comprises horizontally-extending seam sections that are interconnected with and adjoined to vertically-extending seam sections; and the seam is laterally spaced from cylindrical openings in the dielectric liner through which the layer contact via structures extend.

3. A three-dimensional memory device, comprising:

an alternating stack of insulating layers and electrically conductive layers having stepped surfaces in a contact region;

memory openings vertically extending through the alternating stack;

memory opening fill structures located in the memory openings, wherein each of the memory opening fill structures comprises a respective vertical stack of memory elements and a respective vertical semiconductor channel;

a dielectric liner overlying multiple horizontal surface segments and multiple vertical surfaces segments of the stepped surfaces and extending over multiple levels of the electrically conductive layers;

a retro-stepped dielectric material portion contacting top surface segments of the dielectric liner;

finned dielectric pillar structures vertically extending through the alternating stack in the contact region; and layer contact via structures vertically extending through the retro-stepped dielectric material portion and contacting a respective one of the electrically conductive layers and a respective one of the finned dielectric pillar structures;

wherein:

each of the finned dielectric pillar structures comprises a first dielectric via liner having a laterally-undulating vertical cross-sectional profile and laterally protruding outward at each level of the insulating layers that underlies a respective layer contact via structure among the layer contact via structures;

each of the first dielectric via liners has a thickness less than one half of a thickness of the electrically conductive layers;

the layer contact via structures are laterally surrounded by a respective second dielectric via liner having a respective annular bottom surface that contacts the respective one of the electrically conductive layers; and the second dielectric via liners differ from the first dielectric via liners at least by one of material composition and thickness.

* * * * *